(12) United States Patent
Kamihara et al.

(10) Patent No.: US 11,368,332 B2
(45) Date of Patent: Jun. 21, 2022

(54) CIRCUIT DEVICE, ELECTRONIC DEVICE, AND CABLE HARNESS

(71) Applicant: SEIKO EPSON CORPORATION, Tokyo (JP)

(72) Inventors: Yoshiyuki Kamihara, Okaya (JP); Ryuichi Kagaya, Chino (JP); Toshimichi Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 18 days.

(21) Appl. No.: 15/876,973

(22) Filed: Jan. 22, 2018

(65) Prior Publication Data
US 2018/0212796 A1  Jul. 26, 2018

(30) Foreign Application Priority Data

Jan. 25, 2017 (JP) .............................. JP2017-011266
May 18, 2017 (JP) .............................. JP2017-098716
Oct. 20, 2017 (JP) .............................. JP2017-203822

(51) Int. Cl.
*H04L 12/40* (2006.01)
*G01R 31/00* (2006.01)
*G01R 31/67* (2020.01)
*G06F 1/06* (2006.01)
*G06F 11/00* (2006.01)
(Continued)

(52) U.S. Cl.
CPC ...... *H04L 12/40078* (2013.01); *G01R 31/007* (2013.01); *G01R 31/67* (2020.01); *G06F 1/06* (2013.01); *G06F 11/00* (2013.01); *G06F 13/4022* (2013.01); *H03L 7/16* (2013.01); *H04L 12/64* (2013.01); *G06F 11/3027* (2013.01)

(58) Field of Classification Search
CPC . H04L 12/40078; H04L 12/64; G01R 31/007; G01R 31/041; G06F 1/06; G06F 11/00; G06F 13/4022; H03L 7/16
See application file for complete search history.

(56) References Cited

U.S. PATENT DOCUMENTS 7,047,434 B2   5/2006 Kamihara
8,008,953 B1   8/2011 Brumett, Jr. et al.
(Continued)

FOREIGN PATENT DOCUMENTS

JP   H10-327154 A   12/1998
JP   2002-141911 A   5/2002
(Continued)

*Primary Examiner* — Getente A Yimer
(74) *Attorney, Agent, or Firm* — Rankin, Hill & Clark LLP

(57) ABSTRACT

A circuit device includes: a first physical layer circuit to which a first bus compliant with a USB standard is connected; a second physical layer circuit to which a second bus compliant with the USB standard is connected; a processing circuit that performs transfer processing in which a packet received from the first bus via the first physical layer circuit is transferred to the second bus via the second physical layer circuit, and a packet received from the second bus via the second physical layer circuit is transferred to the first bus via the first physical layer circuit; a bus monitor circuit that performs a monitor operation with respect to the first and second buses; and a bus switch circuit that switches on or off a connection between the first bus and the second bus based on a monitor result from the bus monitor circuit.

18 Claims, 33 Drawing Sheets

(51) Int. Cl.
    *G06F 13/40*          (2006.01)
    *H03L 7/16*           (2006.01)
    *H04L 12/64*          (2006.01)
    *G06F 11/30*          (2006.01)

(56) References Cited

U.S. PATENT DOCUMENTS

| | | | | |
|---|---|---|---|---|
| 2003/0026152 A1* | 2/2003 | Shinozaki | ............ | G11C 11/4076 365/207 |
| 2005/0091549 A1* | 4/2005 | Wu | ............ | G06F 1/3215 713/320 |
| 2005/0271168 A1* | 12/2005 | Tsai | ............ | G06F 1/12 375/344 |
| 2007/0088967 A1* | 4/2007 | Fu | ............ | G06F 1/266 713/340 |
| 2007/0159221 A1* | 7/2007 | Ma | ............ | H04L 7/042 327/141 |
| 2010/0070659 A1* | 3/2010 | Ma | ............ | G06F 13/385 710/14 |
| 2010/0246750 A1* | 9/2010 | Kimura | ............ | G09G 3/3677 377/64 |
| 2011/0131356 A1 | 6/2011 | Devam et al. | | |
| 2011/0145445 A1* | 6/2011 | Malamant | ............ | G06F 1/3203 710/16 |
| 2013/0264654 A1* | 10/2013 | Weis | ............ | H01L 29/78 257/392 |
| 2015/0309953 A1* | 10/2015 | Steele | ............ | G06F 13/4022 710/316 |
| 2017/0010997 A1* | 1/2017 | Lin | ............ | G06F 13/4022 |
| 2017/0277249 A1* | 9/2017 | Low | ............ | G06F 1/3293 |
| 2017/0317583 A1* | 11/2017 | Forghani-Zadeh | ............ | H03K 17/04206 |
| 2018/0061328 A1* | 3/2018 | Kishi | ............ | G09G 3/3225 |

FOREIGN PATENT DOCUMENTS

| | | |
|---|---|---|
| JP | 2006-135397 A | 5/2006 |
| JP | 2008-227558 A | 9/2008 |
| JP | 2011-191932 A | 9/2011 |
| JP | 2013-025474 A | 2/2013 |
| JP | 2015-76731 A | 4/2015 |

* cited by examiner

CIRCUIT DEVICE, ELECTRONIC DEVICE, AND CABLE HARNESS

CROSS-REFERENCE TO RELATED APPLICATIONS

This application claims the benefit of Japanese Patent Application No. 2017-011266, filed on Jan. 25, 2017, Japanese Patent Application No. 2017-098716, filed on May 18, 2017, and Japanese Patent Application No. 2017-203822, filed on Oct. 20, 2017, the entire disclosures of which are hereby incorporated herein by reference in their entireties.

BACKGROUND

1. Technical Field

The present invention relates to a circuit device, an electronic device, a cable harness, and the like.

2. Related Art

A circuit device that realizes USB (Universal-Serial-Bus) data transfer control is known. The techniques disclosed in JP-A-2006-135397 and U.S. Pat. No. 7,047,434 are known examples of such a circuit device.

For example, JP-A-2006-135397 discloses technology in which an enable control signal for a current source of an HS (High Speed) mode transmission circuit is set to active at a timing before a packet transmission start timing. U.S. Pat. No. 7,047,434 discloses technology in which, in the case where a switch from the HS mode to an FS (Full Speed) mode is performed, self-running is disabled for a PLL that generates a high-speed clock for the HS mode.

In USB technology, EYE pattern measurement is performed in an authentication test. For this reason, a USB HS mode transmission circuit needs to output transmission signals that are capable of passing an EYE pattern type of USB standard authentication test. However, parasitic capacitance and parasitic resistance exist in the signal path of transmission signals in the HS mode transmission circuit, and therefore a situation arises in which passing the EYE pattern authentication test is difficult due to this parasitic capacitance and parasitic resistance. In one example, in the case where transmission signals from a transmission circuit of a main controller are output to a peripheral device via a cable harness or the like, if the cable is long, or a protection circuit or the like exists on the signal path, appropriate signal transfer cannot be realized, and the authentication test cannot be passed.

Also, in USB technology, the host needs to be able to appropriately detect the disconnection of a device on the bus. Furthermore, in USB technology, a test mode for authentication testing is provided, and it is necessary to be able to appropriately handle this test mode as well.

SUMMARY

According to several aspects of the invention, it is possible to provide a circuit device, an electronic device, a cable harness, and the like that can improve degraded signal characteristics of a USB signal while also appropriately handling device disconnection detection and an authentication test.

A first aspect of the invention pertains to a circuit device including: a first physical layer circuit to which a first bus compliant with a USB standard is connected; a second physical layer circuit to which a second bus compliant with the USB standard is connected; a processing circuit that performs transfer processing in which a packet received from the first bus via the first physical layer circuit is transferred to the second bus via the second physical layer circuit, and a packet received from the second bus via the second physical layer circuit is transferred to the first bus via the first physical layer circuit; a bus monitor circuit that performs a monitor operation with respect to the first bus and the second bus; and a bus switch circuit, one end of the bus switch circuit being connected to the first bus, another end being connected to the second bus, and the bus switch circuit switching on or off a connection between the first bus and the second bus based on a monitor result from the bus monitor circuit.

According to the first aspect of this invention, the circuit device is provided with the first and second physical layer circuits to which the first and second buses compliant with the USB standard are connected, the processing circuit that performs packet transfer processing, the bus monitor circuit that performs the monitor operation with respect to the first and second buses, and the bus switch circuit. Also, the bus switch circuit switches on or off the connection between the first bus and the second bus based on a monitor result from the bus monitor circuit. According to this configuration, the connection between the first bus and the second bus is switched on in accordance with the monitor results regarding the first and second buses, and signals can be exchanged between a first device connected to the first bus and a second device connected to the second bus, for example. Furthermore, it is possible to perform transfer processing in which a packet from one of the first and second buses is transferred to the other one of the first and second buses via the first and second physical layer circuits, and even if the signal characteristics of a signal on the first or second bus degrade, it is possible to improve the signal characteristics. Accordingly, it is possible to provide a circuit device or the like that can improve degraded signal characteristics of a USB signal.

Also, in the first aspect of the invention, it is preferable that, letting a first period be a period in which the bus switch circuit switches on the connection between the first bus and the second bus, and letting a second period be a period in which the bus switch circuit switches off the connection between the first bus and the second bus, the processing circuit performs the transfer processing in the second period.

According to this configuration, in the first period, by switching on the connection between the first bus and the second bus, it is possible to exchange signals between a first device connected to the first bus and a second device connected to the second bus, for example. Also, in the second period, the connection between the first bus and the second bus is switched off, and it is possible to realize transfer processing in which a packet received from one of the first and second buses is transfer to the other one of the first and second buses via the first and second physical layer circuits.

Also, in the first aspect of the invention, it is preferable that in the first period, the bus monitor circuit causes the bus switch circuit to switch on the connection between the first bus and the second bus, and in the second period, the bus monitor circuit causes the bus switch circuit to switch off the connection between the first bus and the second bus and causes the processing circuit to perform the transfer processing.

According to this configuration, switch control performed by the bus switch circuit and transfer processing performed by the processing circuit in the first and second periods can be realized under control of the bus monitor circuit.

Also, in the first aspect of the invention, it is preferable that in the first period, the bus monitor circuit performs the monitor operation based on a signal from a physical layer circuit of the first physical layer circuit, and a physical layer circuit of the second physical layer circuit is set to operation off or a power saving mode.

According to this configuration, the monitor operation performed by the bus monitor circuit can be realized with use of a signal from one physical layer circuit out of the first and second physical layer circuits. The other physical layer circuit that is not used in the monitor operation is set to operation off or the power saving mode, thus reducing power consumption.

Also, in the first aspect of the invention, it is preferable that in the first period, HS mode transmission circuits of the first physical layer circuit and the second physical layer circuit are set to operation off or a power saving mode.

According to this configuration, the HS mode transmission circuits are set to operation off or the power saving mode in the first period, thus making it possible to suppress unnecessary power consumption in the transmission circuits, and thus achieving a reduction in power consumption.

Also, in the first aspect of the invention, it is preferable that at least after a start timing of a device chirp K, the bus switch circuit switches the connection between the first bus and the second bus from on to off, and the processing circuit starts the transfer processing.

According to this configuration, it is possible to use a device chirp K to check whether the device side is compatible with the HS mode, and then start the transfer processing performed by the processing circuit.

Also, in the first aspect of the invention, it is preferable that at least after an end timing of a host chirp K/J, the bus switch circuit switches the connection between the first bus and the second bus from on to off, and the processing circuit starts the transfer processing.

According to this configuration, if, for example, the host side and the device side are both compatible with the HS mode, the switch to the HS mode is complete, and therefore it is possible to appropriately start the transfer processing performed by the processing circuit.

Also, in the first aspect of the invention, it is preferable that in a case where a reset or a suspend was performed, the bus switch circuit switches the connection between the first bus and the second bus from off to on, and the processing circuit stops the transfer processing.

According to this configuration, the transfer processing performed by the processing circuit can be stopped if a reset or a suspend was performed. Then, by switching on the connection between the first bus and the second bus, it is possible to exchange signals between the first device connected to the first bus and the second device connected to the second bus.

Also, in the first aspect of the invention, it is preferable that in a case where a resume was performed after a suspend was performed, the bus switch circuit switches the connection between the first bus and the second bus from on to off, and the processing circuit starts the transfer processing.

According to this configuration, it is possible to resume the transfer processing performed by the processing circuit if a resume is performed after a suspend was performed.

Also, in the first aspect of the invention, it is preferable that the processing circuit performs packet bit resynchronization processing in the transfer processing.

By performing this packet bit resynchronization processing, even if the signal characteristics of a bus signal degrade, it is possible to improve the degraded signal characteristics.

Also, in the first aspect of the invention, it is preferable that in a charging arbitration period, the bus switch circuit switches on a connection between the second bus and a third bus that is connected to a charging circuit.

According to this configuration, in the charging arbitration period, the connection between the third bus and the second bus is switched on, and it is possible to exchange signals for charging arbitration or the like between a charging circuit and a second device connected to the second bus.

Also, in the first aspect of the invention, it is preferable that the processing circuit performs the transfer processing without changing the number of bits in a SYNC field and the number of bits in an EOP field of a packet.

According to this configuration, a packet from one of the first and second buses can be transferred to the other one of the first and second buses via the first and second physical layer circuits with no change in the number of bits in the SYNC and EOP fields.

Also, in the first aspect of the invention, it is preferable that the second physical layer circuit includes a disconnection detection circuit that is on a second bus side and performs device disconnection detection with respect to the second bus, and when the connection between the first bus and the second bus is off, in a case where the disconnection detection circuit on the second bus side detected a device disconnection, the bus switch circuit switches the connection between the first bus and the second bus from off to on.

According to the first aspect of this invention, the circuit device is further provided with the disconnection detection circuit on the second bus side that performs device disconnection detection with respect to the second bus. Also, in the second period in which the connection between the first and second buses is switched off, if a device disconnection is detected by the disconnection detection circuit on the second bus side, the connection between the first and second buses is switched from off to on. Accordingly, if a device is disconnected from the second bus, the first device connected to the first bus can detect the disconnection of the device from the second bus via the bus switch circuit that has been switched on. Accordingly, it is possible to provide a circuit device or the like that can improve degraded signal characteristics of a USB signal, and can also handle device disconnection detection.

Also, in the first aspect of the invention, it is preferable that the first physical layer circuit includes a first upstream port detection circuit that detects whether or not the first bus is a bus on an upstream side, the second physical layer circuit includes a second upstream port detection circuit that detects whether or not the second bus is the bus on the upstream side, in a case of a determination that the first bus is the bus on the upstream side, the disconnection detection circuit on the second bus side performs the device disconnection detection with respect to the second bus, and in a case of a determination that the second bus is the bus on the upstream side, the disconnection detection circuit on the first bus side performs the device disconnection detection with respect to the first bus. Furthermore, it is preferable that circuit device further includes an operation setting circuit that, in a case of a determination that the first bus is the bus on the upstream side, sets a disconnection detection circuit on the second bus side to an operation enabled state, and sets a disconnection detection circuit on the first bus side to an operation disabled state or a power saving state, and in a case of a determination that the second bus is the bus on the upstream side, sets the disconnection detection circuit on the first bus side to the operation enabled state, and sets the disconnection detection circuit on the second bus side to the operation disabled state or the power saving state.

According to this configuration, if it was detected that the first bus is the bus on the upstream side, device disconnection can be detected by the disconnection detection circuit on the second bus side, and if it was detected that the second bus is the bus on the upstream side, device disconnection can be detected by the disconnection detection circuit on the first bus side. Also, when it is determined that one of the first and second buses is the bus on the upstream side, the disconnection detection circuit on the other bus side, which is the downstream side, is set to the operation enabled state, and the disconnection of a device from the other bus can be detected. Also, the disconnection detection circuit on the one bus side is set to the operation disabled state or the power saving state, thus reducing power consumption and preventing erroneous detection, for example.

Also, in the first aspect of the invention, it is preferable that the circuit device further includes: a first test signal detection circuit that detects whether or not a first test signal was output to the first bus; and a first test signal output circuit that, in a case where the first test signal detection circuit detected that the first test signal was output to the first bus, outputs a repeat signal corresponding to the first test signal to the second bus. Also, it is preferable that the circuit device further includes: a second test signal detection circuit that detects whether or not a second test signal was output to the second bus; and a second test signal output circuit that, in a case where the second test signal detection circuit detected that the second test signal was output to the second bus, outputs a repeat signal corresponding to the second test signal to the first bus.

According to the first aspect of this invention, when the first test signal is output to the first bus, this output of the first test signal is detected by the first test signal detection circuit, and the first test signal output circuit outputs a repeat signal corresponding to the first test signal to the second bus. Accordingly, for example, in the second period in which the connection between the first and second buses is switched off, even if the first test signal is output to the first bus, a repeat signal corresponding to the first test signal is output to the second bus, and an USB authentication test can be performed. Accordingly, it is possible to provide a circuit device or the like that can improve degraded signal characteristics of a USB signal, and can also handle a USB authentication test. Also, both in the case where the first bus is on the upstream side and the second bus is on the downstream side, and the case where the second bus is on the upstream side and the first bus is on the downstream side, it is possible to appropriately handle a USB authentication test.

Also, in the first aspect of the invention, it is preferable that the switch signal generation circuit has a charge pump circuit that performs a charge pump operation based on a charge pump clock signal, and the switch signal generation circuit generates the switch signal based on a boosted power supply voltage that was boosted by the charge pump circuit.

According to the first aspect of this invention, the switch signal generation circuit has the charge pump circuit, and generates the switch signal, which controls the switching on and off of the connection between the first and second buses, based on a boosted power supply voltage that was boosted by the charge pump circuit. By using this switch signal that is based on the boosted power supply voltage, it is possible to appropriately switch on or off a switch element of the bus switch circuit. Accordingly, signals can be appropriately exchanged via the first bus, the bus switch circuit, and the second bus in the first period for example, and it is possible to provide a circuit device or the like that can improve degraded signal characteristics of a USB signal.

Also, another aspect of the invention pertains to an electronic device including the circuit device according to any of the above aspects, and a processing device that is connected to the first bus.

Also, another aspect of the invention pertains to a cable harness including the circuit device according to any of the above aspects, and a cable.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following is a detailed description of preferred embodiments of the invention. Note that the embodiments described below are not intended to unduly limit the content of the invention recited in the claims, and all of the configurations described in the embodiments are not necessarily essential as solutions provided by the invention.

1. Signal Characteristics of Transmission Signals

Figure 1:
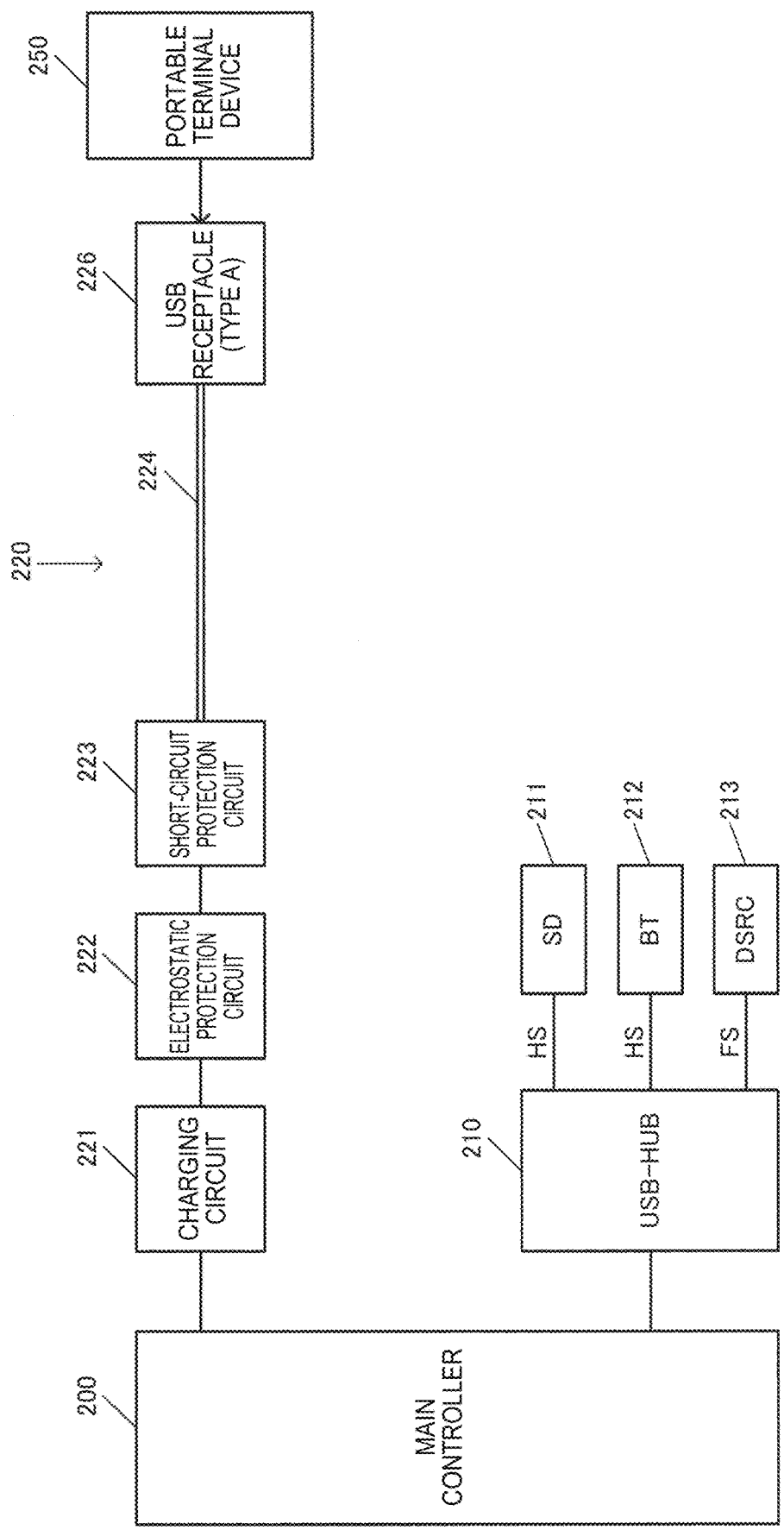
FIG. 1 is an illustrative diagram regarding a problem of degradation in the signal characteristics of a transmission signal.

Degradation in the signal characteristics of transmission signals in USB will be described below with reference to FIG. 1. FIG. 1 shows an example of a vehicle-mounted electronic device system in which a USB-HUB 210 is connected to a main controller 200 (host controller). In one example, an upstream port of the USB-HUB 210 is connected to the main controller 200, and a downstream port is connected to a device such as an SD 211 (SD card), a BT 212 (Bluetooth (registered trademark)), or a DSRC 213 (Dedicated Short Range Communications).

Also, a portable terminal device 250 such as a smartphone is connected to a USB receptacle 226 of a cable harness 220 that has a cable 224. A charging circuit 221, an electrostatic protection circuit 222, a short-circuit protection circuit 223, and the like are provided between the main controller 200 and the USB receptacle 226.

In FIG. 1, the cable 224 is routed so as to avoid the interior or the like of a vehicle, and therefore the cable tends to be long with a length of 1 to 3 m for example, and parasitic capacitance and the like is generated. Furthermore, parasitic capacitance and the like is also generated due to circuits such as the charging circuit 221, the electrostatic protection circuit 222, and the short-circuit protection circuit 223. This parasitic capacitance and the like causes degradation in the signal characteristics of transmission signals in an USB transmission circuit (HS) of the main controller 200.

Figure 2:
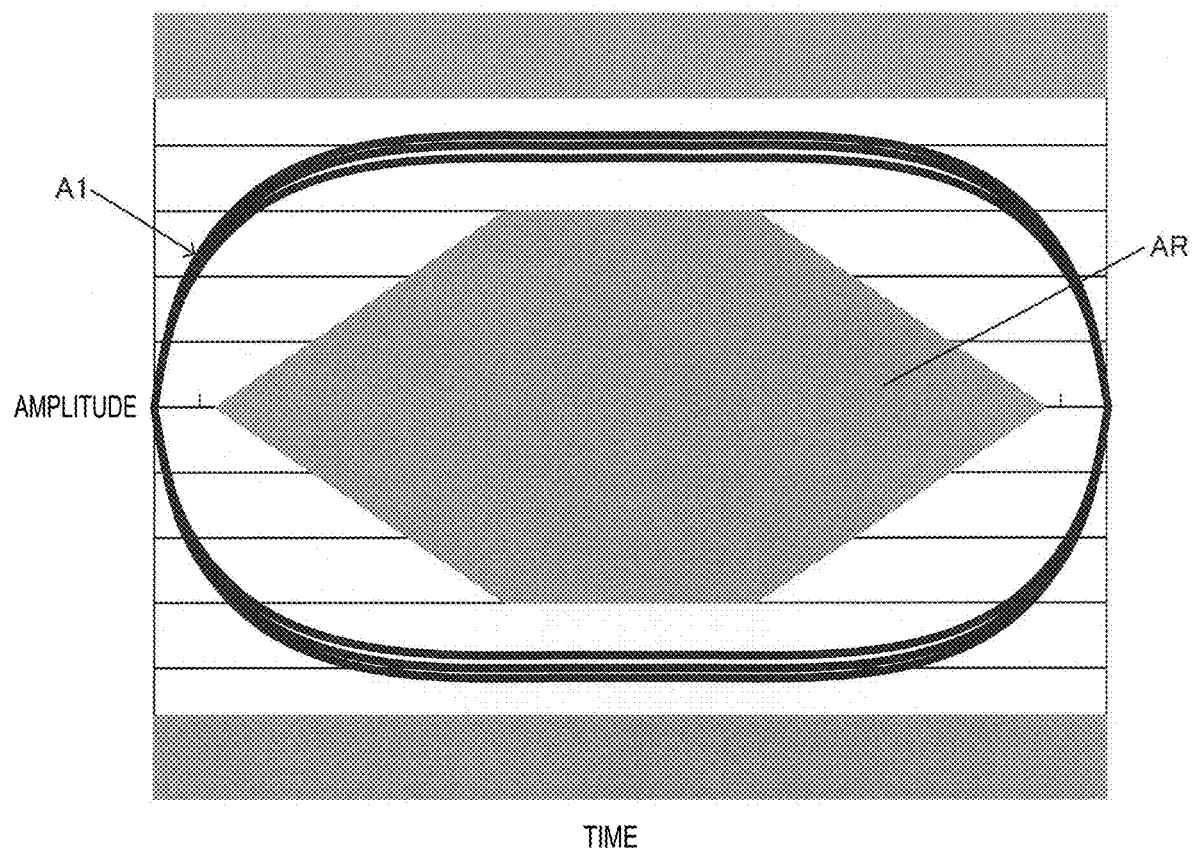
FIG. 2 is an illustrative diagram of an EYE pattern.

FIG. 2 is an illustrative diagram of an EYE pattern in a USB authentication test. AR indicates a keep-out region in the transmission signal waveform, and this keep-out region is defined in the USB standard. With a USB transmission circuit (HS), it is required that the waveforms of transmission signals (DP, DM) indicated by A1 do not overlap this keep-out region AR.

However, the signal quality of the transmission signals indicated by A1 in FIG. 2 degrades if parasitic capacitance and the like is generated due to elongation of the cable 224 that is routed in the vehicle in FIG. 1, or due to circuits such as the charging circuit 221, the electrostatic protection circuit 222, and the short-circuit protection circuit 223. For this reason, problems occurs in which appropriate signal transfer cannot be realized, and the EYE pattern authentication test (e.g., a near-end authentication test) cannot be passed.

Also, in USB technology, it is necessary to appropriately detect the disconnection of a device. For example, in FIG. 1, assume that a user has disconnected the portable terminal device 250 from the USB receptacle 226. In this case, the main controller 200, which is the host, needs to be able to appropriately detect the disconnection of the portable terminal device 250, which is the aforementioned device, from the USB. Also, in order to perform an authentication test such as that illustrated in FIG. 2, a test mode for authentication testing needs to be provided in USB technology. In this test mode, the main controller 200, which is the host, outputs test packets, or outputs signals for DC level measurement, and it is necessary to be able to appropriately handle this test mode as well.

2. First Configuration Example

Figure 3:
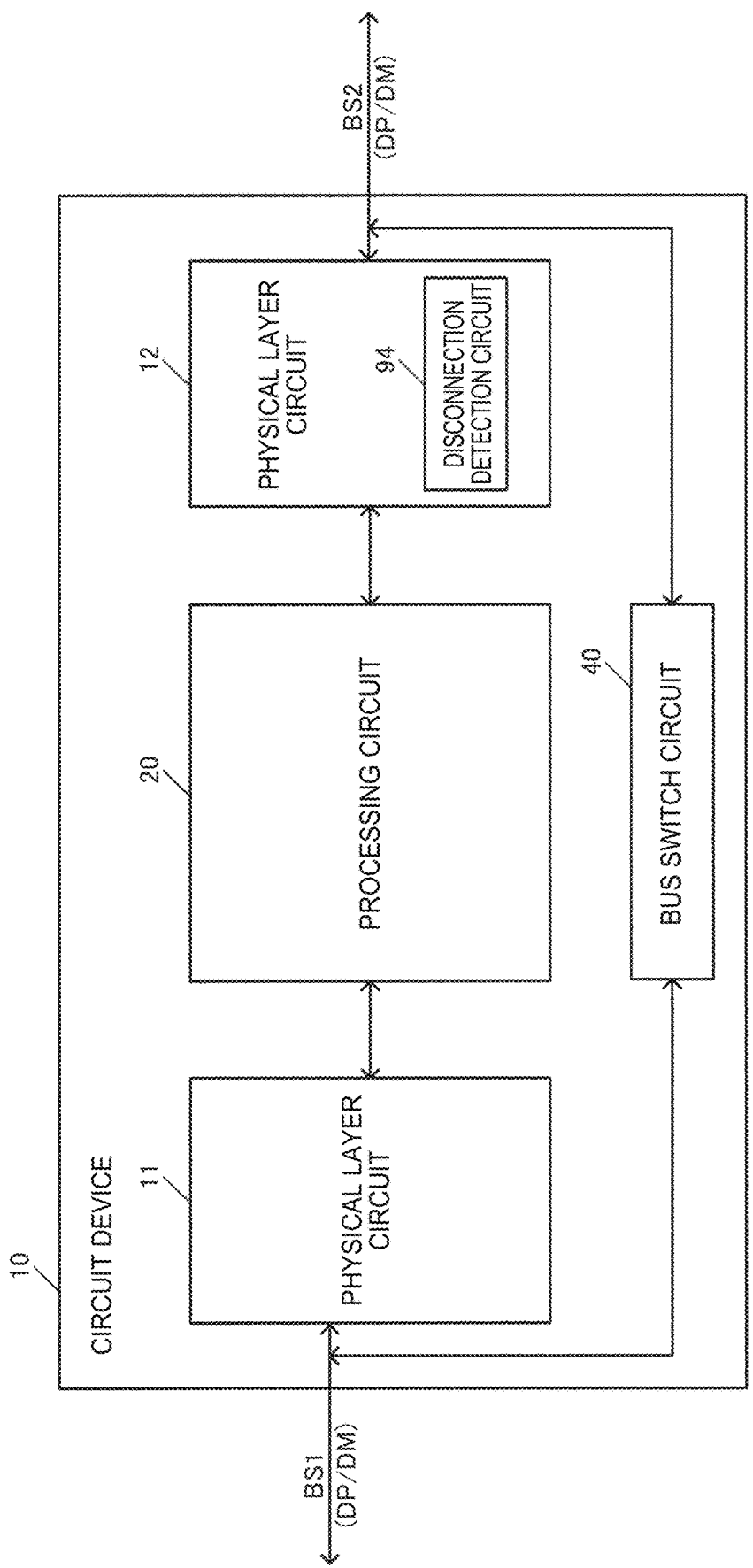
FIG. 3 shows a first configuration example of a circuit device according to an embodiment of the invention.

FIG. 3 shows a first configuration example of a circuit device 10 of this embodiment. The circuit device 10 of the first configuration example includes physical layer circuits 11 and 12, a processing circuit 20, and a bus switch circuit 40, and the physical layer circuit 12 includes a disconnection detection circuit 94. Note that the circuit device 10 is not limited to the configuration in FIG. 3, and various modifications can be carried out, such as omitting a portion of the constituent elements, or adding other constituent elements.

The physical layer circuit 11 (first physical layer circuit) is connected to a USB-standard bus BS1 (first bus) through a first port (e.g., an i/o port, terminal, interface, connection, or the like). The physical layer circuit 12 (second physical layer circuit) is connected to a USB-standard bus BS2 (second bus) through a second port (e.g., an i/o port, terminal, interface, connection, or the like). The physical layer circuits 11 and 12 are each configured by physical layer analog circuits. Examples of the physical layer analog circuits include HS and FS transmission circuits, a reception circuit, various detection circuits, and a pull-up resistance circuit. Note that the processing circuit 20 includes circuits that correspond to the link layer, such as a serial-to-parallel conversion circuit that converts serial data received via USB into parallel data, a parallel-to-serial conversion circuit that converts parallel data into serial data, an elastic buffer, and an NRZI circuit. For example, circuits that correspond to the link layer or the like of a USB transceiver macrocell are included in the processing circuit 20, and analog circuits such as a transmission circuit, a reception circuit, and detection circuits are included in the physical layer circuits 11 and 12.

The bus BS1 is the bus to which the main controller is connected for example, and the bus BS2 is the bus to which the peripheral device is connected for example. It should be noted that this embodiment is not limited to this connection configuration. The buses BS1 and BS2 are buses that are compliant with the USB standard (or more broadly, a given data transfer standard) and include signal lines for signals DP and DM (first and second signals) that constitute differential signals. The buses BS1 and BS2 can include power supply VBUS and GND signal lines.

One end of the bus switch circuit 40 is connected to the bus BS1 through the first port, and the other end is connected to the bus BS2 through the second port. Also, the connection (electrical connection) between the bus BS1 and the bus BS2 can be switched on and off. In other words, the bus BS1 and the bus BS2 can be electrically connected, or electrically disconnected. Switching on and off the connection between (i.e., electrically connecting and disconnecting) the bus BS1 and the bus BS2 refers to switching on and off switch elements (first and second switch elements) provided between the DP and DM signal lines of the bus BS1 and the DP and DM signal lines of the bus BS2.

Specifically, as shown in later-described FIG. 9, the bus switch circuit 40 switches on the connection between the bus BS1 and the bus BS2 in a period T1 (first period). More specifically, the bus switch circuit 40 has a switch element provided between the bus BS1 and the bus BS2, and switches on that switch element in the period T1. Accordingly, the main controller 200 (or more broadly, a first device) that is connected to the bus BS1 and the peripheral device 260 (or more broadly, a second device) that is connected to the bus BS2 can directly transfer USB signals via the USB bus. Also, as shown in later-described FIG. 10, the bus switch circuit 40 switches off the connection between the bus BS1 and the bus BS2 in a period T2 (second period). More specifically, in the period T2, a switch element provided between the bus BS1 and the bus BS2 is switched off. In this period T2, the processing circuit 20 performs transfer processing that is described below.

The processing circuit 20 is a circuit that performs transfer processing and various types of control processing, and can be realized by, for example, a logic circuit obtained by automatic placement and routing, such as a gate array. Note that the processing circuit 20 may be realized by a processor such as a CPU or an MPU.

In the period T2 (at least a portion of the period T2), the processing circuit 20 performs transfer processing in which packets received from the bus BS1 via the physical layer circuit 11 are transmitted (transferred) to the bus BS2 via the physical layer circuit 12, and packets received from the bus BS2 via the physical layer circuit 12 are transmitted (transferred) to the bus BS1 via the physical layer circuit 11. For example, packets are transferred from the bus BS1 to the bus BS2 or from the bus BS2 to the bus BS1 without changing the packet format. At this time, the processing circuit 20 performs predetermined signal processing in this transfer processing. This predetermined signal processing is signal processing for packet transfer, and is for transferring repeat packets corresponding to received packets. For example, the processing circuit 20 performs predetermined packet bit resynchronization processing as the predetermined signal processing. For example, when a packet is received, the bits in the packet are sampled based on a clock signal generated by the circuit device 10. When a packet is transmitted, the bits in the packet are transmitted in synchronization with a clock signal generated by the circuit device 10. When packet transfer is performed on a transfer route TR2 (FIG. 10) that passes through the processing circuit 20, due to the processing circuit 20 performing predetermined signal processing, it is possible to realize high-quality signal transfer that improves degraded signal characteristics of USB transmission signals.

As shown in FIG. 3, the physical layer circuit 12 includes the disconnection detection circuit 94 (disconnection detection circuit on second bus side) that detects the disconnection of a device on the bus BS2. The disconnection detection circuit 94 is a disconnection detection circuit on the bus BS2 side, and is used in detecting the disconnection of a device on the bus BS2. The disconnection detection circuit 94 performs device disconnection detection (HS disconnection detection) in the case where a device connected to the bus BS2 is detached so as to be disconnected from the bus BS2. This device disconnection detection can be realized by detecting the amplitudes of the DP and DM signals on the bus BS2. For example, in USB technology, a terminating resistance is provided in the physical layer circuits of the device and the host, and when the device is disconnected, the terminating resistance of the device can no longer be seen, and the signal amplitude of the signals DP and DM increase. Accordingly, device disconnection can be detected by detecting that the signal amplitude (signal level) has exceeded a predetermined threshold value. Specifically, device disconnection can be detected by detecting the signal amplitude of an EOP (End Of Packet) in the repeat packet of an SOF (Start Of Frame) packet, as will be described later.

When the connection between the buses BS1 and BS2 is off, if device disconnection is detected by the disconnection detection circuit 94, the bus switch circuit 40 switches the connection between the buses BS1 and BS2 from off to on. Specifically, when transfer is being performed on the transfer route TR2 that passes through the physical layer circuit 11, the processing circuit 20, and the physical layer circuit 12 as shown in FIG. 10, if device disconnection is detected, transfer is switched to the transfer route TR1 that passes through the bus switch circuit 40 (i.e., does not pass through the processing circuit 20) as shown in FIG. 9.

Specifically, in this embodiment, the bus switch circuit 40 switches on the connection between the buses BS1 and BS2 in the period T1, and switches off this connection in the period T2. Also, in the period T2, packet transfer is performed on the transfer route TR2 that passes through the physical layer circuit 11, the processing circuit 20, and the physical layer circuit 12. Accordingly, it is possible to realize high-quality signal transfer that improves degraded signal characteristics of USB transmission signals. However, when packet transfer is being performed on the transfer route TR2 shown in FIG. 10, if the peripheral device 260 connected to the bus BS2 is detached so as to be disconnected from the bus BS2, the connection between the buses BS1 and BS2 is off in the bus switch circuit 40, and therefore the main controller 200 cannot detect this device disconnection.

In view of this, in this embodiment, the disconnection detection circuit 94 in FIG. 3 detects disconnection of the peripheral device 260 from the bus BS2. In the case where device disconnection is detected, the connection between the buses BS1 and BS2 in the bus switch circuit 40 is switched from off to on, and USB signal transfer can be performed on the transfer route TR1 in FIG. 9. According to this configuration, the bus BS1 and the bus BS2 become electrically connected, and the main controller 200 can detect the DP and DM signal amplitudes for example, thus making it possible to detect disconnection of the peripheral device 260. Accordingly, the main controller 200, which is the host, can appropriately detect device disconnection, and it is possible to improve degraded signal characteristics of a USB signal while also being able to appropriately handle device disconnection as well.

Figure 4:
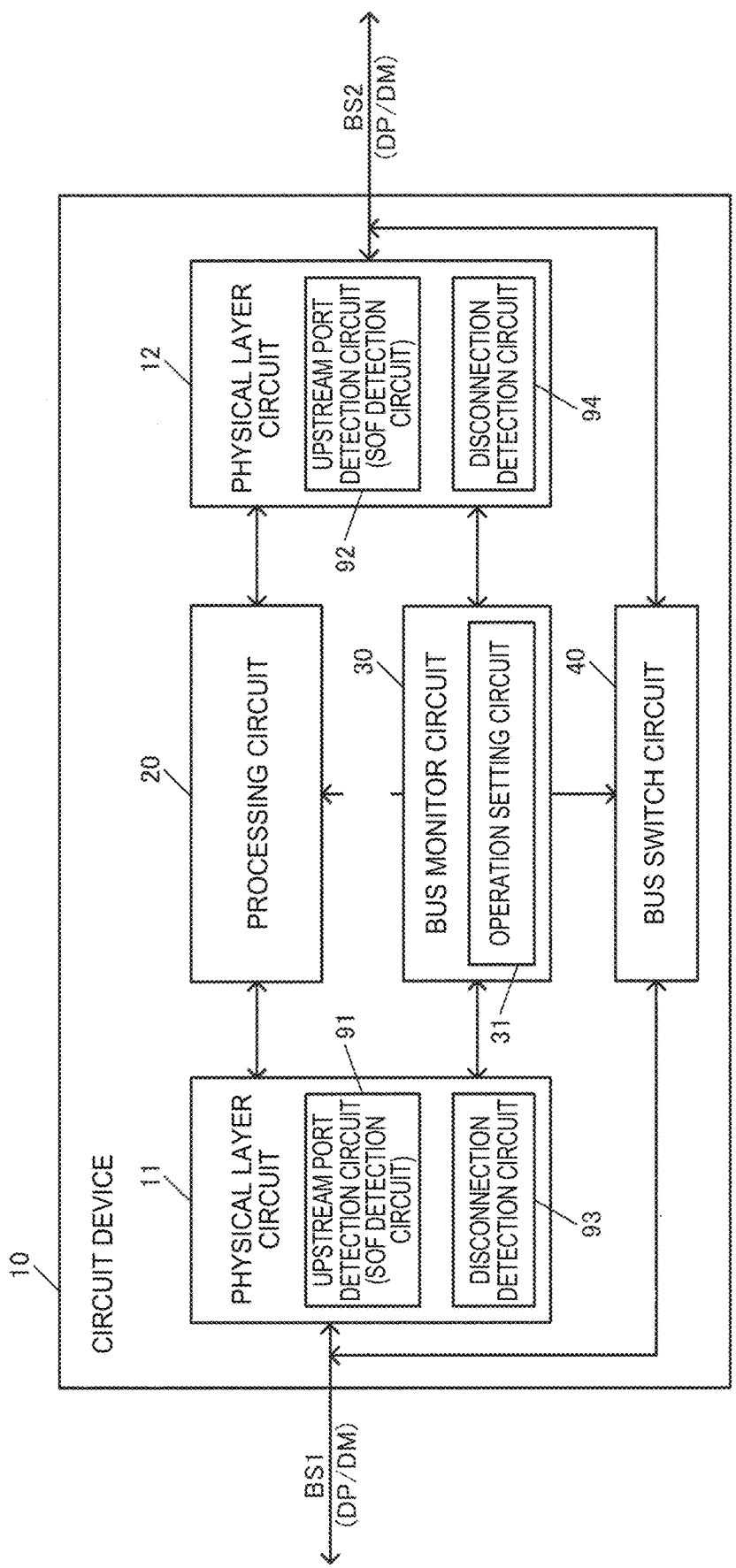
FIG. 4 shows a detailed example of the first configuration example of the circuit device.

FIG. 4 shows a detailed example of the first configuration example of the circuit device 10. In FIG. 4, the circuit device 10 includes a bus monitor circuit 30. The bus monitor circuit 30 performs a monitor operation for monitoring the buses BS1 and BS2. For example, this is a monitor operation for monitoring the state of at least one of the buses BS1 and BS2. Specifically, the bus monitor circuit 30 performs a monitor operation for monitoring the bus BS1 or BS2 with use of the physical layer circuit 11 or 12. More specifically, this is a monitor operation for monitoring the state of the bus BS1 or the bus BS2 (at least one bus) based on signals from the physical layer circuit 11 or the physical layer circuit 12 (at least one physical layer circuit). The bus switch circuit 40 then switches on or off the connection (electrical connection) between the buses BS1 and BS2 based on the monitor result from the bus monitor circuit 30. For example, based on the monitor result from the bus monitor circuit 30, the bus switch circuit 40 switches on the connection between the buses BS1 and BS2 in the period T1, and switches off this connection in the period T2. Also, the processing circuit 20 performs transfer processing shown in FIG. 10 in the period T2. Accordingly, predetermined signal processing such as packet bit resynchronization processing (packet repeat processing) is executed by the processing circuit 20, and it is possible to realize high-quality signal transfer that improves degraded signal characteristics of USB transmission signals.

Also, as shown in FIG. 4, the physical layer circuit 11 includes a disconnection detection circuit 93 (disconnection detection circuit on first bus side) that detects the disconnection of a device on the bus BS1. The disconnection detection circuit 93 is a disconnection detection circuit on the bus BS1 side, and is used in detecting the disconnection of a device on the bus BS1. The disconnection detection circuit 93 performs device disconnection detection in the case where a device connected to the bus BS1 is detached so as to be disconnected from the bus BS1. This device disconnection detection can be realized by detecting the amplitudes of the DP and DM signals on the bus BS1. For example, device disconnection can be detected by detecting the signal amplitude of an EOP in the repeat packet of an SOF packet.

When the connection between the buses BS1 and BS2 is off, if device disconnection is detected by the disconnection detection circuit 93, the bus switch circuit 40 switches the connection between the buses BS1 and BS2 from off to on. Specifically, when transfer is being performed on the transfer route TR2 shown in FIG. 10, if device disconnection is detected, transfer is switched to the transfer route TR1 that passes through the bus switch circuit 40 as shown in FIG. 9.

For example, previously-mentioned FIG. 3 shows an example of the case where the bus BS1 is the bus on the upstream side, and the bus BS2 is the bus on the downstream side. Specifically, in FIG. 1, the circuit device 10 of this embodiment is provided between the main controller 200 that is the host and the portable terminal device 250 that is the device. Also, the main controller 200 is connected to the bus BS1 on the upstream side, and the portable terminal device 250 is connected to the bus BS2 on the downstream side.

In this way, in the case where the bus BS2 is on the downstream side, it is sufficient that the disconnection detection circuit 94 is provided only on the bus BS2 side, which is the upstream side as shown in FIG. 3. This is because device disconnection detection is performed on the downstream side. However, with CarPlay or USB OTG, the role of the host (master) and the role of the device (slave) can be interchanged, as will be described later. Accordingly, in FIG. 1, there are cases where the portable terminal device 250 plays the role of the host, and the main controller 200 plays the role of the device. In such a case, the bus BS1 is on the downstream side, and the device disconnection detection needs to be performed on the bus BS1 side.

In view of this, in FIG. 4, in addition to the disconnection detection circuit 94 on the bus BS2 side, the disconnection detection circuit 93 is provided on the bus BS1 side as well. Accordingly, even if the roles of the host and the device are interchanged, and the bus BS1 is on the downstream side, for example, it is possible to appropriately detect the disconnection of a device from the bus BS1. Accordingly, it is possible to provide a circuit device 10 that is appropriate for a system in which the roles of the host and the device can be interchanged, for example.

Also, in FIG. 4, the physical layer circuit 11 includes an upstream port detection circuit 91 (first upstream port detection circuit) that detects whether or not the bus BS1 is the bus on the upstream side (the upstream port side). The physical layer circuit 12 includes an upstream port detection circuit 92 (second upstream port detection circuit) that detects whether or not the bus BS2 is the bus on the upstream side. The upstream port detection circuits 91 and 92 respectively detect whether or not the buses BS1 and BS2 are on the upstream side based on a packet (e.g., an SOF packet) received from the buses BS1 and BS2, for example.

If it was determined that the bus BS1 is the bus on the upstream side, the disconnection detection circuit 94 performs device disconnection detection with respect to the bus BS2. Specifically, if the bus BS1 is on the upstream side, then the bus BS2 is on the downstream side (downstream port side), and therefore the disconnection detection circuit 94 on the bus BS2 side detects the disconnection of a device on the bus BS2. On the other hand, if it was determined that the bus BS2 is the bus on the upstream side, the disconnection detection circuit 93 performs device disconnection detection with respect to the bus BS1. Specifically, if the bus BS2 is on the upstream side, then the bus BS1 is on the downstream side, and therefore the disconnection detection circuit 93 on the bus BS1 side detects the disconnection of a device on the bus BS1.

According to this configuration, in FIG. 1, if the main controller 200 is the USB host, and the portable terminal device 250 is the USB device, for example, the upstream port detection circuit 91 detects that the bus BS1 is on the upstream side based on a packet (e.g., an SOF packet) received from the main controller 200. Also, the disconnection detection circuit 94 detects the disconnection of a device from the bus BS2 that is on the downstream side. On the other hand, if the portable terminal device 250 plays the role of the host, and the main controller 200 plays the role of the device, the upstream port detection circuit 92 detects that the bus BS2 is on the upstream side based on a packet (e.g., an SOF packet) received from the portable terminal device 250. Also, the disconnection detection circuit 93 detects the disconnection of a device from the bus BS1 that is on the downstream side.

Furthermore, the circuit device 10 is provided with an operation setting circuit 31 that performs operation setting with respect to the disconnection detection circuits 93 and 94. For example, the operation setting circuit 31 is provided in the bus monitor circuit 30. If it was determined that the bus BS1 is the bus on the upstream side, the operation setting circuit 31 sets the disconnection detection circuit 94 on the bus BS2 side to an operation enabled state. For example, if the upstream port detection circuit 91 detects that the bus BS1 is on the upstream side, the operation of the disconnection detection circuit 94 is enabled, and device disconnection detection can be performed with respect to the bus BS2 that is on the downstream side. For example, if the operation setting circuit 31 (the bus monitor circuit 30) sets an operation enable signal (enabling signal) for the disconnection detection circuit 94 to active, the disconnection detection circuit 94 enters the operation enabled state (enable state). On the other hand, if it was determined that the bus BS2 is the bus on the upstream side, the operation setting circuit 31 sets the disconnection detection circuit 93 on the bus BS1 side to the operation enabled state. For example, if the upstream port detection circuit 92 detects that the bus BS2 is on the upstream side, the operation of the disconnection detection circuit 93 is enabled, and device disconnection detection can be performed with respect to the bus BS1 that is on the downstream side. For example, if the operation setting circuit 31 sets an operation enable signal for the disconnection detection circuit 93 to active, the disconnection detection circuit 93 enters the operation enabled state.

According to this configuration, if it is detected that one of the buses BS1 and BS2 is on the upstream side, the disconnection detection circuit of the other bus that is on the downstream side is set to the operation enabled state, and device disconnection detection can be performed with respect to the other bus. Then, if the disconnection of a device is detected, the electrical connection between the bus BS1 and the bus BS2 in the bus switch circuit 40 is switched on. Accordingly, the bus BS1 and the bus BS2 enter a state of bypassing the circuit device 10 and being directly connected, and the host connected to the one bus can detect device connection with respect to the other bus.

Also, if it was detected that the bus BS1 is on the upstream side, the operation setting circuit 31 sets the disconnection detection circuit 93 on the bus BS1 side to an operation disabled state or a power saving state. According to this configuration, the disconnection detection circuit 93 that does not need to perform device disconnection detection stops operating and shifts to the power saving state, thus reducing power consumption and preventing erroneous detection. Also, if it was detected that the bus BS2 is on the upstream side, the operation setting circuit 31 sets the disconnection detection circuit 94 on the bus BS2 side to the operation disabled state or the power saving state. According to this configuration, the disconnection detection circuit 94 that does not need to perform device disconnection detection stops operating and shifts to the power saving state, thus reducing power consumption and preventing erroneous detection. Also, after the upstream port detection circuit 91 or 92 has detected that the corresponding bus is on the upstream side, or after the connection between the buses BS1 and BS2 has been switched on, the operation setting circuit 31 may set the upstream port detection circuits 91 and 92 to the operation disabled state or the power saving state. According to this configuration, it is possible to further reduce power consumption.

Note that the operation setting circuit 31 sets the operation disabled state or the power saving state by setting the operation disable signal or a power-saving setting signal to active. Also, the operation enabled state is a state in which the device disconnection detection operation of the disconnection detection circuit 93 or 94 is enabled (can be performed), and the operation disabled state is a state in which the device disconnection detection operation of the disconnection detection circuit 93 or 94 is disabled (cannot be performed). Also, the power saving state is a state in which power consumption is lower than that in the normal state in which disconnection detection is performed normally.

Also, if it is determined that the packet received from the bus BS1 is an SOF packet, the upstream port detection circuit 91 determines that the bus BS1 is the bus on the upstream side. Furthermore, if it is determined that the packet received from the bus BS2 is an SOF packet, the upstream port detection circuit 92 determines that the bus BS2 is the bus on the upstream side.

Figure 9:
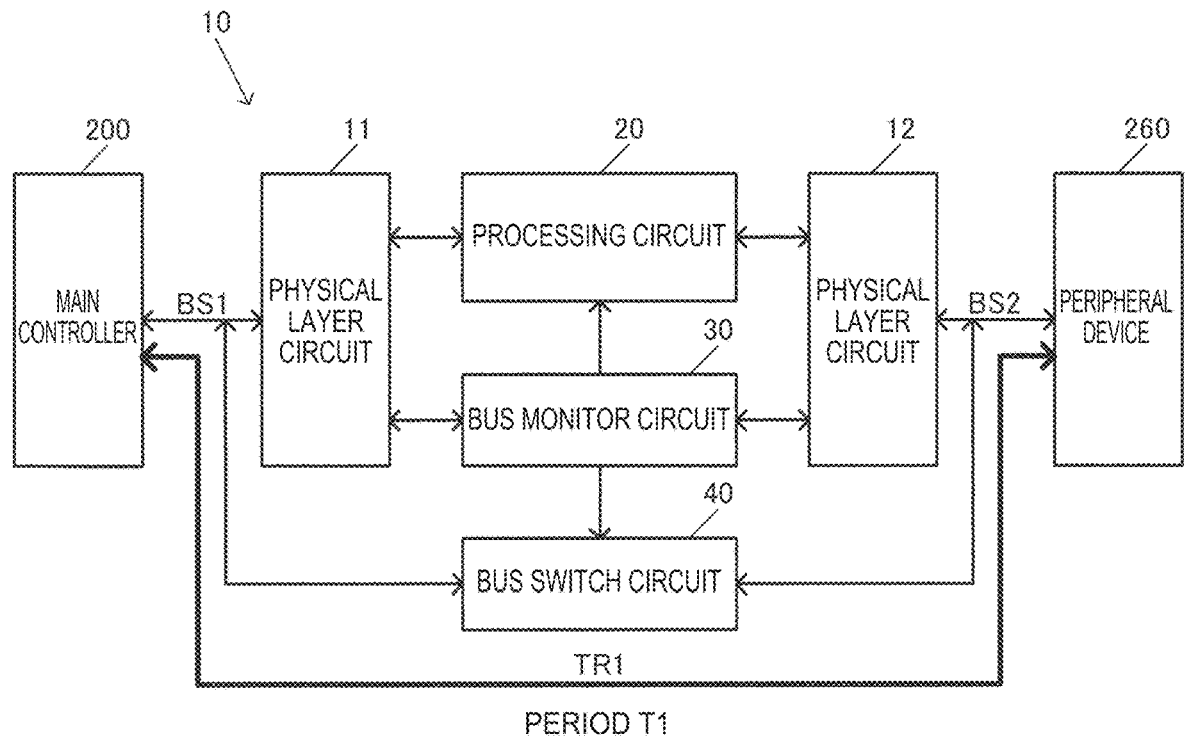
FIG. 9 is an illustrative diagram of operations of the circuit device.
Figure 10:
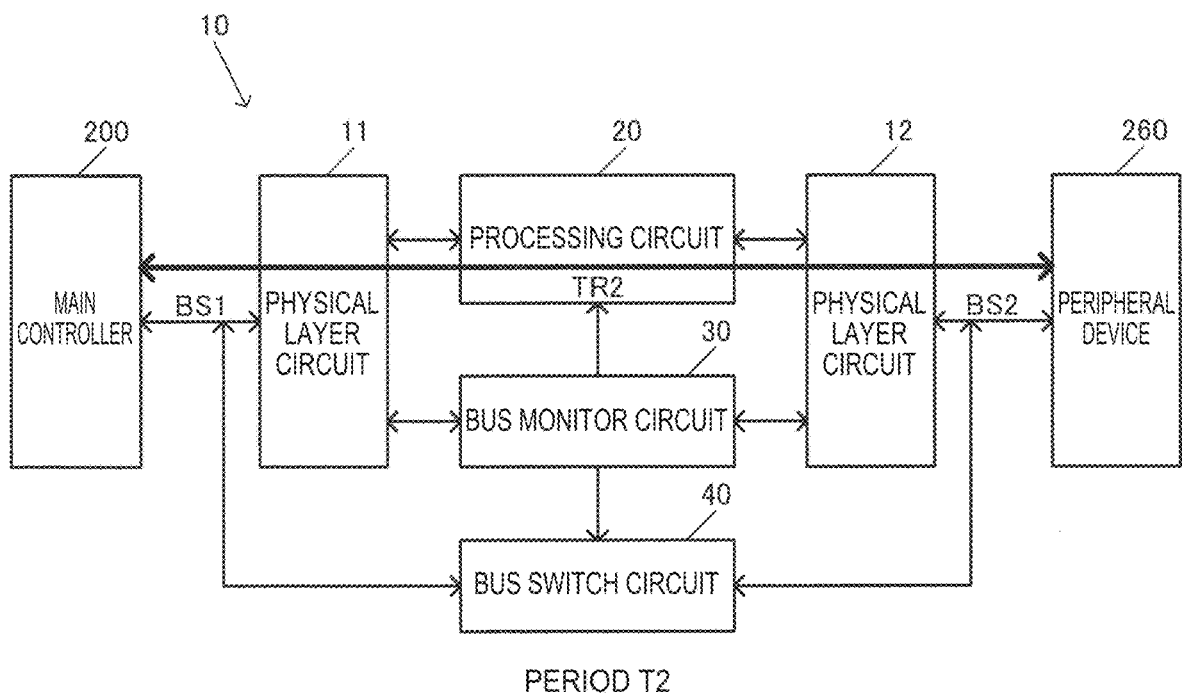
FIG. 10 is an illustrative diagram of operations of the circuit device.

For example, if the bus BS1 is on the upstream side, in the HS mode, the main controller 200 shown in FIGS. 9 and 10 transmits an SOF packet as the host (master). In this case, the upstream port detection circuit 91 on the bus BS1 side of the circuit device 10 detects that the bus BS1 is on the upstream side by detecting the SOF packet from the main controller 200. The disconnection detection circuit 94 on the bus BS2 thus detects device connection with respect to the bus BS2. On the other hand, if the bus BS2 is on the upstream side, in the HS mode, the peripheral device 260 transmits an SOF packet as the host (master). In this case, the upstream port detection circuit 92 on the bus BS2 side of the circuit device 10 detects that the bus BS2 is on the upstream side by detecting the SOF packet from the peripheral device 260. The disconnection detection circuit 94 on the bus BS1 side thus detects device connection with respect to the bus BS1. According to this configuration, by using an SOF packet received from the host side, it is possible to appropriately detect whether or not the bus is on the upstream. The SOF packet is periodically received from the host side, and therefore is suitable as a signal for detecting whether the bus is on the upstream. It should be noted that a configuration is possible in which whether or not the bus is on the upstream side is detected by detecting another signal that only arrives from the host side, instead of the SOF packet.

Also, if an SOF packet was received from the bus BS1, the processing circuit 20 performs processing for transmitting a repeat packet corresponding to the SOF packet to the bus BS2. Specifically, the processing circuit 20 operates as a repeater circuit, and transmits a repeat packet corresponding to the SOF packet to the bus BS2 side with use of the physical layer circuit 12. The disconnection detection circuit 94 on the bus BS2 side then performs device disconnection detection by detecting the signal amplitude of the EOP in the repeat packet corresponding to the SOF packet. Specifically, if it was determined that the bus BS1 is on the upstream side, and the bus BS2 is on the downstream physical layer circuit, the disconnection detection circuit 94 performs device disconnection detection by monitoring the signal amplitude of a repeat packet transmitted by the physical layer circuit 12. For example, the disconnection detection circuit 94 detects device disconnection by detecting whether or not the signal amplitude has exceeded a predetermined threshold value (e.g., a voltage level between 400 mV and 800 mV). According to this configuration, device disconnection can be appropriately detected with use of the EOP field of an SOF packet.

Also, if an SOF packet was received from the bus BS2, the processing circuit 20 performs processing for transmitting a repeat packet corresponding to the SOF packet to the bus BS1. The disconnection detection circuit 93 on the bus BS1 then performs device disconnection detection by detecting the signal amplitude of the EOP in the repeat packet corresponding to the SOF packet. Specifically, the disconnection detection circuit 93 detects device connection by monitoring the signal amplitude of a repeat packet transmitted by the physical layer circuit 11.

3. Second Configuration Example

Figure 5:
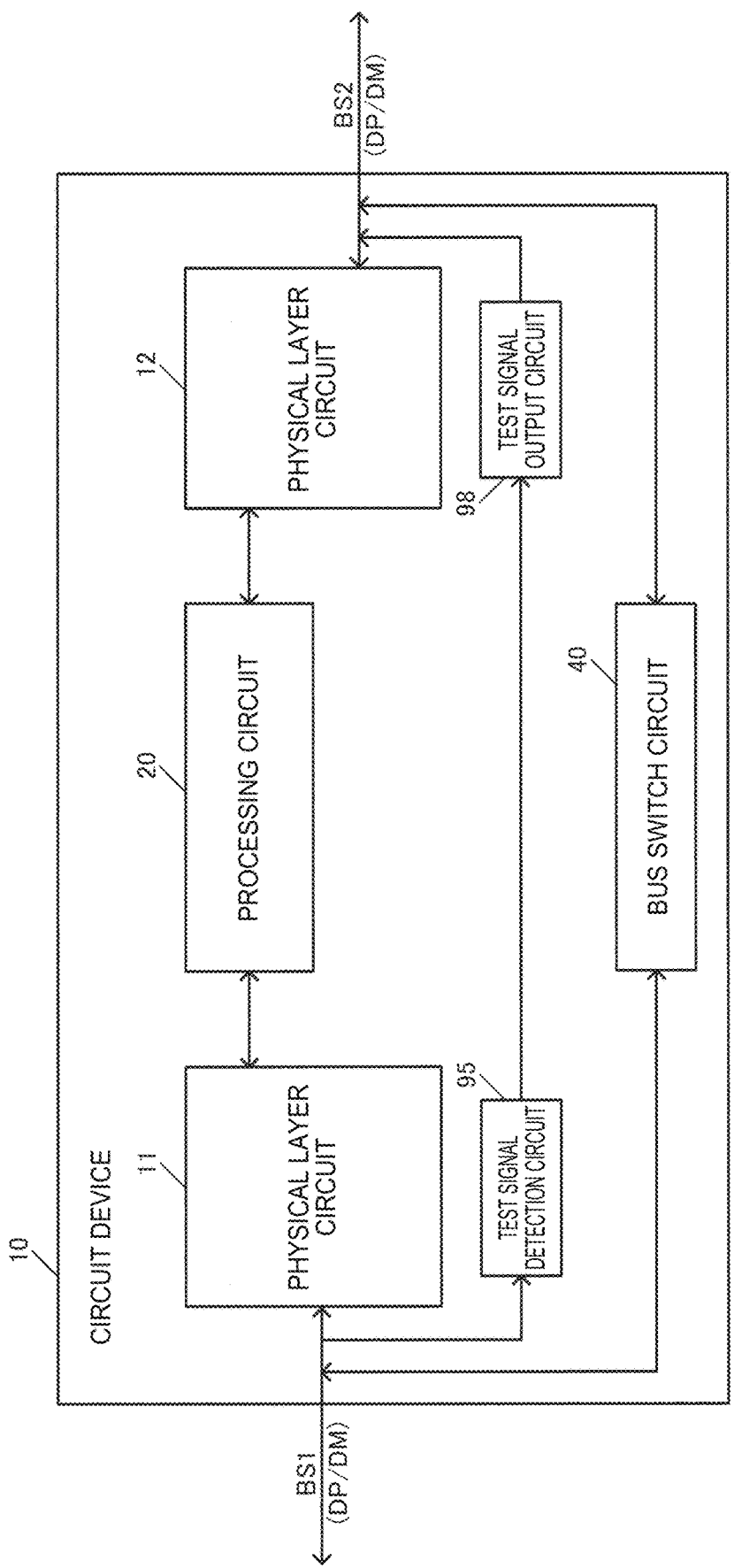
FIG. 5 shows a second configuration example of a circuit device according to the embodiment of the invention.

FIG. 5 shows a second configuration example of the circuit device 10 of this embodiment. The circuit device 10 of the second configuration example includes physical layer circuits 11 and 12, the processing circuit 20, the bus switch circuit 40, a test signal detection circuit 95, and a test signal output circuit 98. Note that the circuit device 10 is not limited to the configuration in FIG. 5, and various modifications can be carried out, such as omitting a portion of the constituent elements, or adding other constituent elements. Also, detailed descriptions will not be given for the circuit portions that were described with reference to FIGS. 3 and 4 (the physical layer circuit, the processing circuit, the bus switch circuit, the bus monitor circuit, and the like).

In FIG. 5, the circuit device 10 includes the test signal detection circuit 95 and the test signal output circuit 98. The test signal detection circuit 95 (first test signal detection circuit) detects whether or not a test signal (first test signal) was output to the bus BS1. For example, as will be described later, the test signal detection circuit 95 detects whether or not a test signal for DC level measurement regarding a Test_J state or a Test_K state was output from the host that is connected to the bus BS1 (the main controller 200). For example, test signal detection is performed by, for example, sampling DP and DM signals on the bus BS1.

Also, when the output of the test signal (first test signal) to the bus BS1 is detected by the test signal detection circuit 95, the test signal output circuit 98 (first test signal output circuit) outputs a repeat signal corresponding to the test signal to the bus BS2. For example, a signal corresponding to the test signal output to the bus BS1 is output to the bus BS2 as the repeat signal corresponding to the test signal. For example, if it was detected that a test signal for Test_J state measurement was output to the bus BS1, the test signal output circuit 98 outputs, to the bus BS2, a test signal for Test_J state measurement as the repeat signal. Also, if it was detected that a test signal for Test_K state measurement was output to the bus BS1, the test signal output circuit 98 outputs, to the bus BS2, a test signal for Test_K state measurement as the repeat signal.

According to this configuration, by performing transfer processing on the transfer route TR2 shown in FIG. 10, it is possible to improve degraded signal characteristics of a USB signal while also being able to handle a test mode for USB authentication test as well. For example, in an authentication test in the system shown in FIG. 1, there are cases where in a test mode such as Test_J or Test_K, the main controller 200 that is the host outputs test signals for DC level measurement. For example, in the Test_J test mode, the main controller 200 outputs DP=400 mV and DM=0 mV test signals to the bus BS1. Also, in the Test_K test mode, DP=0 mV and DM=400 mV test signals are output to the bus BS1. In this case, if the circuit device 10 cannot recognize that such test signals were output, the authentication test cannot be passed. In view of this, according to this embodiment, the test signal detection circuit 95 detects that a test signal for a test mode such as Test_J or Test_K was output to the bus BS1. If it was detected that a test signal were output, the test signal output circuit 98 outputs a repeat signal corresponding to the test signal to the bus BS2, instead of the main controller 200 (host) that is connected to the bus BS1. For example, if Test_J test signals were detected on the bus BS1, the test signal output circuit 98 outputs DP=400 mV and DM=0 mV test signals to the bus BS2. Also, if Test_K test signals were detected on the bus BS1, the test signal output circuit 98 outputs DP=0 mV and DM=400 mV test signals to the bus BS2. According to this configuration, the circuit device 10 according to this embodiment can appropriately handle a USB authentication test even in the case of being provided between the main controller 200 and the USB receptacle 226.

Figure 6:
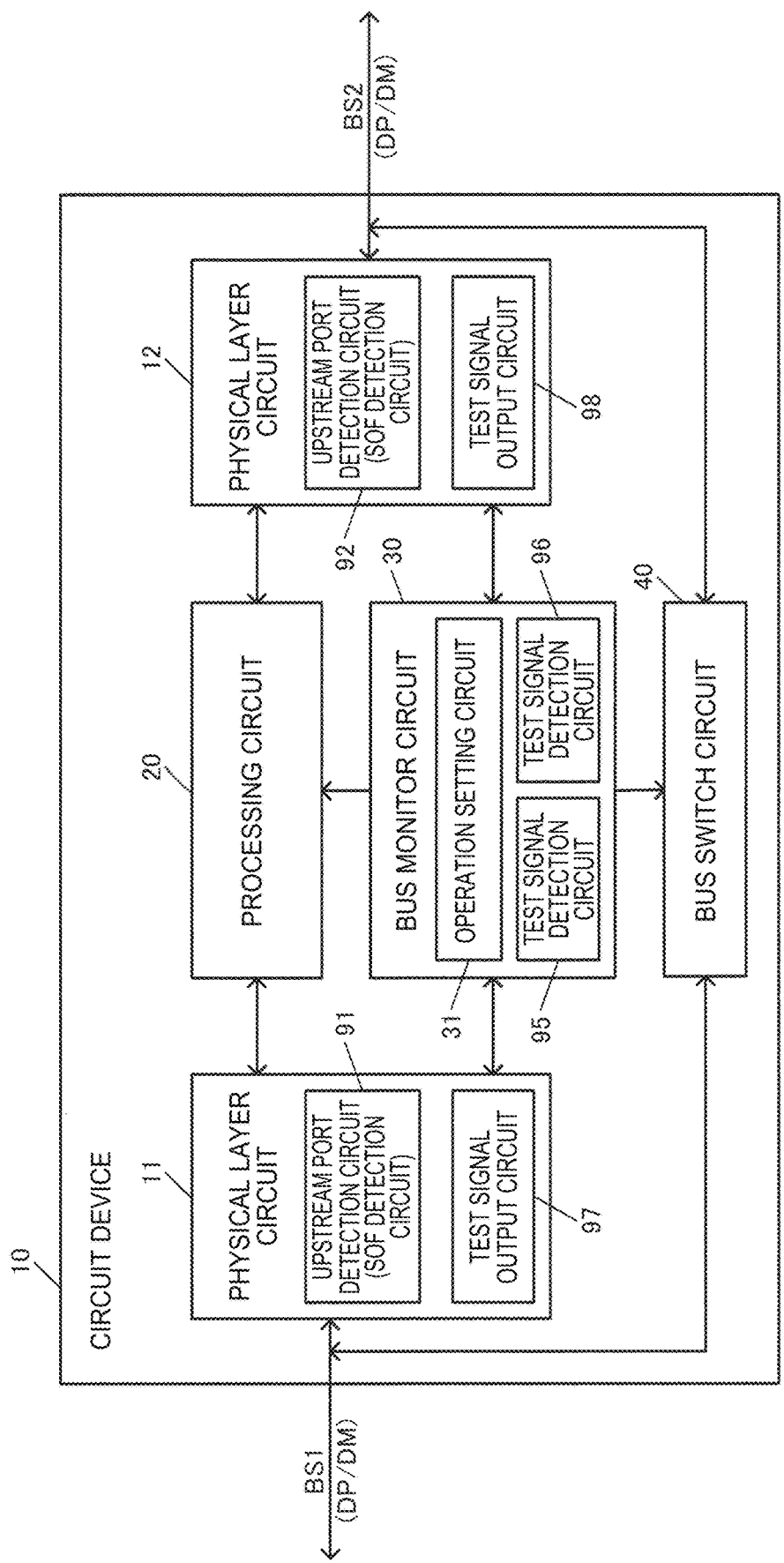
FIG. 6 shows a detailed example of the second configuration example of the circuit device.

FIG. 6 shows a detailed example of the second configuration example of the circuit device 10. In FIG. 6, the circuit device 10 includes the bus monitor circuit 30. Also, the upstream port detection circuits 91 and 92, test signal detection circuits 95 and 96, and test signal output circuits 97 and 98 are further provided. For example, the upstream port detection circuit 91 and the test signal output circuit 97 are provided in the physical layer circuit 11, and the upstream port detection circuit 92 and the test signal output circuit 98 are provided in the physical layer circuit 12. Also, the test signal detection circuits 95 and 96 are provided in the bus monitor circuit 30. Note that the upstream port detection circuits 91 and 92, the test signal detection circuits 95 and 96, and the test signal output circuits 97 and 98 are not limited to being provided in the locations described above, and various modifications are possible. Also, detailed descriptions will not be given for the circuit portions that were described with reference to FIGS. 3, 4, and 5.

The circuit device 10 shown in FIG. 6 includes the test signal detection circuit 96 (second test signal detection circuit) that detects whether or not a test signal (second test signal) was output to the bus BS2. Also, the circuit device 10 includes the test signal output circuit 97 (second test signal output circuit) that, if the test signal detection circuit 96 detected that a test signal was output to the bus BS2, outputs a repeat signal corresponding to the test signal to the bus BS1.

According to this configuration, when the bus BS2 is the bus on the upstream side for example, the test signal detection circuit 96 can detect whether or not a test signal was output to the bus BS2. If a test signal was output to the bus BS2, the test signal output circuit 97 outputs a repeat signal corresponding to that test signal to the bus BS1. According to this configuration, even if the bus BS2 is on the upstream side, it is possible to appropriately handle a USB authentication test. Specifically, if the bus BS1 is on the upstream side, the test signal detection circuit 95 on the bus BS1 side detects a test signal that was output to the bus BS1, and the test signal output circuit 98 on the bus BS2 outputs a repeat signal corresponding to the test signal to the bus BS2. On the other hand, if the bus BS2 is on the upstream side, the test signal detection circuit 96 on the bus BS2 side detects a test signal that was output to the bus BS2, and the test signal output circuit 97 on the bus BS1 outputs a repeat signal corresponding to the test signal to the bus BS1. According to this configuration, in both the case where the bus BS1 is on the upstream side and the bus BS2 is on the downstream side, and the case where the bus BS2 is on the upstream side and the bus BS1 is on the downstream side, it is possible to appropriately handle a USB authentication test.

Also, in FIG. 6, the circuit device 10 is provided with the operation setting circuit 31. For example, the operation setting circuit 31 is provided in the bus monitor circuit 30. Also, the physical layer circuit 11 includes the upstream port detection circuit 91 that detects whether or not the bus BS1 is the bus on the upstream side, and the physical layer circuit 12 includes the upstream port detection circuit 92 that detects whether or not the bus BS2 is the bus on the upstream side. These upstream port detection circuits 91 and 92 detect whether or not the corresponding bus is on the upstream side by detecting an SOF packet for example. If it was determined that the bus BS1 is the bus on the upstream side, the operation setting circuit 31 sets the test signal detection circuit 95 to the operation enabled state. Accordingly, if a test signal was output to the bus BS1, the test signal can be appropriately detected with use of the test signal detection circuit 95 that was set to the operation enabled state. A repeat signal corresponding to the test signal can then be output to the bus BS2 by the test signal output circuit 98. On the other hand, if it was determined that the bus BS2 is the bus on the upstream side, the operation setting circuit 31 sets the test signal detection circuit 96 to the operation enabled state. Accordingly, if a test signal was output to the bus BS2, the test signal can be appropriately detected with use of the test signal detection circuit 96 that was set to the operation enabled state. A repeat signal corresponding to the test signal can then be output to the bus BS1 by the test signal output circuit 97. Note that if it was detected that the bus BS1 is the bus on the upstream side, the operation setting circuit 31 may set the test signal detection circuit 96 on the downstream side to the operation disabled state or the power saving state. Also, if it was detected that the bus BS2 is the bus on the upstream side, the test signal detection circuit 95 on the downstream side may be set to the operation disabled state or the power saving state. The operation enabled state is a state in which the test signal detection operation of the test signal detection circuit 95 or 96 is enabled (can be performed), and the operation disabled state is a state in which the test signal detection operation is disabled (cannot be performed). The power saving state is a state in which power consumption is lower than that in the normal state in which test signal detection is performed normally.

Also, the test signal detection circuit 95 samples signals on the bus BS1. If a signal level that corresponds to a test signal (e.g., a Test_J or Test_K signal level) is sampled continuously (consecutively) for a given period (e.g., a period greater than or equal to 1 frame), it is determined that a test signal has been detected. Similarly, the test signal detection circuit 96 samples signals on the bus BS2, and, if a signal level that corresponds to a test signal is sampled continuously for a given period, determines that a test signal has been detected. According to this configuration, by sampling and monitoring signals (signal levels) on the buses BS1 and BS2, it is possible to detect whether or not a test signal was output to the buses BS1 and BS2. It is determined that a test signal was detected based on the condition that a signal level corresponding to a test signal was sampled continuously for a given period, and therefore it is possible to prevent a situation in which is erroneously detected that a test signal was output even though a test signal was not output.

4. Details of Circuit Device

Figure 7:
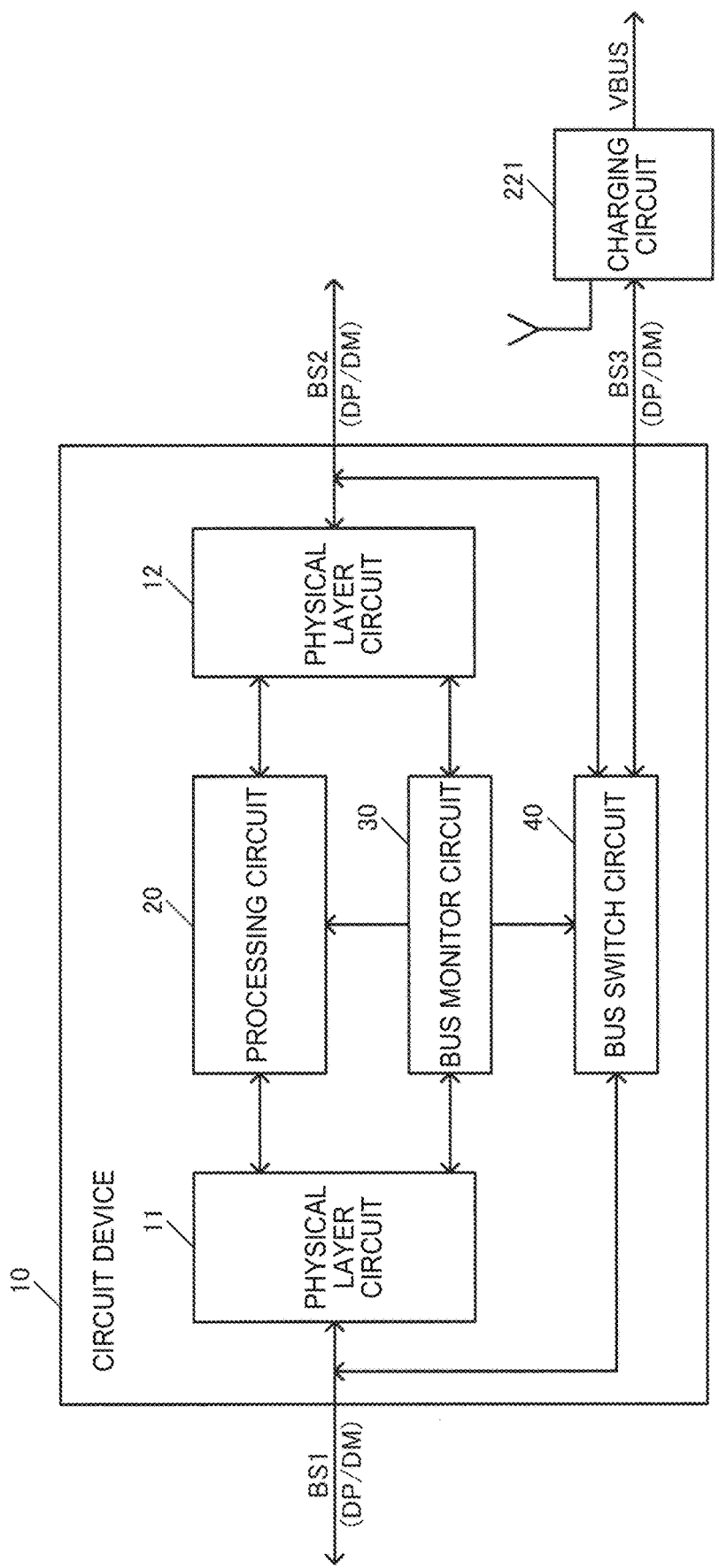
FIG. 7 shows a configuration example of the circuit device in the case where a charging circuit is connected.

Next, the circuit device 10 of this embodiment will be described in detail. FIG. 7 shows another configuration example of the circuit device 10 of this embodiment. The charging circuit 221 is a circuit that operates in compliance with the USB BC 1.2 (Battery Charging Specification Rev 1.2) specification for example. In BC 1.2, the power supply limit of VBUS, which is 500 mA or less for example, is extended to 2A or less for example. In FIG. 7, the charging circuit 221 has a regulator circuit or the like, and receives external power and supplies power to VBUS. Also, although it has only been possible to supply power from the master side to the slave side, in BC 1.2, power can also be supplied from the slave side to the master side. For example, even in the case where the peripheral device 260 plays the role of the master (host), and the main controller 200 plays the role of the slave (device), VBUS power can be supplied from the main controller 200 that is the slave to the peripheral device 260 that is the master.

In order to realize BC 1.2, the charging circuit 221 needs to execute a BC 1.2 protocol by transferring signals to the peripheral device 260 using DP and DM in a charging arbitration period. For this reason, as will be described later with reference to FIG. 12, in the charging arbitration period (BC 1.2 protocol execution period), the bus switch circuit 40 switches on (switches from off to on) the connection between the bus BS2 (second bus) and a bus BS3 (third bus) to which the charging circuit 221 is connected. In other words, the bus BS3 and the bus BS2 become electrically connected. For example, if a switch element provided between the bus BS3 and the bus BS2 is switched on, the charging circuit 221 can transfer signals to the peripheral device 260 using DP and DM. According to this configuration, in the charging arbitration period, charging arbitration processing can be performed by executing the BC 1.2 protocol. For example, it is possible to set an appropriate charging current, and therefore the charging speed can be raised.

Figure 8:
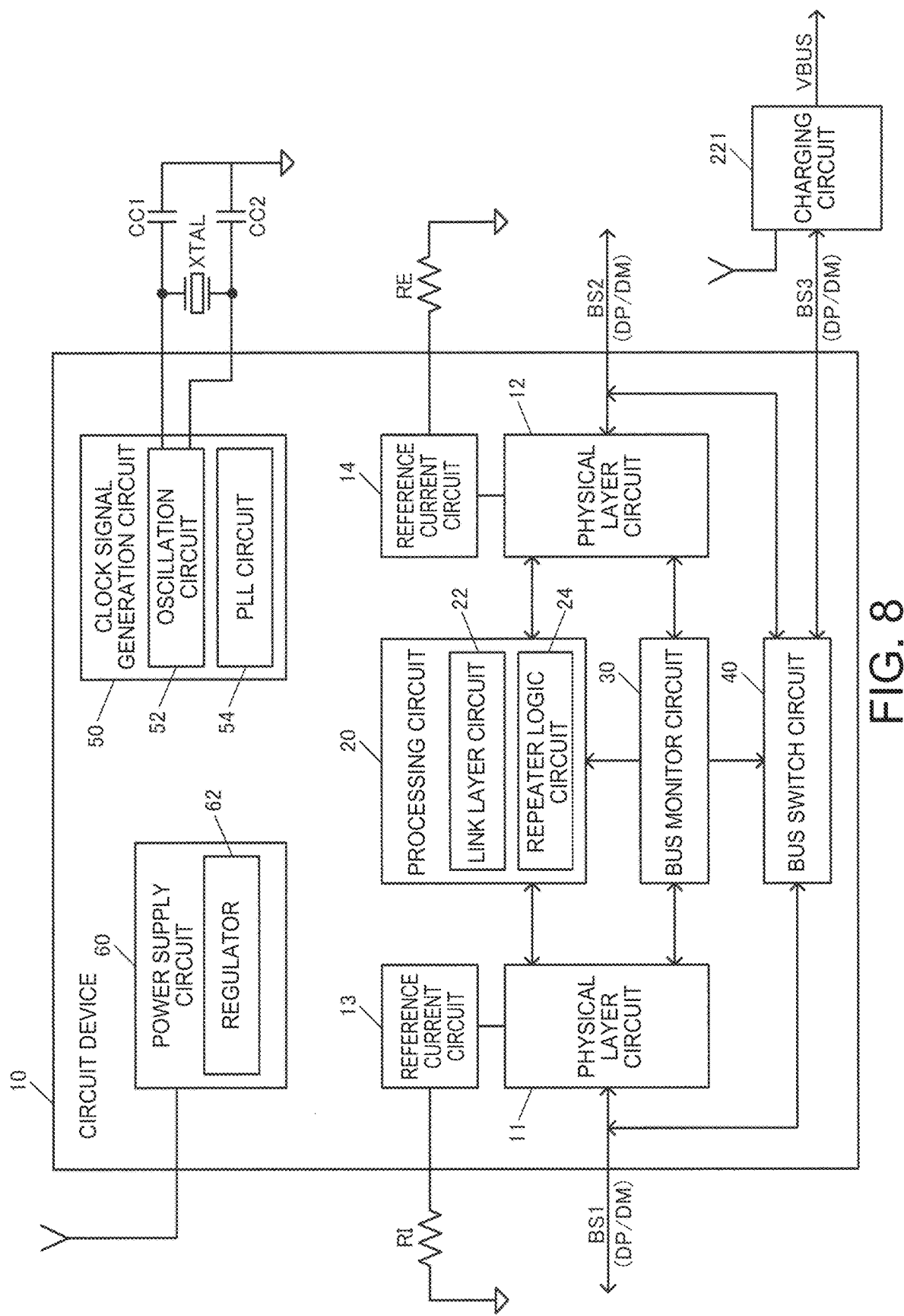
FIG. 8 shows a detailed configuration example of the circuit device in the case where a charging circuit is connected.

FIG. 8 shows a detailed configuration example of the circuit device 10. In FIG. 8, the circuit device 10 further includes reference current circuits 13 and 14, a clock signal generation circuit 50, and a power supply circuit 60. The reference current circuits 13 and 14 are circuits for generating reference currents used in the physical layer circuits 11 and 12 respectively, and generate the reference currents with use of resistances RI and RE that are external components. The clock signal generation circuit 50 is a circuit that generates various types of clock signals used in the circuit device 10, and includes an oscillation circuit 52 and a PLL circuit 54. The oscillation circuit 52 is connected to an oscillator XTAL and capacitors CC1 and CC2, which are external components. The oscillator XTAL is realized by a quartz resonator or the like. The oscillator XTAL performs an oscillation operation, and the oscillation circuit 52 generates clock signals based on the oscillation signal. The PLL circuit 54 generates a multiphase clock signal as shown in later-described FIG. 33 based on a generated clock signal. The power supply circuit 60 receives voltage from an external power supply, and generates various types of power supply voltages for use in the circuit device 10. Specifically, a regulator 62 of the power supply circuit 60 regulates the voltage from the external power supply, generates power supply voltage having a lower voltage than the voltage from the external power supply, and supplies the generated power supply voltage to various circuit blocks of the circuit device 10.

The processing circuit 20 includes a link layer circuit 22, a repeater logic circuit 24, and the like. The link layer circuit 22 is a circuit that performs processing that corresponds to the link layer. The link layer circuit 22 performs serial-to-parallel conversion processing for converting serial data received via USB into parallel data, parallel-to-serial conversion processing for converting parallel data into serial data for transmission, processing for NRZI encoding and decoding, and the like. The repeater logic circuit 24 performs logic processing for transmitting packets received from the bus BS1 side to the bus BS2 side, and transmitting packets received from the bus BS2 side to the bus BS1 side. For example, as will be described in detail with reference to later-described FIGS. 33 and 34, the bits of a received packet are sampled using a clock signal, and serial data obtained by the sampling is converted into parallel data. Also, parallel data that has been subjected to various types of logic processing such as NRZI is converted into serial data and transmitted in synchronization with a clock signal in the circuit device 10. According to this configuration, predetermined signal processing such as packet bit resynchronization processing (resynchronization) is realized.

Figure 11:
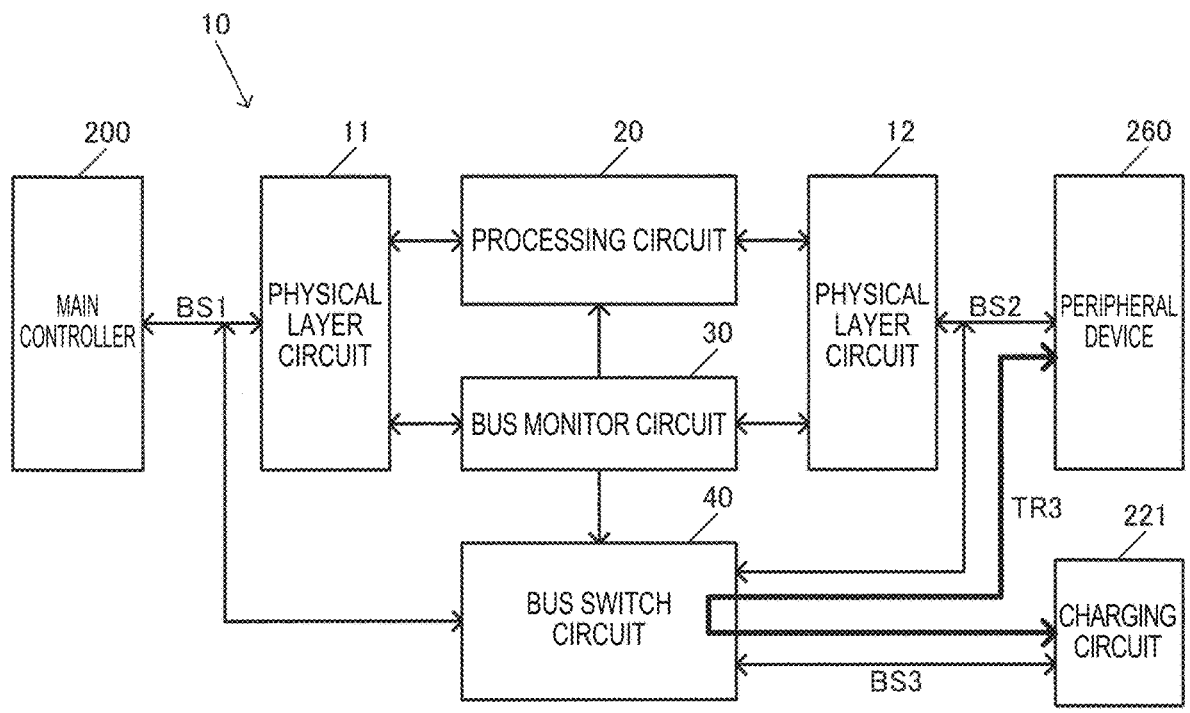
FIG. 11 is an illustrative diagram of operations of the circuit device.

FIGS. 9, 10, and 11 are illustrative diagram of operations of the circuit device 10 of this embodiment. As shown in FIG. 9, in the period T1, the bus switch circuit 40 switches on the connection between the buses BS1 and BS2. For example, when a switching control signal from the bus monitor circuit 30 becomes active, switch elements respectively provided in correspondence with the DP and DM signal lines are switched on, and the buses BS1 and BS2 become electrically connected. Accordingly, the main controller 200 connected to the bus BS1 and the peripheral device 260 (e.g., the portable terminal device 250 in FIG. 1) connected to the bus BS2 are able to perform USB signal transfer on the transfer route TR1 that includes the bus BS1, the bus switch circuit 40, and the bus BS2. In other words, it is possible to perform signal transfer with use of the signals DP and DM. On the other hand, as shown in FIG. 10, in the period T2 after the period T1, the bus switch circuit 40 switches off the connection between the buses BS1 and BS2. For example, when a switching control signal from the bus monitor circuit 30 becomes inactive, switch elements respectively provided in correspondence with the signals DP and DM are switched off, and the buses BS1 and BS2 become electrically disconnected. In this period T2, the processing circuit 20 performs transfer processing for transferring packets between the buses BS1 and BS2 via the physical layer circuits 11 and 12. In other words, packet transfer processing is performed on the transfer route TR2. For example, in the period T2, when a transfer processing instruction signal (permission signal) from the bus monitor circuit 30 becomes active, the processing circuit 20 starts packet transfer processing on the transfer route TR2. In this transfer processing, predetermined signal processing such as packet bit resynchronization processing is performed, and an improvement in signal quality is realized.

FIG. 11 is an illustrative diagram of operations of the circuit device 10 according to the configuration example shown in FIG. 7. In FIG. 11, in the charging arbitration period, the bus switch circuit 40 switches on the connection between the bus BS2 and the bus BS3 that is connected to the charging circuit 221. For example, switch elements respectively provided in correspondence with the signals DP and DM between the buses BS3 and BS2 are switched on in the charging arbitration period, and the bus BS3 and the bus BS2 become electrically connected. Accordingly, the BC 1.2 protocol for example is executed between the charging circuit 221 and the peripheral device 260 for example, and charging arbitration processing or the like is realized. After this charging arbitration period (BC 1.2 protocol execution period), a switch to the period T1 in FIG. 9 is performed, and signal transfer is performed on the transfer route TR1. Thereafter, a switch to the period T2 in FIG. 10 is performed, and packet transfer processing is performed on the transfer route TR2.

As described above, in this embodiment, the circuit device 10 is provided with the processing circuit 20 that performs packet transfer between the buses BS1 and BS2 via the physical layer circuits 11 and 12, the bus monitor circuit 30 that monitors the buses, and the bus switch circuit 40 that switches on and off the connection between the buses BS1 and BS2 based on the monitor result. According to this configuration, even if the signal characteristics of signals on the buses BS1 and BS2 has degraded for example, degraded signal characteristics can be improved by performing predetermined signal processing such as packet bit resynchronization processing on the transfer route TR2 in FIG. 10.

For example, if the cable 224 is long as shown in FIG. 1, or a large parasitic capacitance or parasitic resistance exists on the transfer route, there is a problem that the signal characteristics degrade a large amount, and appropriate signal transfer cannot be realized. In view of this, if the circuit device 10 of this embodiment is arranged between the main controller 200 and the portable terminal device 250 (peripheral device) for example, it is possible to improve the degraded signal characteristics. Accordingly, it is possible to realize appropriate signal transfer between the main controller 200 and the portable terminal device 250.

Also, in this embodiment, the states of the buses BS1 and BS2 are monitored by the bus monitor circuit 30, and the connection between the buses BS1 and BS2 is switched on and off by the bus switch circuit 40 based on the monitor result. Accordingly, in the period T1, which is before high-speed packet transfer in the HS mode is performed for example, the buses BS1 and BS2 can be electrically connected by the bus switch circuit 40 as shown in FIG. 9. Accordingly, in this period T1, signal transfer can be performed with use of the signals DP and DM between the main controller 200 and the peripheral device 260, and various types of exchanges can be performed prior to HS mode packet transfer. Then, in the period T2, as shown in FIG. 10, the connection between the buses BS1 and BS2 is switched off, and HS mode packet transfer is performed on the transfer route TR2. During this packet transfer, packet bit resynchronization is performed, thus making it possible to realize high-quality packet transfer that improves degraded signal characteristics as described with reference to FIG. 1.

Note that the USB-HUB 210 shown in FIG. 1 has a product ID and a vender ID in accordance with the USB standard. In contrast, the circuit device 10 of this embodiment does not have such a product ID or vender ID, and the circuit device 10 of this embodiment is different from the USB-HUB 210 in this respect.

Also, as a circuit device for improving degraded signal characteristics, there is also a circuit device called a redriver that uses an analog circuit to perform amplitude adjustment and eye adjustment for the signals DP and DM. However, a redriver does not perform packet transfer on the transfer route TR2 shown in FIG. 10, and therefore cannot improve the signal characteristic of degraded signals with resynchronization processing, and thus is different from the circuit device 10 of this embodiment in this respect.

Also, the peripheral device 260 in FIGS. 9 to 11 may be able to switch between the role of the host (master) and the role of the device (slave), as with CarPlay and USB OTG (On-The-GO). For example, assume that the portable terminal device 250 in FIG. 1 is the peripheral device 260 that can perform CarPlay or the like. In this case, a technique is conceivable in which a USB-HUB for improving degraded signal characteristics is arranged between the main controller 200 and the peripheral device 260 (portable terminal device 250). However, in the case where the peripheral device 260 is the host, the host peripheral device 260 is connected to the downstream port of the USB-HUB, and there is a problem that appropriate packet transfer cannot be realized.

In view of this, the circuit device 10 of this embodiment has an advantage in that, unlike the USB-HUB, even in the case where the role of the peripheral device 260 connected to the bus BS2 in FIGS. 9 to 11 for example is switched to the role of the host, it is possible to handle this case. For example, it is sufficient that switch processing and setting processing regarding the host and device roles is performed in the period T1. After it has been determined that the role of the peripheral device 260 is the host or the device, it is sufficient to perform packet transfer on the transfer route TR2 as shown in FIG. 10 in the period T2. Accordingly, with the technique of this embodiment, there is an advantage that even if the peripheral device 260 is a CarPlay device for example, it is possible to realize appropriate packet transfer.

Figure 12:
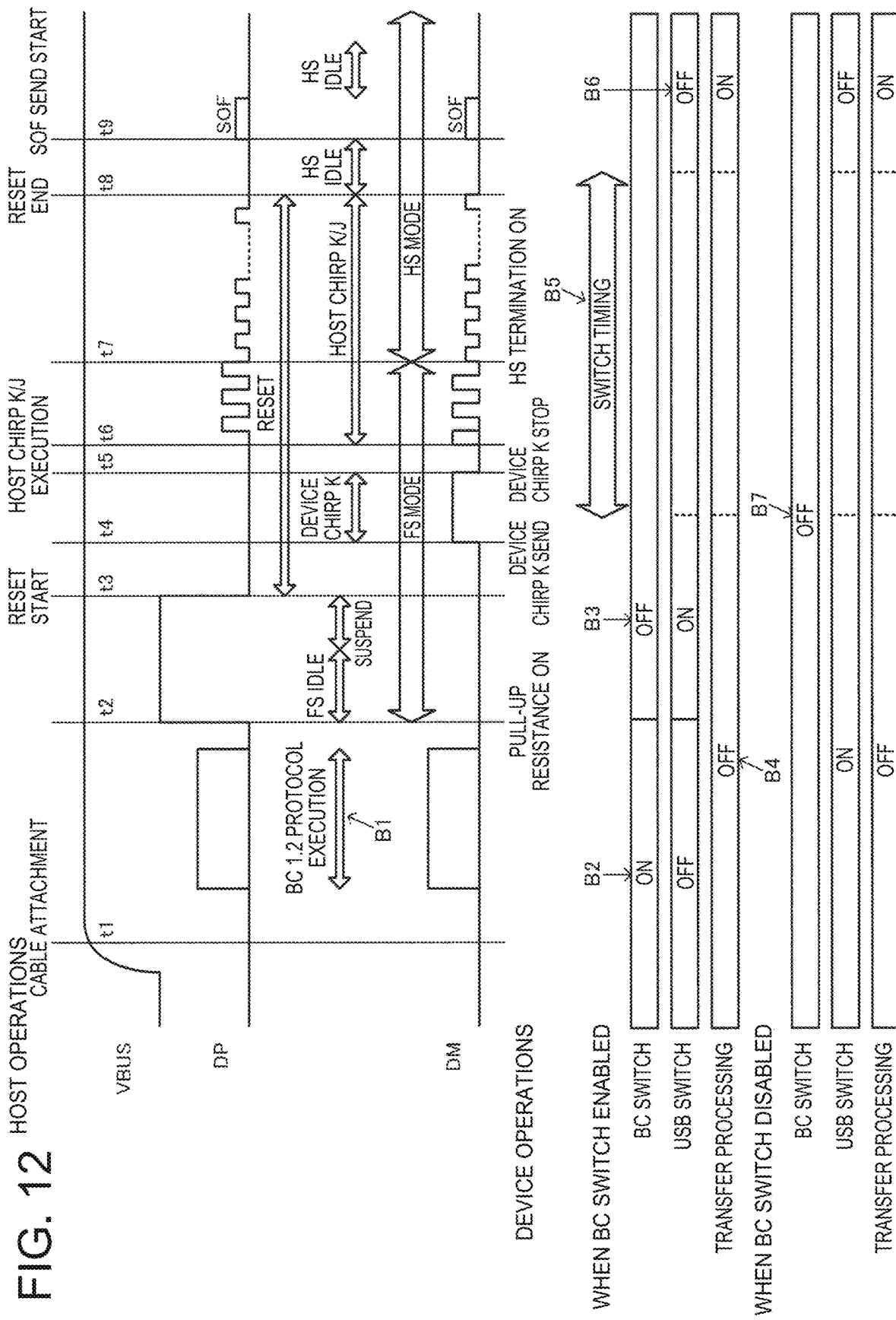
FIG. 12 is a signal waveform diagram illustrating detailed operations of the circuit device.

Next, a detailed operation example of this embodiment will be described. FIG. 12 is a signal waveform diagram showing a USB operation sequence after cable attachment. FIG. 12 shows various states of the differential signals DP and DM, and the on and off states of switch elements of the bus switch circuit 40.

In FIG. 12, the BC switch and the USB switch are switch elements provided in the bus switch circuit 40. Specifically, the BC switch is a switch element that is provided between the bus BS3 (charging circuit) in FIG. 11 and the bus BS2 (peripheral device) in the bus switch circuit 40. The USB switch is a switch element that is provided between the bus BS1 (main controller) and the bus BS2 (peripheral device) in the bus switch circuit 40. ON and OFF in transfer processing indicates whether transfer processing on the transfer route TR2 in FIG. 10 is on or off.

After cable attachment (timing t1), the previously-described BC 1.2 protocol is executed. The period in which the BC 1.2 protocol is executed (denoted by B1) is the charging arbitration period.

Next, when the device side (peripheral device) switches on a pull-up resistance, the voltage of the signal DP is pulled up, and a shift to the FS mode is performed (t2). In other words, a shift to FS idle is performed, and if nothing happens for a certain time, a shift to the suspend state is performed.

Next, when the host side (main controller) starts a reset (t3), the voltage of the pulled-up signal DP falls to L level. This is detected by the device side, and the device side transmits a device chirp K (t4). Thereafter, when a certain time has elapsed, the device side stops the transmission of the device chirp K (t5). Accordingly, the host side executes host chirp K/J (t6). By detecting the host chirp K/J, the device side recognizes that the host side is compatible with the HS mode, and switches on HS termination (t7). Accordingly, the amplitude of the signals DP and DM is reduced to 400 mV for example, and a shift to the HS mode is performed. When the host side ends the reset (t8), a shift to HS idle is performed, and the host side starts SOF transmission (t9).

In this embodiment, the BC switch that connects the bus BS3 and the bus BS2 can be set to enabled or disabled. If the BC switch has been set to enabled, in the charging arbitration period (BC 1.2 protocol execution period) indicated by period B1 in FIG. 12, the BC switch is switched on and the USB switch is switched off as shown by state B2. For example, in FIG. 11, when the BC switch is on, the connection between the buses BS3 and BS2 is switched on, and the USB switch is switched off, and therefore the connection between the buses BS1 and BS2 is switched off. Accordingly, signal processing for charging arbitration or the like using the signals DP and DM can be performed between the charging circuit 221 and the peripheral device 260.

When a shift to the FS mode is performed, the USB switch is switched on, and the BC switch is switched off, as indicated by state B3. When the USB switch is switched on, the connection between the buses BS1 and BS2 is switched on, and when the BC switch is switched off, the connection between the buses BS3 and BS2 is switched off. Accordingly, as shown in FIG. 9, signal transfer on the transfer route TR1 using the signals DP and DM can be performed between the main controller 200 and the peripheral device 260. At this time, transfer processing on the transfer route TR2 shown in FIG. 10 is off, as shown by state B4.

Also, in this embodiment, the switch timing for switching on/off the connection between the buses BS1 and BS2 (period T1/T2 switch timing) is set to a timing in the range indicated by period B5 in FIG. 12. Specifically, the connection between the buses BS1 and BS2 is switched from on to off (switch from period T1 to T2) at least after the device chirp K start timing (t4). Alternatively, the connection between the buses BS1 and BS2 is switched from on to off at least after the host chirp K/J end timing (t8). For example, at a timing that is at least after the device chirp K start timing (t4) for example and also before the SOF transmission start timing (t9) for example, the connection between the buses BS1 and BS2 is switched from on to off, and transfer processing on the transfer route TR2 in FIG. 10 is switched from off to on. In other words, at a timing in the range shown by period B5, as shown by state B6, the USB switch that connects the bus BS1 and the bus BS2 is switched from on to off, and transfer processing on the transfer route TR2 is switched from off to on. Note that if the BC switch has been set to disabled, the switching on/off of the BC switch shown by the states B2 and B3 is not performed, and the BC switch remains off as shown by state B7.

In this way, in this embodiment, in the period T1 (B3), the USB switch is switched on, and the connection between the buses BS1 and BS2 is switched on. Signal transfer on the transfer route TR1 shown in FIG. 9 is performed between the main controller 200 and the peripheral device 260 for example. On the other hand, in the period T2 (B6), the USB switch is switched off, the connection between the buses BS1 and BS2 is switched off, and transfer processing performed by the processing circuit 20 is switched on, and therefore packet transfer is performed on the transfer route TR2 shown in FIG. 10. Note that the switch timing is a timing in the range of period B5, and therefore in FIG. 12, the ranges of the USB switch on/off switch timing and the transfer processing on/off switch timing are indicated by dashed lines.

Also, in this embodiment, at least after the device chirp K start timing (t4), the bus switch circuit 40 switches the connection between the buses BS1 and BS2 from on to off, and the processing circuit 20 starts transfer processing on the transfer route TR2 in FIG. 10. For example, after the device chirp K start timing, the USB switch is switched from on (B3) to off (B6), and the transfer processing performed by the processing circuit 20 is switched from off (B4) to on (B6).

Specifically, if the start of device chirp K (t4) is detected, it can be determined that the device side is compatible with the HS mode. However, it is very rare that the host side is not compatible with the HS mode. For this reason, if the start of device chirp K (t4) is detected, it is possible to switch the USB switch from on to off, and switch HS mode transfer processing performed by the processing circuit 20 from off (disabled) to on (enabled). Accordingly, it is sufficient that the switch timing in the period B5 is a timing that is at least after the device chirp K start timing (t4).

Alternatively, in consideration also of the possibility that the host side is not compatible with the HS mode, a configuration is possible in which if the start of host chirp K/J (t6) is detected, the USB switch is switched from on to off, and HS mode transfer processing performed by the processing circuit 20 is switched from off to on.

For example, in this embodiment, a configuration is possible in which at least after the host chirp K/J end timing (t8), the bus switch circuit 40 switches the connection between the buses BS1 and BS2 from on to off, and the processing circuit 20 starts transfer processing on the transfer route TR2 in FIG. 10.

According to this configuration, if, for example, it is determined that the host side and the device side are both compatible with the HS mode, and it is determined that the switch to the HS mode is complete, then it is possible to thereafter appropriately start transfer processing performed by the processing circuit 20.

In this way, it is sufficient that the switch timing in the period B5 in FIG. 12 is at least after the device chirp K start timing. It should be noted that the negative influence of a glitch from switching also needs to be taken into consideration. Accordingly, it is desirable that the switch timing is in a period in which the signals DP and DM have been set to a predetermined voltage level (e.g., the L level). Examples include the period from timings t5 to t6 and the period from t8 to t9 in FIG. 12.

As described above, in this embodiment, before the switch timing of the period B5 in FIG. 12, the bus monitor circuit has not determined that HS mode transfer is possible (e.g., a first monitor result) and the USB switch is switched on as shown by the state B3, and therefore signals can be exchanged on the USB bus between the host side and the device side. The bus monitor circuit 30 monitors the exchange of signals on the USB bus. If device chirp K or host chirp K/J is detected for example, it is determined that HS mode transfer is possible (e.g., a second monitor result), and thus the USB switch is switched from on to off, and transfer processing performed by the processing circuit 20 is switched from off to on. Accordingly, it is possible to appropriately shift to HS mode transfer processing after the exchange of signals between the host side and the device side.

Also, in the charging arbitration period (shown by the period B1 in FIG. 12) of the charging circuit 221 in FIG. 11, the BC switch is switched on, and the USB switch is switched off, as shown by the state B2. Accordingly, it is possible to realize appropriate charging arbitration processing between the charging circuit 221 in FIG. 11 and the peripheral device 260, for example.

Figure 13:
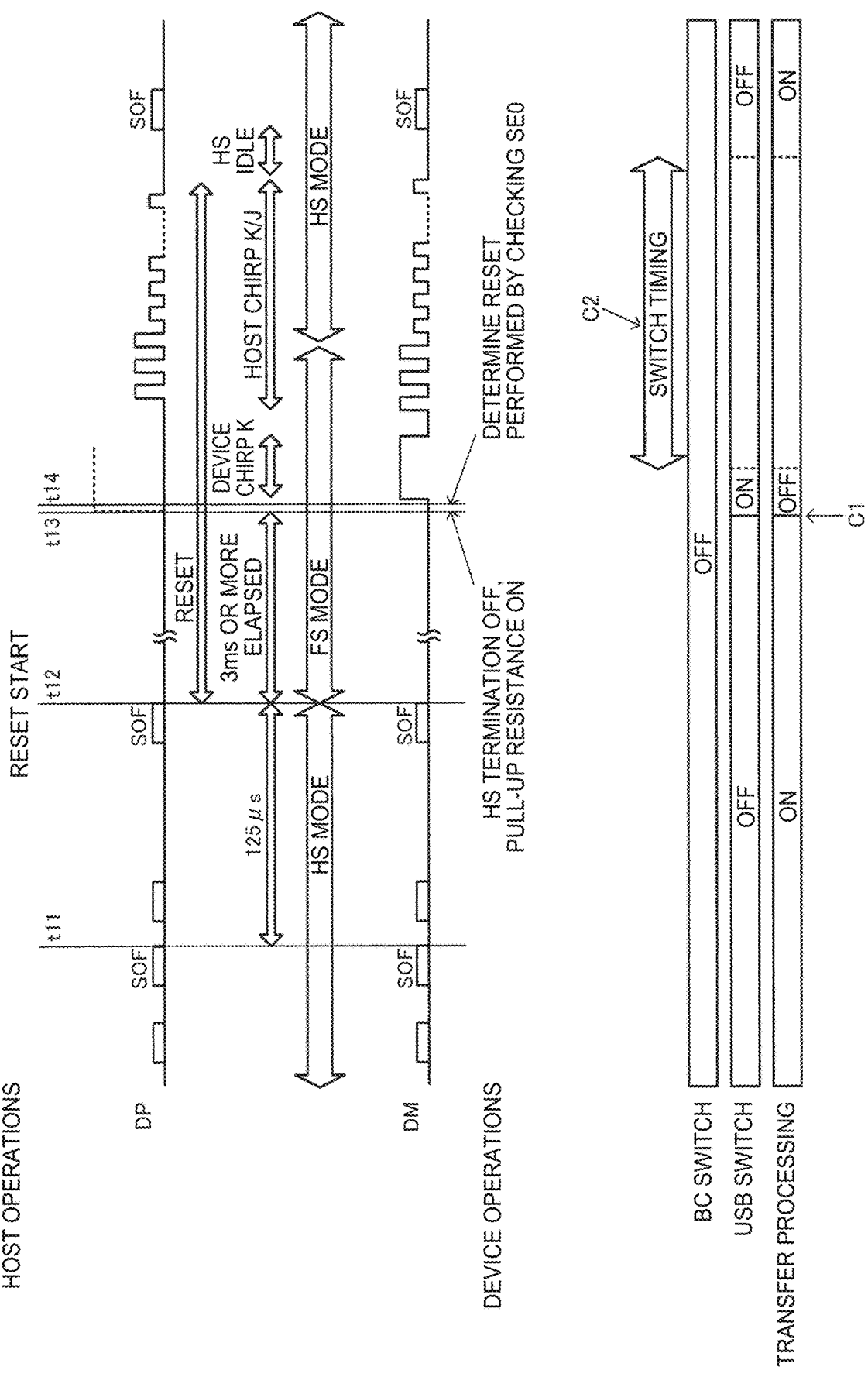
FIG. 13 is a signal waveform diagram illustrating detailed operations of the circuit device.

FIG. 13 is a signal waveform diagram showing an operation sequence after a reset is performed in HS mode transfer. In the HS mode, the host side transmits an SOF packet every 125 μs (t11, t12). If the host side starts a reset (t12), a shift to the FS mode is performed, and if a state where no packet is on the bus has continued for 3 ms or more, the device side switches off HS termination, and switches on the pull-up resistance (t13). On the device side, it is confirmed that the bus state is SE0 (t14), and therefore it is determined that a reset was started, and a device chirp K is transmitted. In response to this, the host side transmits a host chirp K/J, and a shift from the FS mode to the HS mode is performed.

As shown by C1 in FIG. 13, in this embodiment, if the host starts a reset, the USB switch is switched from off to on, and transfer processing performed by the processing circuit 20 is switched from on to off. In other words, if a reset is performed by the host, the bus switch circuit 40 switches the connection between the buses BS1 and BS2 from off to on, and the processing circuit 20 stops performing transfer processing.

According to this configuration, if a reset is performed during HS mode transfer for example, the buses BS1 and BS2 become electrically connected, and signal transfer can be performed using the signals DP and DM between the main controller 200 and the peripheral device 260 for example. Thereafter, at a switch timing in the range indicated by a period C2 in FIG. 13 for example, the USB switch is switched from on to off, and transfer processing performed by the processing circuit 20 is switched from off to on. Accordingly, it is possible to appropriately shift to HS mode transfer processing after the exchange of signals between the host side and the device side.

Figure 14:
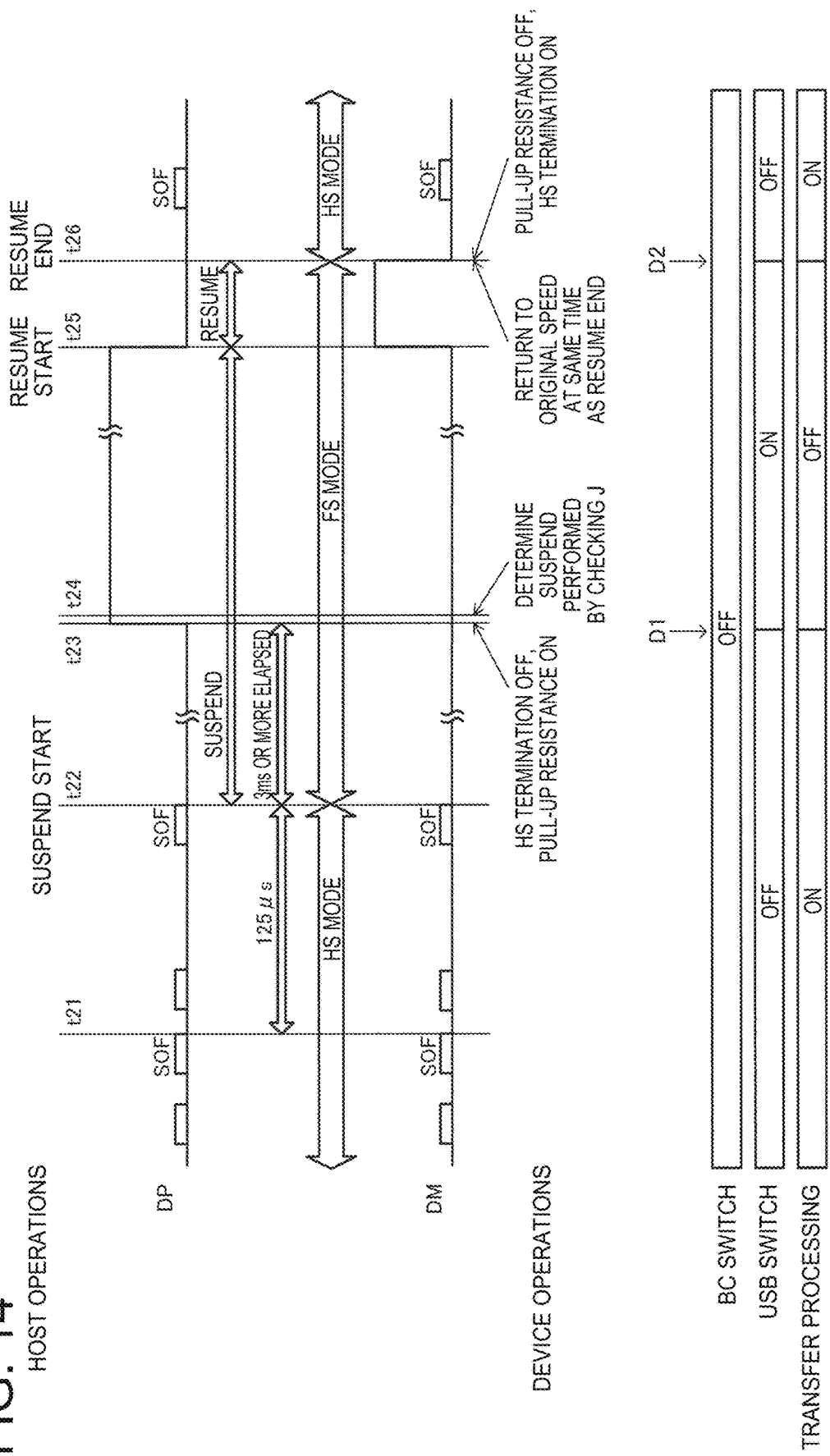
FIG. 14 is a signal waveform diagram illustrating detailed operations of the circuit device.

FIG. 14 is a signal waveform diagram showing an operation sequence in the case of a shift from HS mode transfer to suspend and a shift to resume. If the host side starts a suspend (t22), a shift to the FS mode is performed, and if a state where no packet is on the bus has continued for 3 ms or more, the device side switches off HS termination, and switches on the pull-up resistance (t23). Then, on the device side, it is confirmed that the state of the bus is J (t24), and therefore it is determined that a suspend has started. Then the host side starts a resume (t25), and when the resume ends (t26), at the same time as the end of the resume, the device side returns to the mode that was realized prior to the suspend. Then the pull-up resistance is switched off, the HS termination is switched on, and the mode returns to the HS mode.

As shown by D1 in FIG. 14, in this embodiment, even if the host starts a suspend, the USB switch is switched from off to on, and transfer processing performed by the processing circuit 20 is switched from on to off. In other words, if a suspend is performed by the host, the bus switch circuit 40 switches the connection between the buses BS1 and BS2 from off to on, and the processing circuit 20 stops performing transfer processing.

According to this configuration, if a suspend is performed during HS mode transfer for example, the buses BS1 and BS2 become electrically connected, and signal transfer can be performed using the signals DP and DM between the main controller 200 and the peripheral device 260 for example.

Then, after the suspend, the host side performs a resume, and therefore, as shown by state D2 in FIG. 14, the USB switch is switched from on to off, and the transfer processing performed by the processing circuit 20 is switched from off to on. In other words, in this embodiment, after a suspend is performed by the host, if a resume is performed (at the resume end timing), the bus switch circuit 40 switches the connection between the buses BS1 and BS2 from on to off, and the processing circuit 20 starts performing transfer processing. Accordingly, by performing a resume after a suspend, HS mode data transfer can be appropriately resumed. Note that the operation sequence of a shift from suspend to reset is similar to the operation sequence of a shift from suspend to reset after a shift from cable attachment to FS idle.

5. Details of Operations in First Configuration Example

Figure 15:
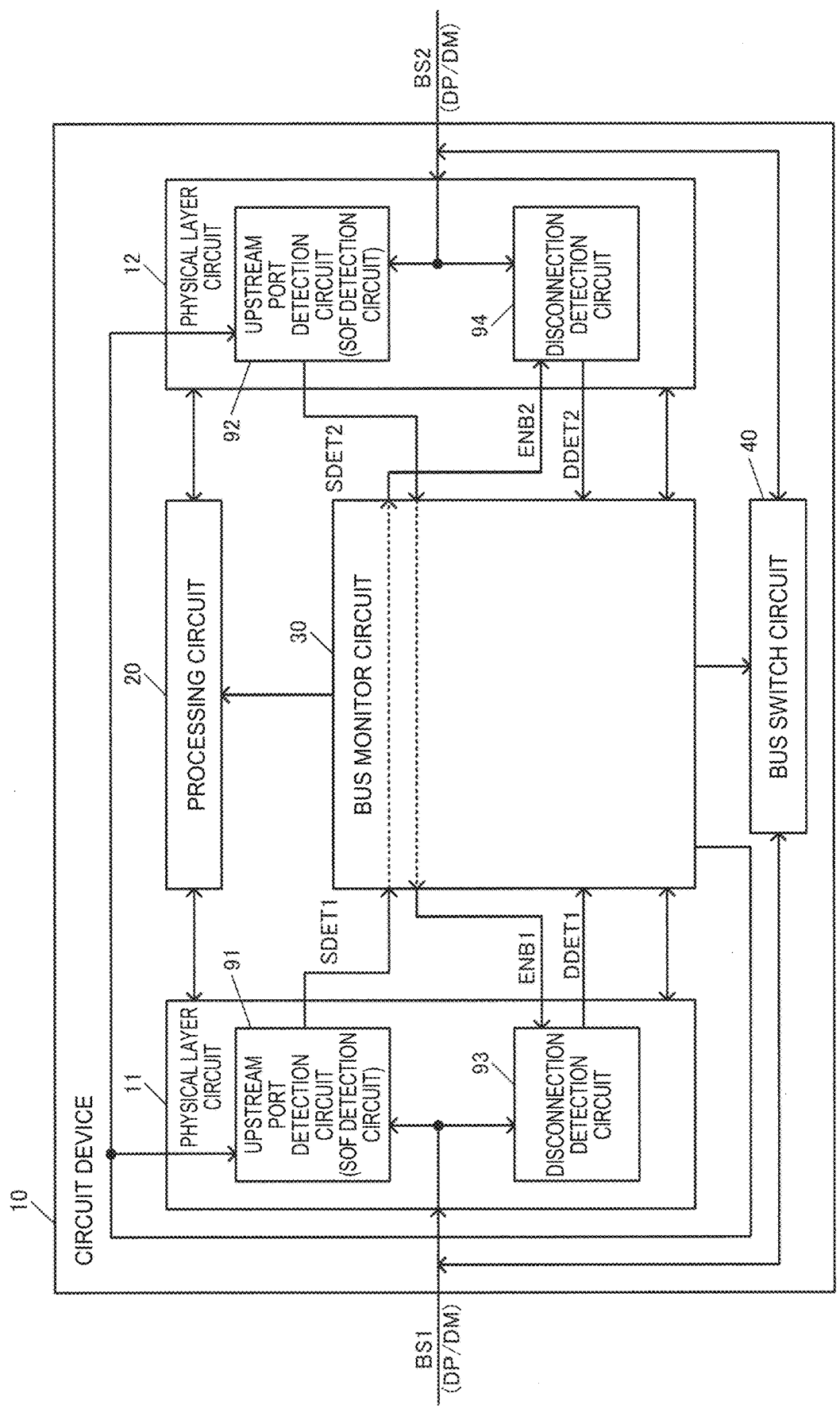
FIG. 15 is an illustrative diagram of a detailed example of the first configuration example of the circuit device.

Next, details of operations in the first configuration example in FIGS. 3 and 4 will be described with reference to FIGS. 15, 16, and the like. In this embodiment, at a timing in the range of B5 in FIG. 12, a switch is performed from the transfer route TR1 (FIG. 9) that passes through the bus switch circuit 40 to the transfer route TR2 (FIG. 10) that passes through the processing circuit 20, and HS mode communication is performed. Also, at the timing indicated by C1 in FIG. 13, a switch is performed from the transfer route TR2 that passes through the processing circuit 20 to the transfer route TR1 that passes through the bus switch circuit 40. If the host and the device are connected to the buses BS1 and BS2, operations can be performed without a problem when the transfer route is switched at this timing, but a problem occurs if the device is detached and a disconnected state arises.

For example, if the device is disconnected during the execution of a device chirp (t4 to t5) in FIG. 12, the length of the device chirp will not meet the desired time (1 ms), and therefore the host can detect the disconnection of the device. Also, if the device is disconnected during the execution of a host chirp (t6 to t8), the signal level of the host chirp will not reach a desired signal level (400 mV), and therefore the host can detect the disconnection of the device. However, if the device is disconnected after the end of a chirp (after t8), the host cannot detect the disconnection of the device. This is because after the end of the chirp, an HS connection is established between the host and the processing circuit 20, and therefore a change in waveform does not appear on the bus BS1 side due to the device disconnection on the bus BS2, and thus the host cannot detect the disconnection of the device.

Also, after a SE0 state continuing for 3 ms or more has been detected (after t13), the SE0 state is detected again, and if a device chirp is not detected, the host can detect the disconnection of the device.

In this way, after a switch to the transfer route TR2 that passes through the processing circuit 20, when HS mode communication is to be performed, an HS connection is established between the host and the processing circuit 20, and a change does not appear in the HS packet waveform, and therefore even if the device is disconnected, the host cannot detect the disconnection. A technique is conceivable in which the host issues some sort of command to the device, and it is deemed that the device is disconnected if there is no response from the device, but with this technique, a command for disconnection detection needs to be issued periodically, and software control in the host becomes complicated.

In view of this, in this embodiment, a configuration is realized in which if the device is disconnected during HS mode communication, the host can detect that disconnection of the device. Specifically, as shown in FIG. 15, the physical layer circuit 11 connected to the bus BS1 is provided with an upstream port detection circuit 91 and a disconnection detection circuit 93. Also, the physical layer circuit 12 connected to the bus BS2 is provided with an upstream port detection circuit 92 and a disconnection detection circuit 94. The upstream port detection circuits 91 and 92 enter the operation enabled state (enabled) upon receiving an HS mode signal (switch-to-HS-mode signal) that is output from the bus monitor circuit 30. In other words, the operation enabled state is entered when a switch from the FS mode to the HS mode is performed. Also, the upstream port detection circuits 91 and 92 successively analyze the PID of HS packets received from the buses BS1 and BS2, and either one of the upstream port detection circuits 91 and 92 detects an SOF (SOF packet) transmitted by the host. Also, the upstream port detection circuits 91 and 92 notify SOF detection results to the bus monitor circuit 30 with use of SOF detection signals SDET1 and SDET2. Accordingly, the bus monitor circuit 30 recognizes whether the bus that is on the upstream side and connected to the host is the bus BS1 or BS2.

The bus monitor circuit 30 outputs the SOF detection signals SDET1 and SDET2 as operation enable signals ENB1 and ENB2 (enabling signals) that are clock-synchronized. The operation enable signals ENB1 and ENB2 are input to the disconnection detection circuits 93 and 94. In this case, the disconnection detection circuit that is on the downstream side and did not detect an SOF (i.e., the disconnection detection circuit on the side on which the host is not connected) enters the operation enabled state.

Upon entering the operation enabled state, the disconnection detection circuits 93 and 94 respectively examine the EOP signal amplitude of the repeat waveform of the SOF output to the buses BS1 and BS2 via the processing circuit 20. If the EOP signal amplitude exceeds 625 mV, it is determined that the device was disconnected, and this is notified to the bus monitor circuit 30 with use of disconnection detection signals DDET1 and DDET2. Note that the signal amplitude threshold value that is used when making the disconnection detection determination can be set in the range of 525 mV to 625 mV. In the case of receiving a notification of device disconnection by the disconnection detection signal DDET1 or DDET2, the bus monitor circuit 30 switches the operation mode from the HS mode to the FS mode, and switches the transfer route from the transfer route TR2 that passes through the processing circuit 20 to the transfer route TR1 that passes through the bus switch circuit 40.

Figure 16:
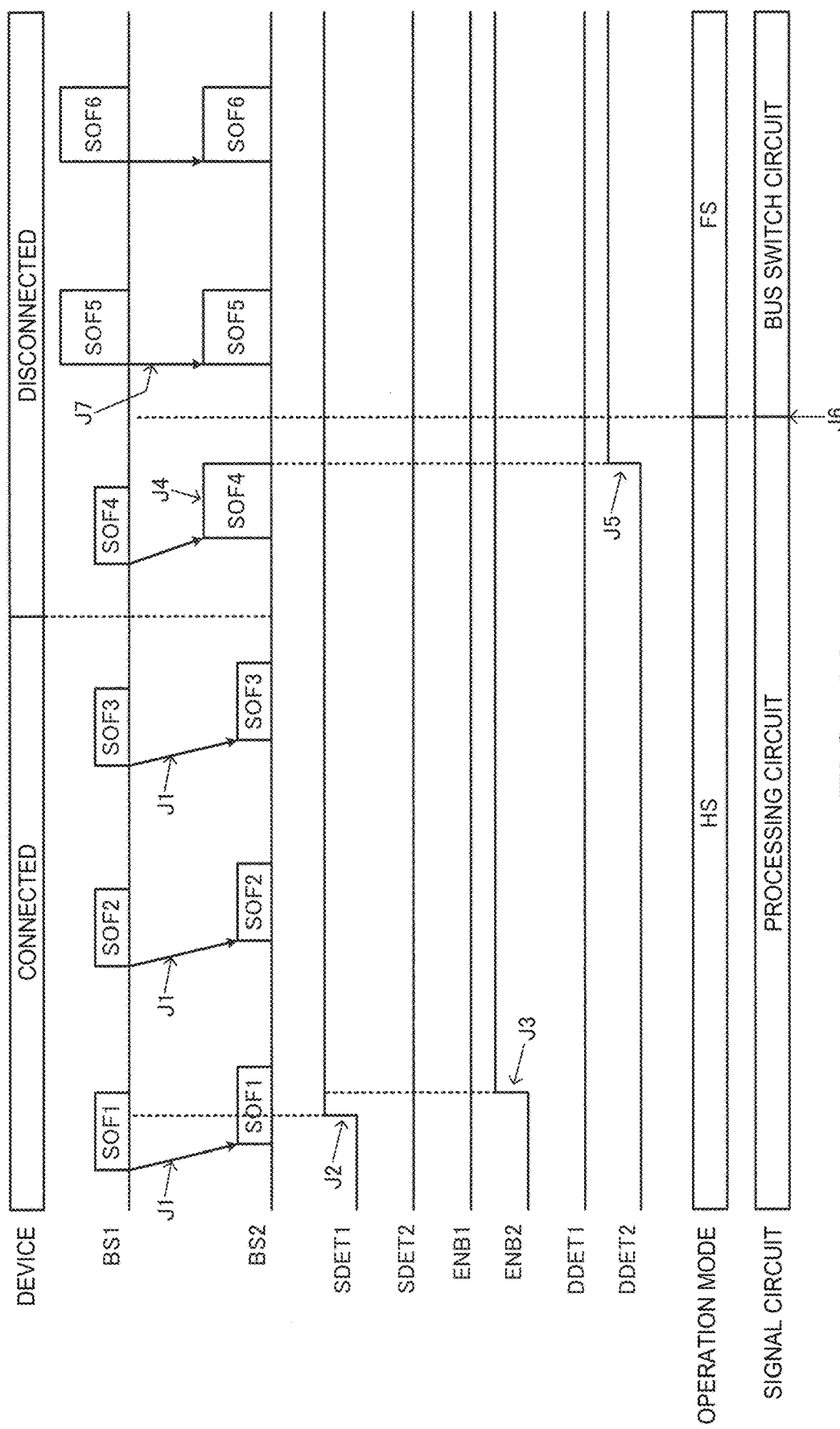
FIG. 16 is a signal waveform diagram illustrating operations of the detailed example of the first configuration example of the circuit device.

FIG. 16 shows an example of a signal waveform diagram for illustrating details of operations in the first configuration example. Here, it is assumed that the host is connected to the bus BS1, the device is connected to the bus BS2, and HS mode communication is being performed. Note that a connection configuration is also possible in which the host is connected to the bus BS2, and the device is connected to the bus BS1, as previously described.

In the HS mode, an SOF packet that indicates the head of a frame is transmitted from the host every 125 μs. Unlike other token packets, this SOF packet is used by the host to indicate the frame number, and the device does not need to respond to this. Also, unlike other packets, the EOP of the SOF packet has a length of 40 bits.

As shown by J1 in FIG. 16, an HS packet transmitted by the host is input to the bus BS1, and is repeated and output to the bus BS2 via the processing circuit 20. In response to this HS packet from the host, the device transmits an HS packet, and this HS packet is input to the bus BS2 and then repeated and output to the bus BS1 via the processing circuit 20. During HS operation, the upstream port detection circuits 91 and 92 enter the operation enabled state upon receiving an HS mode signal from the bus monitor circuit 30, and the upstream port detection circuits 91 and 92 successively analyze the PID of HS packets from the buses BS1 and BS2 respectively. In FIG. 16, upstream port detection circuit 91 receives SOF1 transmitted from the host, and therefore outputs the SOF detection signal SDET1 at the H level as shown by J2. On the other hand, the upstream port detection circuit 92 has not detected an SOF, and therefore outputs the detection signal SDET2 at the L level.

Based on the fact that the input detection SDET1 is at the H level, and the detection signal SDET2 is at the L level, the bus monitor circuit 30 recognizes that the bus that is on the upstream side and is connected to the host is the bus BS1. The detection signals SDET1 and SDET2 are then subjected to clock synchronization, and the operation enable signals ENB1 and ENB2 are output at the L level and the H level respectively, as shown by J3. The operation enable signals ENB1 and ENB2 respectively at the L level and the H level are input to the disconnection detection circuits 93 and 94 respectively. Accordingly, the disconnection detection circuit 94 on the downstream side enters the operation enabled state, and the disconnection detection circuit 93 on the upstream side enters the operation disabled state. The disconnection detection circuit 94 that entered the operation enabled state continues to detect the EOP signal amplitude of the SOFs that are repeated and output to the bus BS2, but in the period in which SOF1 to SOF3 are transferred in FIG. 16, the device is connected, and therefore the disconnection detection signal DDET2 is output at the L level. Then, as shown by J4, from the SOF4 transfer period that follows the disconnection of the device, HS termination from the device is lost, and the EOP signal amplitude level increases and exceeds 625 mV, and therefore the disconnection detection signal DDET2 is output at the H level as shown by J5.

Based on the fact that the input disconnection detection signals DDET1 and DDET2 are respectively at the L level and the H level, the bus monitor circuit 30 recognizes that the device was disconnected from the bus BS2 on the downstream side. Then, as shown by J6, the operation mode is switched from the HS mode to the FS mode, and the transfer route is switched from the transfer route TR2 that passes through the processing circuit 20 to the transfer route TR1 that passes through the bus switch circuit 40. For this reason, from the SOF5 transfer period onward, HS packets are transmitted from the bus BS1 to the bus BS2 via the bus switch circuit 40, as shown by J7. Accordingly, from SOF5 onward, a waveform in which the EOP signal amplitude level rises is directly transmitted to the USB bus (DP/DM) on the host side. Accordingly, using the disconnection detection circuit provided therein, the host detects the EOP signal amplitude level from the SOF5 transfer period onward, and thus can recognize that the device was disconnected.

As described above, according to this embodiment, if the device is disconnected during HS mode communication, the HS termination from the device is lost, the SOF waveform with an increased signal amplitude can be directly detected by the host, and the host can easily determine that the device was disconnected.

6. Details of Operations in Second Configuration Example

Next, details of operations in the second configuration example in FIGS. 5 and 6 will be described with reference to FIGS. 17, 18, and the like. In the circuit device 10 of this embodiment, the transfer route in the HS mode is the transfer route TR2 that passes through the processing circuit 20. In this circuit device 10, operations are performed in which an HS packet that is input from either one of the bus BS1 and the bus BS2 is first received inside the processing circuit 20, and then the received data is synchronized therein and output to the other one of the bus BS1 and the bus BS2. Accordingly, jitter contained in a degraded signal is removed, and the waveform is improved, and it is possible to provide an HS waveform with superior characteristics.

Also, during normal usage in which ordinary HS packets are exchanged between the host and the device, operations can be performed with no problem by transfer on the transfer route TR2 that passes through this processing circuit 20. However, in the USB standard (USB 2.0), test modes for USB authentication test in the HS mode are provided, and it was found that a test mode that cannot be handled is included among these test modes.

For example, the Test_Packet test mode can be handled. This test mode is used in EYE pattern measurement in order to make an HS transmission waveform quality determination. In a system configuration that incorporates the circuit device 10, it is conceivable that a test packet received from the host is repeated and output, and that waveform observation is performed on the downstream side. In the circuit device 10 of this embodiment, similarly to a normal HS packet, a test packet can be received, synchronized, and output to the downstream side, and thus can be handled with no problem.

The Test_SE0_NAK test mode can also be handled. This test mode is used in DC level measurement of the SE0 state during HS operation. In a system configuration that incorporates the circuit device 10, it is conceivable that an SE0 received from the host is repeated and output, and that DC level measurement is performed on the downstream side. In the circuit device 10 of this embodiment, the SE0 state (DP=0 mV, DM=0 mV) is a state in which there is no bus activity, and therefore the transfer route TR1 that passes through the bus switch circuit 40 is selected instead of the transfer route TR2 that passes through the processing circuit 20. Accordingly, the SE0 on the host side is sent to the downstream side as-is, and thus can be handled with no problem.

The Test_J test mode cannot be handled. This test mode is used in DC level measurement of the Test_J state during HS operation. In a system configuration that incorporates the circuit device 10, it is conceivable that a Test_J received from the host is repeated and output, and that DC level measurement is performed on the downstream side. In the circuit device 10 of this embodiment, the Test_J state (DP=400 mV, DM=0 mV) is a state in which there is bus activity, and therefore the transfer route TR2 that passes through the processing circuit 20 is selected. However, the packets that can be exchanged via the processing circuit 20 are HS packets, and Test_J, which is a DC signal, cannot be exchanged on this route, and therefore cannot be handled.

The Test_K test mode also cannot be handled. This test mode is used in DC level measurement of the Test_K state during HS operation. In a system configuration that incorporates the circuit device 10, it is conceivable that a Test_K received from the host is repeated and output, and that DC level measurement is performed on the downstream side. In the circuit device 10 of this embodiment, the Test_K state (DP=0 mV, DM=400 mV) is a state in which there is bus activity, and therefore the transfer route TR2 that passes through the processing circuit 20 is selected. However, the packets that can be exchanged via the processing circuit 20 are HS packets, and Test_K, which is a DC signal, cannot be exchanged on this route, and therefore cannot be handled.

In this way, even if Test_J or Test_K, which are DC signals, are received, they cannot pass between the upstream and downstream sides, and therefore a system device that incorporates the circuit device 10 has the problem of not being able to satisfy a USB authentication test item. In view of this, in this embodiment, in the case where a Test_J or a Test_K, which are DC signals, is received from the host during HS mode communication, it can be detected and output to the device.

Figure 17:
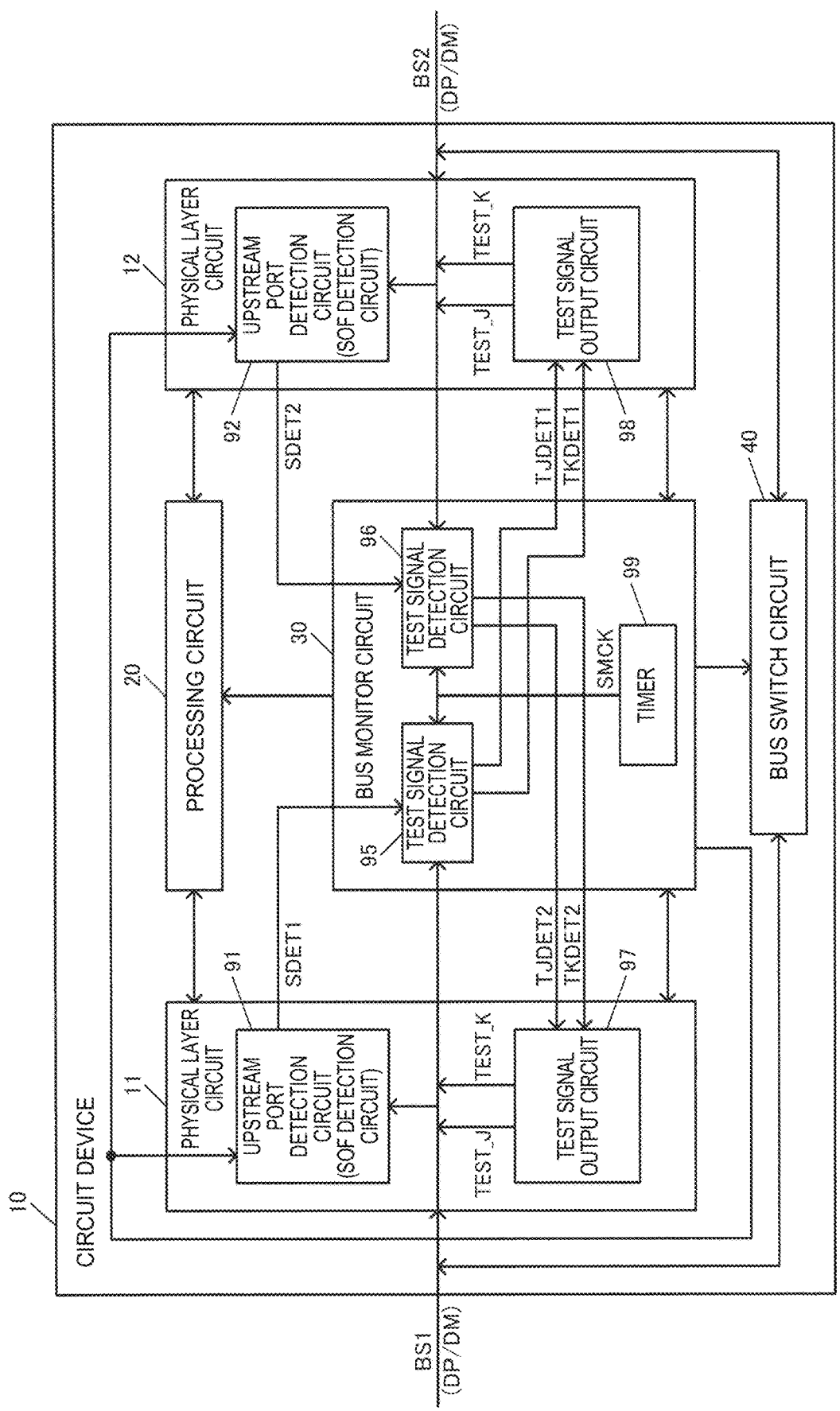
FIG. 17 is an illustrative diagram of a detailed example of the second configuration example of the circuit device.

Specifically, as shown in FIG. 17, the physical layer circuit 11 connected to the bus BS1 is provided with the upstream port detection circuit 91 and the test signal output circuit 97. Also, the physical layer circuit 12 connected to the bus BS2 is provided with the upstream port detection circuit 92 and the test signal output circuit 98. Furthermore, the test signal detection circuits 95 and 96 and a timer 99 are provided in the bus monitor circuit 30. The upstream port detection circuits 91 and 92 become enabled upon receiving an HS mode signal that is output from the bus monitor circuit 30. Also, the upstream port detection circuits 91 and 92 successively analyze the PID of HS packets received from the buses BS1 and BS2, and either one of the upstream port detection circuits detects an SOF transmitted by the host. The upstream port detection circuits 91 and 92 notify SOF detection results to the bus monitor circuit 30 with use of SOF detection signals SDET1 and SDET2. Accordingly, the bus monitor circuit 30 recognizes whether the bus that is on the upstream side and connected to the host is the bus BS1 or BS2.

The detection signals SDET1 and SDET2 are input to the test signal detection circuits 95 and 96 of the bus monitor circuit 30. Then, whichever one of the test signal detect circuits 95 and 96 is the test signal detection circuit on the upstream side that is connected to the host enters the operation enabled state. In this description, it is assumed that the test signal detection circuit 95 is the test signal detection circuit on the upstream side. Upon entering the operation enabled state, the test signal detection circuit 95 continuously detects HS signals received from the bus BS1 with use of a sampling clock obtained from the timer 99. Then, upon detecting Test_J or Test_K, the test signal detection circuit 95 outputs a Test_J detection signal TJDET1 or a Test_K detection signal TKDET1 to the test signal output circuit 98 on the downstream side. Upon receiving the Test_J detection signal TJDET1 or the Test_K detection signal TKDET1, the test signal output circuit 98 outputs the Test_J or the Test_K to the bus BS2.

Figure 18:
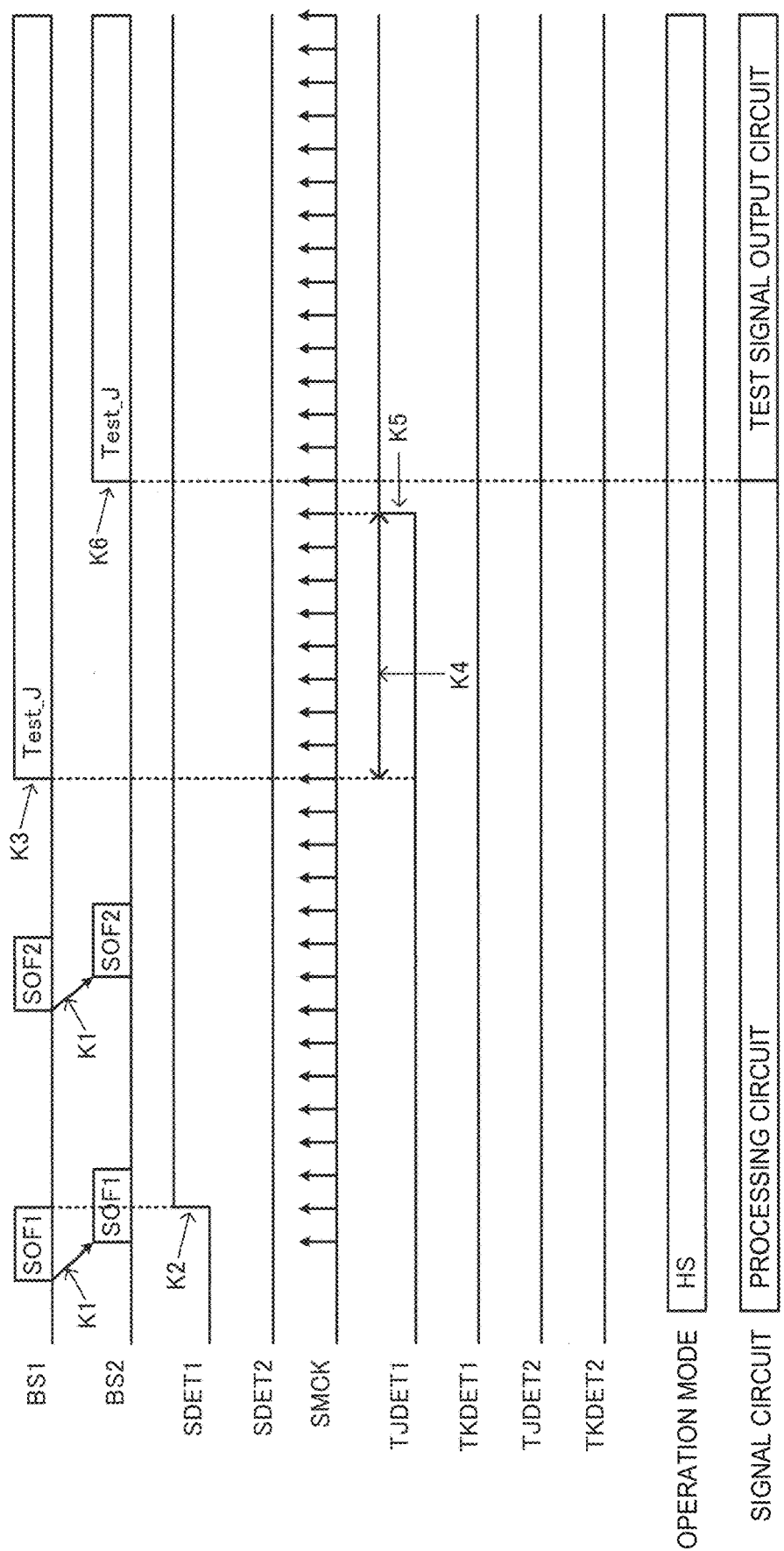
FIG. 18 is a signal waveform diagram illustrating operations of the detailed example of the second configuration example of the circuit device.

FIG. 18 shows an example of a signal waveform diagram for illustrating details of operations in the second configuration example. Here, it is assumed that the host is connected to the bus BS1, the device is connected to the bus BS2, and HS mode communication is being performed.

In the HS mode, an SOF packet that indicates the head of a frame is transmitted from the host every 125 μs. As shown by K1 in FIG. 18, an HS packet transmitted by the host is input to the bus BS1, and is repeated and output to the bus BS2 via the processing circuit 20. In response to this HS packet from the host, the device transmits an HS packet, and this HS packet is input to the bus BS2 and then repeated and output to the bus BS1 via the processing circuit 20. During HS operation, the upstream port detection circuits 91 and 92 enter the operation enabled state upon receiving an HS mode signal from the bus monitor circuit 30, and the upstream port detection circuits 91 and 92 successively analyze the PID of HS packets from the buses BS1 and BS2 respectively. In FIG. 18, the upstream port detection circuit 91 receives SOF1 transmitted from the host, and therefore, as shown by K2, the upstream port detection circuit 91 outputs the detection SDET1 at the H level, and the upstream port detection circuit 92 outputs the detection signal SDET2 at the L level.

Based on the fact that the input detection SDET1 is at the H level, and the detection signal SDET2 is at the L level, the bus monitor circuit 30 recognizes that the bus that is on the upstream side and is connected to the host is the bus BS1. Also, the detection signals SDET1 and SDET2 are input to the test signal detection circuits 95 and 96, and the test signal detection circuit 95 on the upstream side is set to the operation enabled state, and the test signal detection circuit 96 on the downstream side is set to the operation disabled state. The test signal detection circuit 95 that was set to the operation enabled state then continuously samples the upstream port HS signals from the bus BS1 with use of a sampling clock SMCK obtained from the timer 99. Specifically, if HS_J or HS_K is continuously sampled for a period that exceeds 1 frame (125 μs), it is determined that Test_J or Test_K was detected. In the example in FIG. 18, as shown by K3, Test_J is transmitted from the host after SOF2. The test signal detection circuit 95 continuously samples the received Test_J with use of the sampling clock SMCK, and if Test_J is continuously sampled for longer than 1 frame as shown by K4, the Test_J detection signal TJDET1 is output at the H level as shown by K5. Also, when the host starts to transmit Test_J, normal HS packets are stopped, and therefore HS packets are no longer repeated and output via the processing circuit 20. In this state, the test signal output circuit 98 on the downstream side receives the Test_J detection signal TJDET1 at the H level, and as shown by K6, the test signal output circuit 98 outputs Test_J to the bus BS2.

In this way, according to this embodiment, even if the host transmits a DC Test_J or Test_K signal during HS mode communication, it is possible to detect and output it to the downstream side, and therefore a system device that incorporates the circuit device 10 can be compliant with the USB authentication test.

7. Third Configuration Example

Figure 19:
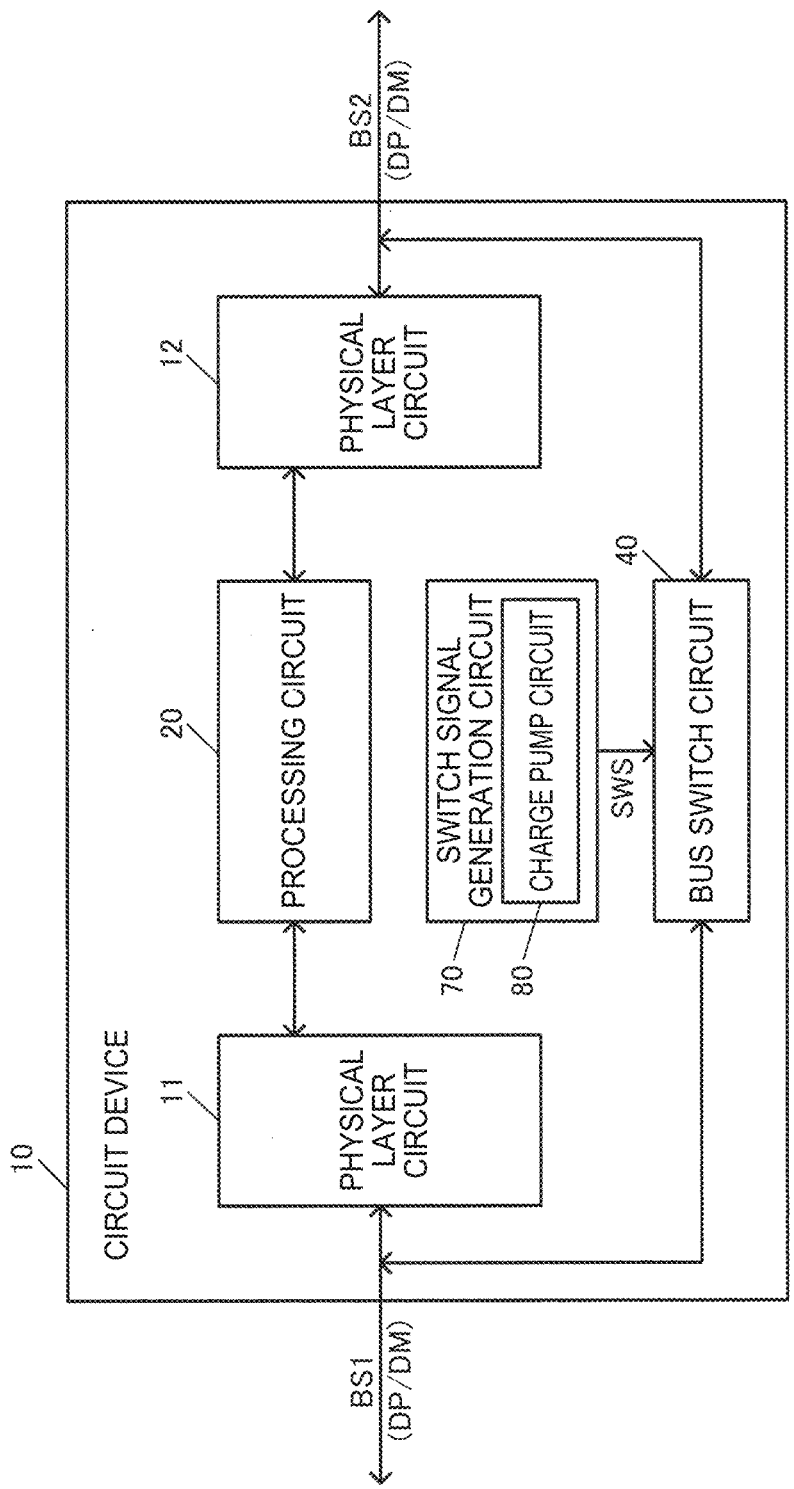
FIG. 19 shows a third configuration example of a circuit device according to the embodiment of the invention.

FIG. 19 shows a third configuration example of the circuit device 10 of this embodiment. The circuit device 10 of the third configuration example includes the physical layer circuits 11 and 12, the processing circuit 20, the bus switch circuit 40, and a switch signal generation circuit 70. The switch signal generation circuit 70 includes a charge pump circuit 80. Note that detailed descriptions will not be given for the circuit portions that were described with reference to FIGS. 3 to 8. Also, combinations of at least two configuration examples among the first, second, and third configuration examples are also encompassed in the range of this embodiment.

The circuit device 10 in FIG. 19 includes the switch signal generation circuit 70, and the switch signal generation circuit 70 generates a switch signal SWS for controlling switching on and off of the connection between the bus BS1 and the bus BS2, and supplies the switch signal SWS to the bus switch circuit 40. In accordance with the switch signal SWS, the switch element of the bus switch circuit 40 is switched on in the period T1 in FIG. 9, and is switched off in the period T2 in FIG. 10. Note that in the case where the bus switch circuit 40 has multiple switch elements, the switch signal generation circuit 70 supplies multiple switch signals SWS for switching on and off the switch elements.

Also, the switch signal generation circuit 70 also has the charge pump circuit 80 that performs a charge pump operation based on a clock signal. The charge pump operation is a circuit operation for shifting a charge, and obtains an output voltage by superimposing an input voltage and a voltage stored in a capacitor. The switch signal generation circuit 70 generates the switch signal SWS based on a boosted power supply voltage that was boosted by the charge pump circuit 80. For example, the charge pump circuit 80 uses the charge pump operation to generate a boosted power supply voltage that has a higher voltage than the normal power supply voltage. For example, letting Vth be the threshold voltage of a transistor that constitutes the switch element of the bus switch circuit 40, and VD be the power supply voltage, the charge pump circuit 80 generates a boosted power supply voltage VH for which VH>VD+ Vth. The switch signal generation circuit 70 generates the switch signal SWS based on this boosted power supply voltage. The charge pump circuit 80 supplies the boosted power supply voltage as the power supply voltage for circuits in the switch signal generation circuit 70 (e.g., a buffer circuit or level shifter), and these circuits operate based on the boosted power supply voltage.

In this way, in this embodiment, the bus switch circuit 40 that electrically connects or disconnects the buses BS1 and BS2 is provided. The switch signal generation circuit 70 generates the switch signal SWS based on a boosted power supply voltage that was boosted by the charge pump circuit 80, and supplies the boosted power supply voltage to the bus switch circuit 40. By using this switch signal SWS that is based on a boosted power supply voltage, it is possible to appropriately switch on or off the switch element of the bus switch circuit 40, and signals can be appropriately exchanged on the transfer route TR1 in the period T1 in FIG. 9, for example. Specifically, by supplying the switch signal SWS that is based on the boosted power supply voltage to the gate of a transistor that constitutes the switch element, it is possible to appropriately set the transistor to the on state. For example, assuming that the boosted power supply voltage is VH>VD+Vth as previously described, it is possible to prevent a restriction from being placed on the range of voltages that pass through the switch element. It is also possible to sufficiently reduce the on resistance of the transistor. Also, if the switch element is constituted by simply a first conductivity type (e.g., N-type) transistor for example, it is possible to reduce the parasitic capacitance that originates from the drain capacitance of the first conductivity type transistor or the like, and degradation in signal quality in the period T2 in FIG. 10 can be suppressed.

Also, in this embodiment, the charge pump circuit 80 performs the charge pump operation when the connection between the buses BS1 and BS2 is on, and performs charge pump operation when the connection between the buses BS1 and BS2 is off as well. Here, the charge pump operation is not limited to being a continuous operation, and may be an intermittent operation.

For example, in the period T1 in FIG. 9, the charge pump circuit 80 performs the charge pump operation, the switch signal SWS that is based on the boosted power supply voltage from the charge pump circuit 80 is supplied to the switch element of the bus switch circuit 40, and the connection between the buses BS1 and BS2 is switched on in accordance with the switch signal SWS. If the switch element is an N-type transistor, a high-level (active) switch signal SWS is supplied to the gate of the N-type transistor, and the N-type transistor is switched on. On the other hand, also in the case where the connection between the buses BS1 and BS2 is off as with the period T2 in FIG. 10, the charge pump circuit 80 performs the charge pump operation, and the switch signal SWS that is based on the boosted power supply voltage from the charge pump circuit 80 is supplied to the switch element of the bus switch circuit 40. If the switch element is an N-type transistor, a low-level (inactive) switch signal SWS is supplied to the gate of the N-type transistor.

In this way, according to a configuration in which the charge pump circuit 80 performs the charge pump operation in the period T2 as well, even if a switch from the period T2 to the period T1 is performed, a switch signal SWS having an appropriate voltage level can be supplied to the switch element of the bus switch circuit 40. Specifically, in a case where the charge pump operation is switched off in the period T2, if the charge pump operation is switched from off to on when a switch from the period T2 to the period T1 is performed, the boosted voltage obtained by the charge pump operation does not rise immediately, and therefore there is a risk that the switch element of the bus switch circuit 40 cannot be appropriately switched off. If the switch element is an N-type transistor, the N-type transistor cannot be appropriately switched on in the period T1 because time is required for the switch signal SWS to rise to the high-level boosted voltage.

In view of this, in this embodiment, the charge pump circuit 80 performs the charge pump operation even in the period T2 in which the connection between the buses BS1 and BS2 is off, and therefore when a switch from the period T2 to the period T1 is performed, the switch signal having the appropriate boosted power supply voltage level can be supplied to the switch element of the bus switch circuit 40.

Also, the charge pump circuit 80 performs the charge pump operation based on the clock signal CK having a frequency f1 (first frequency) in the period T1 in FIG. 9, and performs the charge pump operation based on the clock signal CK having a frequency f2 (second frequency) that is lower than the frequency f1 in the period T2 in FIG. 10.

For example, in the period T1, the charge pump circuit 80 performs the charge pump operation based on the clock signal CK having the high frequency f1, thus making it possible to supply the bus switch circuit 40 with the switch signal SWS that is based on a boosted power supply voltage that has been appropriately boosted. On the other hand, in the period T2, the charge pump circuit 80 performs the charge pump operation based on the clock signal CK having the low frequency f2, thus making it possible to reduce switch noise that originates from the charge pump operation, and making it possible to suppress the case where the charge pump circuit 80 becomes a noise source, and where the characteristics of communication in the period T2 (HS mode) degrade. For example, in the period T2, it is sufficient that that the switch element of the bus switch circuit 40 can be switched off, and therefore a certain reduce in the level of the boosted power supply voltage caused by the low frequency f2 is tolerable. For example, if the switch element is an N-type transistor, in the period T1, it is necessary to switch on the N-type transistor by supplying the N-type transistor with the switch signal SWS at the appropriately-boosted high level. In contrast, in the period T2, the voltage level of the switch signal SWS is at the low level, and therefore even if the voltage level of the boosted power supply voltage is reduced due to the low frequency f2, there is not much of a negative influence. Also, due to the frequency f2 being low, it is possible to reduce switch noise that originates from the charge pump operation, and it is possible to suppress degradation in communication characteristics in the period T2.

Also, after a given period has elapsed since the disappearance of bus activity, the switch signal generation circuit 70 changes the frequency of the clock signal CK (the clock frequency) from the frequency f2 to the frequency f1. In other words, the frequency is changed from the low frequency f2 to the high frequency f1. This given period is a period that is longer than or equal to 2 ms for example (e.g., a period that is longer than or equal to 2 ms and less than 3 ms). The disappearance of bus activity refers to a state in which packets are not being transmitted on the bus, for example. For example, in USB technology, if 3 ms elapses since the disappearance of bus activity, it is determined whether a reset request or a suspend request was made. For this reason, if a period of approximately 2 ms has elapsed for example, the frequency of the clock signal CK is returned from the frequency f2 to the frequency f1. In other words, the charge pump clock frequency is returned to the high frequency f1 such that an appropriate boosted power supply voltage is generated. Accordingly, in the period T1, it is possible to appropriately switch on the switch element of the bus switch circuit 40, and it is possible to suppress a situation in which a restriction is placed on the range of voltages that pass through the switch element.

Figure 20:
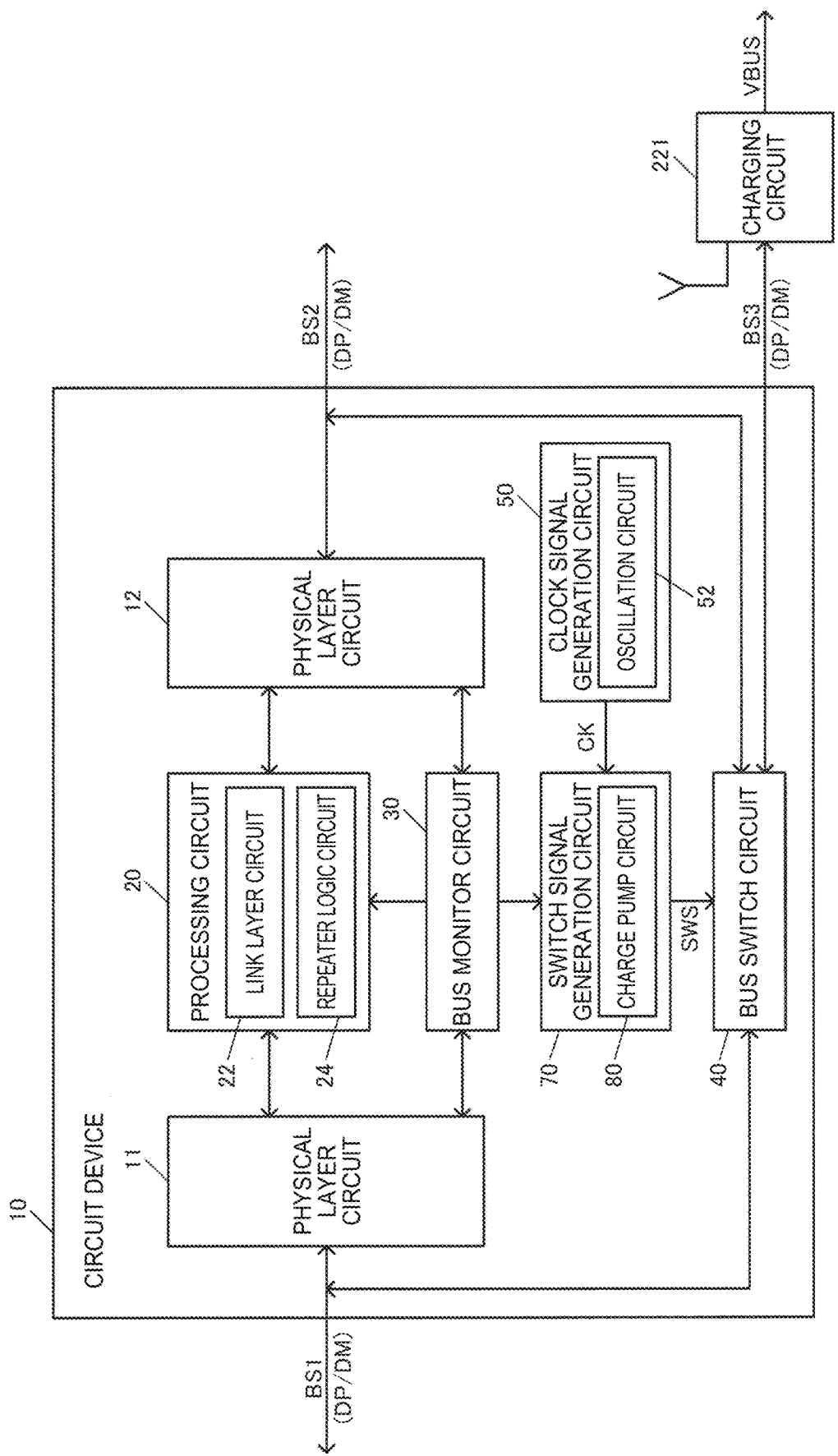
FIG. 20 shows a detailed example of the third configuration example of the circuit device.

FIG. 20 shows a detailed configuration example of the circuit device 10 of the third configuration example. In FIG. 20, the circuit device 10 further includes the bus monitor circuit 30 and a clock signal generation circuit 50. Also, the bus BS3 for the charging circuit 221 is further provided. The charging circuit 221, the bus BS3, and the like have already been described with reference to FIG. 7, and therefore will not be described in detail here.

In FIG. 20, the bus monitor circuit 30 outputs a control signal for switch control to the switch signal generation circuit 70. Specifically, the bus monitor circuit 30 outputs, to the switch signal generation circuit 70, a control signal indicating that the connection between the buses BS1 and BS2 is to be switched on in the period T1 and that the connection between the buses BS1 and BS2 is to be switched off in the period T2. Based on the control signal (monitor result) from the bus monitor circuit 30, in the period T1, the switch signal generation circuit 70 sets the switch signal SWS (switching control signal) to active (e.g., to the high level), and switches on the switch element. Also, based on the control signal from the bus monitor circuit 30, in the period T2, the switch signal generation circuit 70 sets the switch signal SWS to inactive (e.g., to the low level), and switches off the switch element.

Also, the circuit device 10 includes the clock signal generation circuit 50 that generates a clock signal CK for the charge pump, and supplies this clock signal CK to the charge pump circuit 80. In the period T2, the clock signal generation circuit 50 generates the charge pump clock signal CK based on a packet signal transferred by the bus BS1 and the bus BS2. Specifically, the clock signal CK is generated based on an SOF packet. For example, the clock signal CK is generated based on an EOP (End Of Packet). Also, in the data packet transfer period, the clock signal generation circuit 50 stops the clock signal CK that is supplied to the charge pump circuit 80. When a given set period has elapsed since the stopping of the clock signal CK, the signal level of the clock signal CK is changed from either one of a first and a second voltage level to the other one. Details of these operations will be described later.

Figure 21:
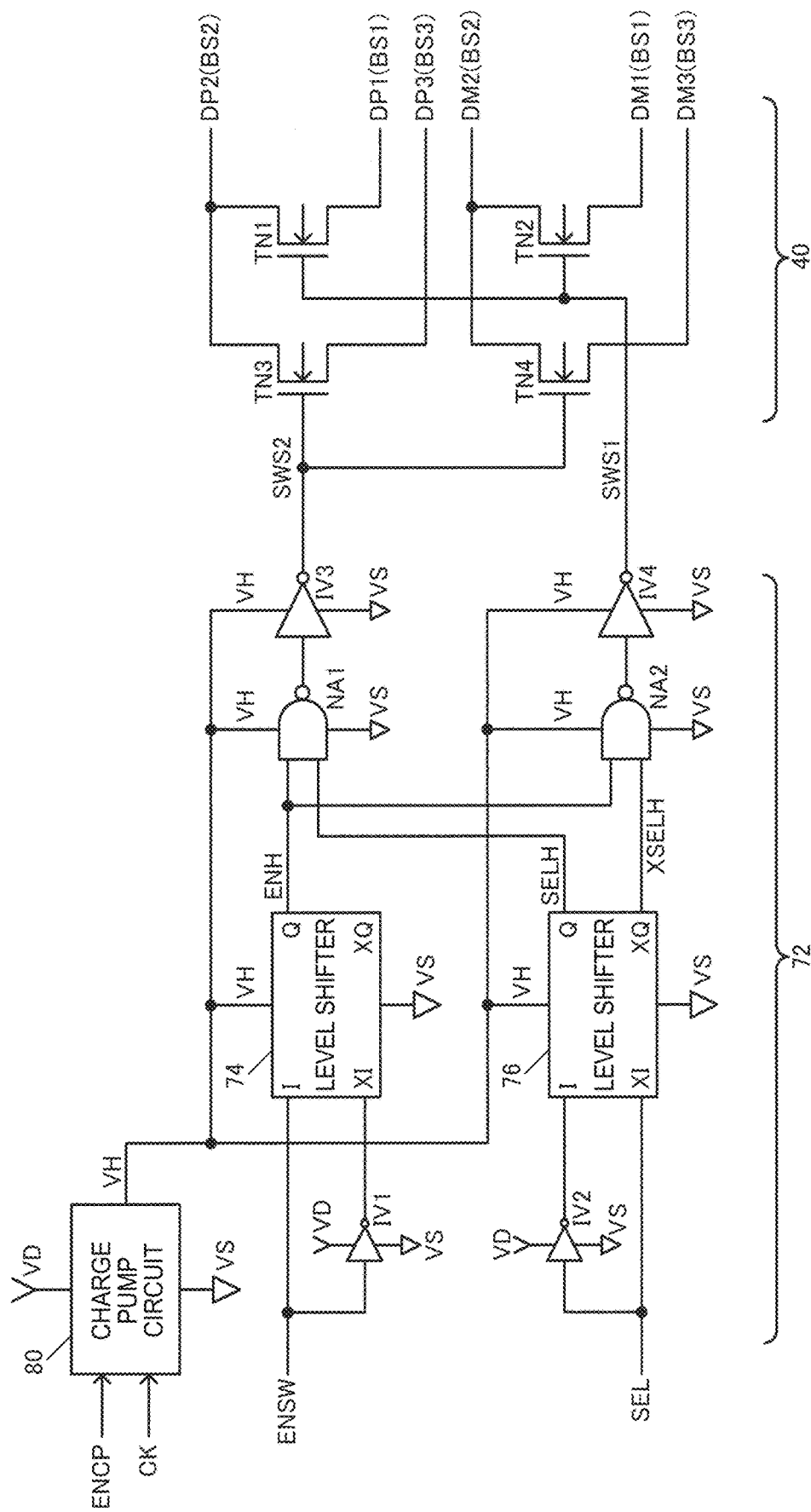
FIG. 21 shows a configuration example of a switch signal generation circuit and a bus switch circuit.

FIG. 21 sows a detailed configuration example of the switch signal generation circuit 70 and the bus switch circuit 40. The switch signal generation circuit 70 includes the charge pump circuit 80 and a control circuit 72. The charge pump circuit 80 receives a charge pump enable signal ENCP and the clock signal CK, and generates a boosted power supply voltage VH based on power supply voltages VD and VS. The generated boosted power supply voltage VH is supplied to corresponding circuits of the control circuit 72.

The control circuit 72 includes inverter circuits IV1 to IV4, level shifters 74 and 76, and NAND circuits NA1 and NA2. A buffer circuit is configured by the NAND circuits NA1 and NA2 and the inverter circuits IV3 and IV4.

The switch signal generation circuit 70 receives an enable signal ENSW for switch signal generation and a select signal SEL. The level shifter 74 receives an inverted signal of the enable signal ENSW, performs a level shift operation based on the boosted power supply voltage VH from the charge pump circuit 80, and outputs an enable signal ENH resulting from the level shift operation. The level shifter 76 receives an inverted signal of the select signal SEL, performs a level shift operation based on the boosted power supply voltage VH from the charge pump circuit 80, and outputs select signals SELH and XSELH resulting from the level shift operation. XSELH is an inverted signal of SELH. "I" and "XI" of the level shifters 74 and 76 respectively indicate a non-inversion input terminal and an inversion input terminal, and "Q" and "XQ" respectively indicate a non-inversion output terminal and an inversion output terminal.

Also, the NAND circuits NA1 and NA2 and the inverter circuits IV3 and IV4 that configure a buffer circuit generate switch signals SWS1 and SWS2 (switch signal SWS in FIGS. 19 and 20) based on the enable signal ENH and the select signals SELH and XSELH from the level shifters 74 and 76, and output the generated switch signals to the bus switch circuit 40.

The bus switch circuit 40 includes transistors TN1, TN2, TN3, and TN4. The transistors TN1 to TN4 configure switch elements of the bus switch circuit 40.

Specifically, the transistors TN1 and TN2 correspond to a switch element that switches on and off the connection between the buses BS1 and BS2 in FIGS. 19 and 20. For example, the transistor TN1 is provided between a DP1 signal line of the bus BS1 and a DP2 signal line of the bus BS2. The transistor TN2 is provided between a DM1 signal line of the bus BS1 and a DM2 signal line of the bus BS2.

The transistors TN3 and TN4 correspond to a switch element that switches on and off the connection between the buses BS2 and BS3 in FIG. 20. For example, the transistor TN3 is provided between a DP2 signal line of the bus BS2 and a DP3 signal line of the bus BS3. The transistor TN4 is provided between a DM2 signal line of the bus BS2 and a DM3 signal line of the bus BS3.

When the enable signal ENSW (ENH) falls to the low level, the switch signal generation operation is set to disabled. In this case, due to the switch signals SWS1 and SWS2 falling to the low level, the N-type transistors TN1 to TN4 are switched off, and the connection between the bus BS1 and the bus BS2 and the connection between the bus BS2 and the bus BS3 are switched off.

On the other hand, when the enable signal ENSW (ENH) rises to the high level, the switch signal generation operation is set to enabled. In this state, when the select signal SEL rises to the high level (VD level), the select signal SELH resulting from level shifting falls to the low level (VS level), and the select signal XSELH rises to the high level (VH level). Accordingly, the switch signal SWS1 rises to the high level (VH level), and the switch signal SWS2 falls to the low level (VS level). As a result, the transistors TN1 and TN2 are switched on, the transistors TN3 and TN4 are switched off, the connection between the buses BS1 and BS2 is switched on, and the connection between the buses BS2 and BS3 is switched off. Accordingly, signals can be exchanged between the main controller 200 and the peripheral device 260 in the period T1 as shown in FIG. 9.

On the other hand, in the state where the enable signal ENSW rises to the high level, and the switch signal generation operation is set to enabled, when the select signal SEL falls to the low level (VS level), the select signal SELH resulting from level shifting rises to the high level (VH level), and the select signal XSELH falls to the low level (VS level). Accordingly, the switch signal SWS1 falls to the low level (VS level), and the switch signal SWS2 rises to the high level (VH level). As a result, the transistors TN3 and TN4 are switched on, the transistors TN1 and TN2 are switched off, the connection between the buses BS2 and BS3 is switched on, and the connection between the buses BS1 and BS2 is switched off. Accordingly, signals can be exchanged between the peripheral device 260 and the charging circuit 221 as shown in FIG. 11.

Also, in this embodiment, the bus switch circuit 40 has switch elements that are constituted by first conductivity type transistors. These first conductivity type transistors are either N-type or P-type transistors. In FIG. 21, the first conductivity type transistors of the bus switch circuit 40 are the N-type transistors TN1 to TN4. For example, the substrate of the transistors TN1 to TN4 is set to the VS voltage level.

For example, in order to lower the on resistance of the switch elements of the bus switch circuit 40, a technique is conceivable in which the switch elements are constituted by a transfer gate (CMOS-structure transmission gate). With a transfer gate, N-type transistors and P-type transistors are connected in parallel, and therefore it is possible to lower the overall on resistance.

However, if a transfer gate is used, the configuration in which N-type transistors and P-type transistors are connected in parallel is applied, and therefore the parasitic capacitance added to the buses BS1 and BS2 increases, and the characteristics of HS mode communication in the period T2 in FIG. 10 degrade.

In view of this, in FIG. 21, the switch elements of the bus switch circuit 40 are configured by only first conductivity type transistors, that is to say, only one-channel transistors, such as N-type transistors. Accordingly, it is possible to reduce the parasitic capacitance that is added to the buses BS1 and BS2, and it is possible to reduce degradation in the characteristics of HS mode communication in the period T2 in FIG. 10 in comparison with a technique that employs a transfer gate.

Also, in this embodiment, the switching on and off of the N-type transistors TN1 to TN4 is controlled with use of the switch signals SWS1 and SWS2 (SWS) that are based on the boosted power supply voltage VH from the charge pump circuit 80. Accordingly, the switch signals SWS1 and SWS2 with the voltage level VH>Vth+VD, for example, are input to the gates of the transistors TN1 to TN4, and therefore it is possible to suppress a restriction from being placed on the range of voltages that pass through the transistors TN1 to TN4, and it is possible to reduce the on resistance of the transistors TN1 to TN4. Note that in this embodiment, a variation is possible in which transfer gates are used as the switch elements.

Figure 22:
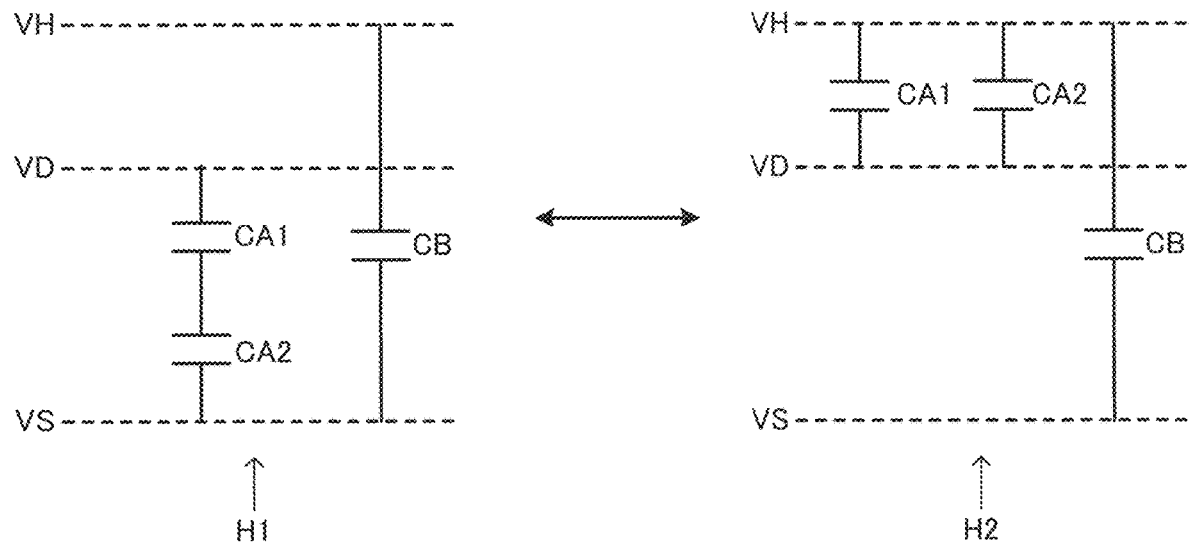
FIG. 22 is an illustrative diagram of operations of a charge pump circuit.

FIG. 22 is an illustrative diagram of operations of the charge pump circuit 80. In FIG. 22, the charge pump circuit 80 performs the charge pump operation with use of capacitors CA1, CA2, and CB. The capacitors CA1, CA2, and CB are desirably capacitors that are internally-provided in the circuit device 10, but may be external capacitors (condensers). In the case of being internally-provided capacitors, the capacitors CA1 and CA2 can be realized by MIM (Metal-Insulator-Metal) capacitors, for example. The capacitor CB can be realized by a gate-capacitance capacitor, a polysilicon-polysilicon capacitor, an MIM capacitor, or the like.

In H1 in FIG. 22, the capacitors CA1 and CA2 are connected in serial between a VD (high potential-side power supply voltage) node and a VS (low potential-side power supply voltage) node. Also, one end of the capacitor CB is connected to the VH node, and the other end is connected to the VS node. Accordingly, if VS=0V, and the capacitance values of CA1 and CA2 are the same, then the voltage across the terminals of the capacitors CA1 and CA2 is VD/2. Next, as shown by H2, the capacitors CA1 and CA2 are connected in parallel between the VH node and the VD node. Accordingly, a VH=VD+VD/2 boosting operation is performed. In the charge pump operation, the H1 connection state and the H2 connection state shown in FIG. 22 are alternatingly switched based on the clock signal CK.

Figure 23:
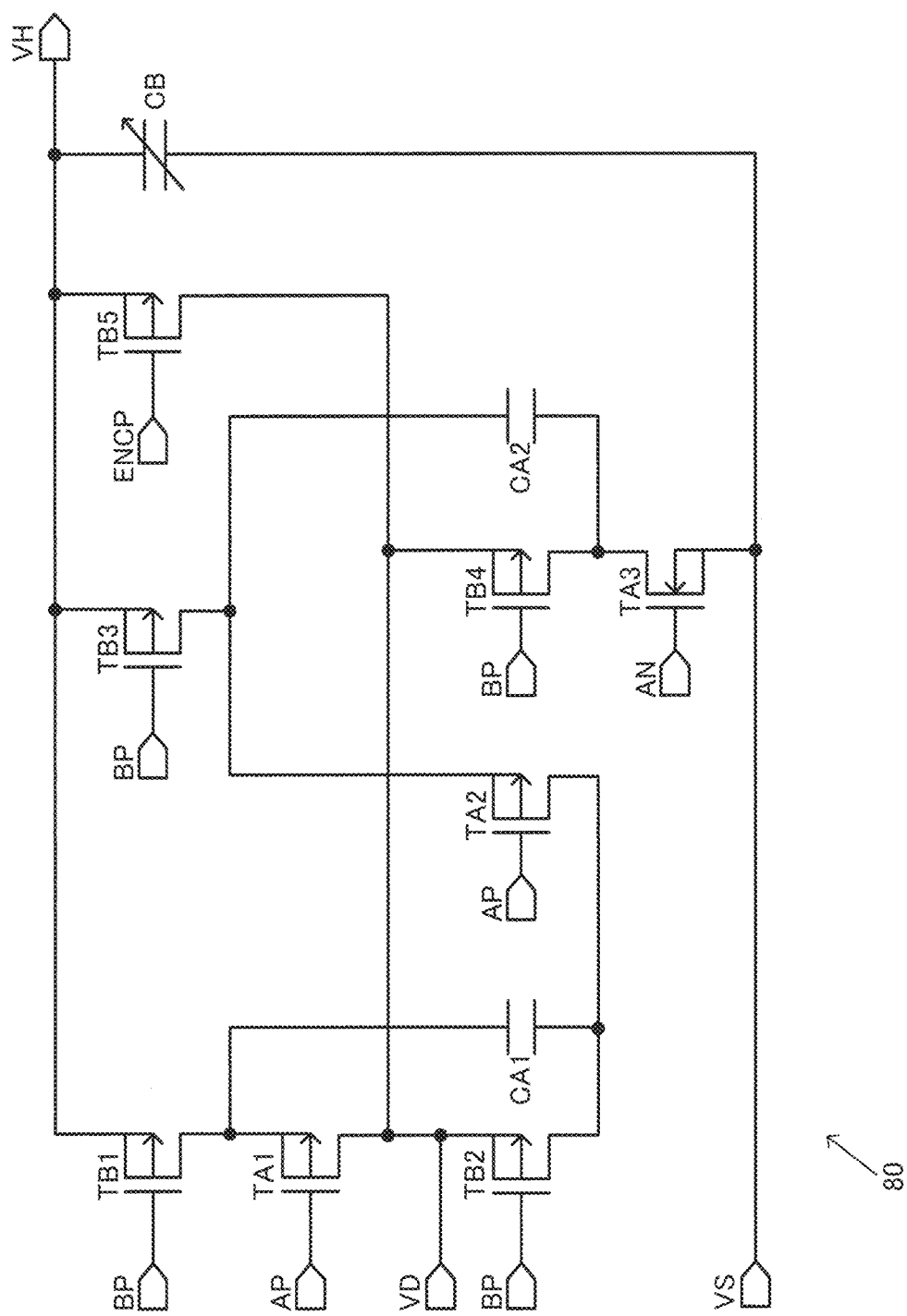
FIG. 23 shows a configuration example of the charge pump circuit.

FIG. 23 shows a detailed configuration example of the charge pump circuit 80. The charge pump circuit 80 includes transistors TA1 to TA3 and TB1 to TB5, and capacitors CA1, CA2, and CB. The transistor TA3 is an N-type transistor, and the other transistors are P-type transistors. Clock signals AP, BP, and AN are charge pump clock signals that correspond to the clock signal CK, and are generated based on the clock signal CK. The clock signals AP and BP are mutually exclusively at the low level or the high level, and are mutually non-overlapping signals, for example. The clock signal AN is an inverted signal of the clock signal AP. Also, when the enable signal ENCP falls to the low level (inactive), and the transistor TB5 is switched on, then the VH node and the VD node become connected, and the operation of the charge pump circuit 80 is set to disabled.

The capacitor CB is provided between the VH node and the VS node, and is a capacitor that has a variable capacitance value, for example. When the clock signals AP and AN become active, the transistors TA1, TA2, and TA3 are switched on. AP is a signal for which the low level is the active level, and AN is a signal for which the high level is the active level. When the transistors TA1, TA2, and TA3 are switched on, the connection state shown by H1 in FIG. 22 is realized. Specifically, this is a state where the capacitors CA1 and CA2 are connected in series between the VD node and the VS node.

On the other hand, when the clock signal BP becomes active, the transistors TB1, TB2, TB3, and TB4 are switched on. BP is a signal for which the low level is the active level. When the transistors TB1, TB2, TB3, and TB4 are switched on, the connection state shown by H2 in FIG. 22 is realized. Specifically, this is a state where the capacitors CA1 and CA2 are connected in parallel between the VH node and the VD node. The clock signals AP, AN, and BP are set to active or inactive based on the clock signal CK, and therefore the H1 connection state and the H2 connection state in FIG. 22 are alternatingly switched, and the boosted power supply voltage VH (VH=VD+VD/2) obtained by boosting VD is generated. For example, if VD=3.0 V to 3.6 V, then VH=4.5 V to 5.4 V, and a voltage greater than or equal to VD+Vth (e.g., Vth=0.6 to 1.0 V) can be applied to the gates of the transistors TN1 to TN4 of the bus switch circuit 40 in FIG. 21. Accordingly, if the voltage range of signals that pass through the bus is VS (=0V) to VD, driving can be performed in which the boosted power supply voltage VH=VD+VD/2, which is higher than VD+Vth, can be applied to the gates of the N-type transistors TN1 to TN4, and therefore it is possible to suppress a restriction from being placed on the range of voltages that pass through the transistors TN1 to TN4. In other words, if a signal in the voltage range VS to VD is received from the bus BS1 side, the received signal can be output to the bus BS2 side as a signal in the voltage range VS to VD. Also, if a signal in the voltage range VS to VD is received from the bus BS2 side, the received signal can be output to the bus BS1 side as a signal in the voltage range VS to VD.

Figure 24:
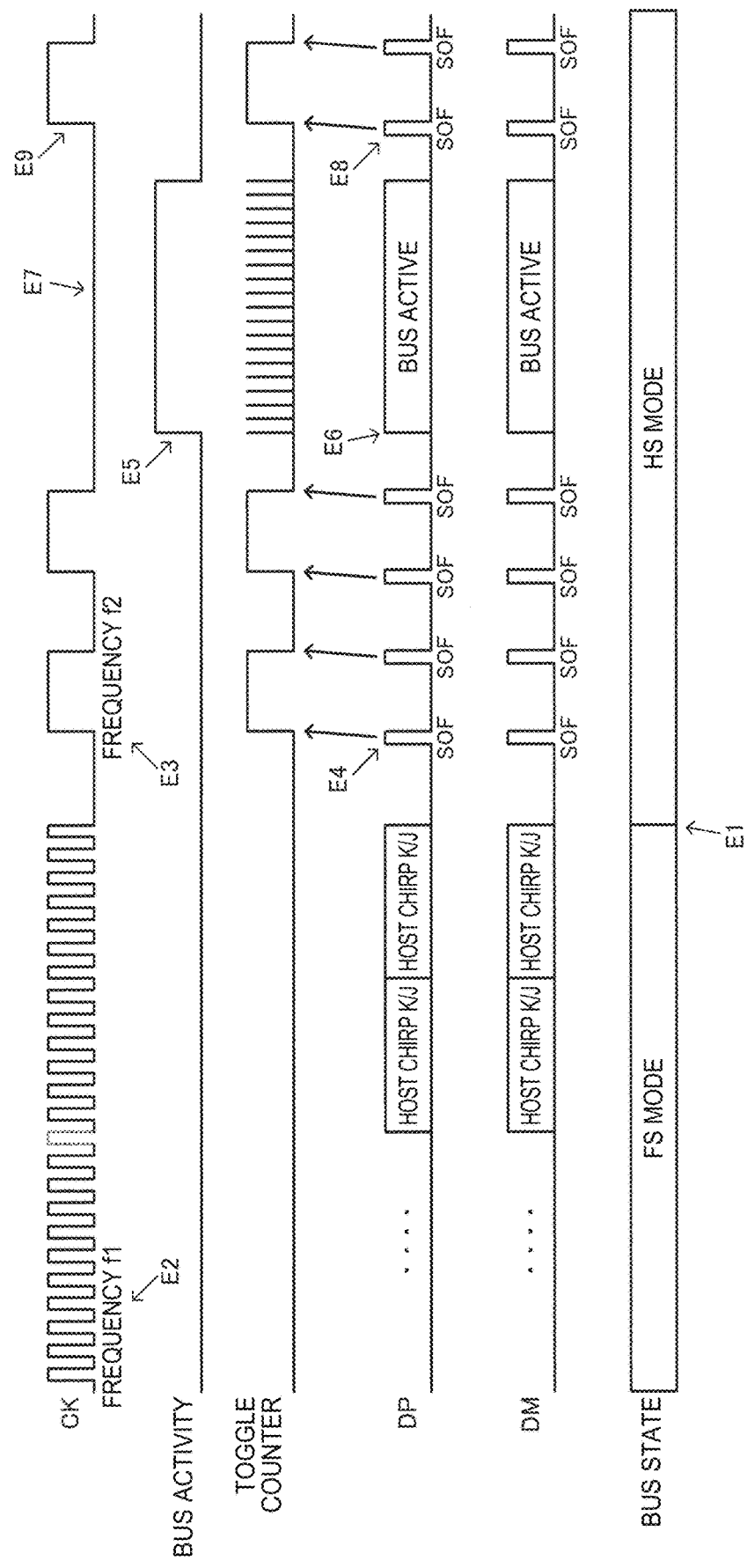
FIG. 24 is a signal waveform diagram illustrating operations of the third configuration example of the circuit device.

FIG. 24 is a diagram illustrating operations in the third configuration example at the time of a switch from the FS mode to HS mode. In the period T1 shown in FIG. 9, as described with reference to FIG. 12, signal transfer is performed in the FS mode (LS mode) between the main controller 200 and the peripheral device 260. In other words, FS mode signal transfer is performed with use of the signals DP and DM on the transfer route TR1. On the other hand, in the period T2 shown in FIG. 10, HS mode signal transfer is performed between the main controller 200 and the peripheral device 260. In other words, HS mode packet communication is performed on the transfer route TR2.

In E1 in FIG. 24, the bus state has been switched from the FS mode to the HS mode, but in the period T1 before this switch timing shown by E1, the charge pump clock signal CK has been set to the frequency f1 (first frequency) as shown by E2. For example, the charge pump circuit 80 that was described with reference to FIGS. 22 and 23 performs the charge pump operation based on the clock signal CK having the frequency f1 of approximately 10 KHz to 100 KHz. By performing the charge pump operation with this high frequency f1, the charge pump circuit 80 can supply the boosted power supply voltage VH to the buffer circuit (IV3, IV4, NA1, and NA2) and the level shifters 74 and 76 of the control circuit 72 with a sufficient power supply capability. Accordingly, the switch signals SWS1 and SWS2 that have a appropriately boosted voltage level can be supplied to the transistors TN1 to TN4 of the bus switch circuit 40. Accordingly, it is possible to suppress a restriction from being placed on the range of voltages that pass through the transistors TN1 to TN4, and it is possible to reduce the on resistance of the transistors TN1 to TN4. For example, in order to appropriately perform signal transfer in the period T1, it is necessary to lower the on resistance of the transistors TN1 to TN4, and therefore it is necessary to sufficiently increase the gate width W of the transistors TN1 to TN4 (e.g., W=100 μm to 1000 μm). If the gate width increases, the gate capacitance of the transistors TN1 to TN4 increases, and therefore it is necessary to increase the power supply capability of the charge pump circuit 80 that supplies the boosted power supply voltage VH to the buffer circuit (IV3, IV4, NA1, and NA2) of the control circuit 72. By setting the charge pump clock signal CK to the high frequency f1 as shown by E2 in FIG. 24, it is possible to raise the power supply capability of the charge pump circuit 80.

Also, in this embodiment, in the period T1 (FS mode) in which the connection between the buses BS1 and BS2 is switched on, the charge pump circuit 80 is caused to perform the charge pump operation with use of the clock signal CK shown by E2, and in the period T2 (HS mode) in which the connection between the buses BS1 and BS2 is switched off as well, the charge pump circuit 80 is caused to perform the charge pump operation with use of the clock signal CK shown by E3.

Specifically, in the period T2 in which the connection between the buses BS1 and BS2 is switched off, the switch signals SWS1 and SWS2 fall to the low level in order to switch off the transistors TN1 to TN4 in FIG. 21, and therefore the charge pump circuit 80 does not originally need to generate the boosted power supply voltage VH. However, a long startup time of approximately several tens of ms for example is needed from when the charge pump circuit 80 starts up until when the appropriate boosted power supply voltage VH can be supplied. Accordingly, if the charge pump circuit 80 is completely stopped in the period T2, the long startup time of the charge pump circuit 80 becomes a time lag at the time of the switch from the period T2 to the period T1, and the switch signals SWS1 and SWS2 having an appropriate boosted voltage level (VH) cannot be supplied to the transistors TN1 to TN4. For this reason, a restriction is placed on the range of voltages that pass through the transistors TN1 to TN4, the on resistance rises, and a problem occurs in signal transfer in the period T1 (FS mode).

To address this, in this embodiment, as shown by E3 in FIG. 24, in the period T2 (HS mode) as well, the clock signal generation circuit 50 supplies the charge pump clock signal CK to the charge pump circuit 80, and causes the charge pump circuit 80 to operate. Accordingly, at the time of a switch from the period T2 to the period T1, the switch signals SWS1 and SWS2 having an appropriate boosted voltage level can be supplied to the transistors TN1 to TN4. Accordingly, it is possible to prevent a situation in which a restriction is placed on the range of voltages that pass through the transistors TN1 to TN4, and a situation in which the on resistance rises, and it is possible to realize appropriate signal transfer in the period T1.

Furthermore, in this embodiment, the charge pump circuit 80 performs the charge pump operation based on the clock signal CK having the frequency f1 as shown by E2 in FIG. 24 in the period T1, and performs the charge pump operation based on the clock signal CK having the frequency f2 that is lower than the frequency f1 as shown by E3 in the period T2. In other words, in the period T2, the frequency of the clock signal CK is set lower than that in the period T1. For example, in the case of switching the switch elements of the bus switch circuit 40 from on to off in an HS idle period after host chirp K/J in FIG. 12, the clock signal CK is switched from the frequency f1 to the frequency f2 at this switch timing.

According to this configuration, it is possible to reduce the negative influence that switch noise from the charge pump operation performed by the charge pump circuit 80 has on packet communication in the HS mode in the period T2. Specifically, packet communication is performed with use of a small-amplitude differential signals in the HS mode, and therefore if the charge pump operation is performed with the high frequency f1 as in the period T1, there is a risk that a problem such as a communication error will occur due to switch noise from the charge pump operation.

In view of this, in this embodiment, the clock signal CK is set to the low frequency f2 as shown by E3 in FIG. 24 in the period T2. Accordingly, it is possible to suppress the occurrence of a communication error problem caused by switch noise. However, in the period T1 in which FS (LS) communication is performed, the switch elements of the bus switch circuit 40 are switched on, but the signals that pass through the switch elements are voltage-driven, and therefore switch noise from the charge pump operation has little influence. For this reason, the charge pump operation is performed with the clock signal CK having the fast frequency f1 as normal.

For example, in this embodiment, in the period T2, the charge pump clock signal CK is generated based on a packet signal transferred by the buses BS1 and BS2. For example, the clock signal CK is generated based on an SOF (Start Of Frame) packet as shown by E4 in FIG. 24. Specifically, the clock signal CK is generated based on an EOP (End Of Packet) of the SOF. For example, in USB technology, in the HS mode idle period, an SOF packet is transmitted every 125 μs, and an EOP is set at the end of each SOF. In the HS mode, the EOP is indicated by the 8-bit NRZ 01111111 that has no bit stuffing. A toggle counter is caused to operate with the EOP, for example, of this SOF. For example, a toggle counter is caused to perform a toggle operation, the clock signal CK is changed from a first voltage level (e.g., the low level) to a second voltage level (e.g., the high level) and changed from the second voltage level to the first voltage level in accordance with the toggle operation timing. For example, the clock signal CK is generated such that the rising timing and the falling timing are synchronized with the SOF (EOP). According to this configuration, in the period T2, it is possible to generate the clock signal CK having the low frequency f2 by effectively utilizing a packet such as an SOF, and to cause the charge pump circuit 80 to perform the charge pump operation. Also, by using the EOP, it is possible to operate the clock signal in accordance with a timing that avoids the SOF transmission period.

Also, in this embodiment, in the data packet transfer period, which is the HS mode communication period, the clock signal CK supplied to the charge pump circuit 80 is stopped. Stopping the clock signal CK refers to preventing the voltage level of the clock signal CK from changing from either one of the first and second voltage levels to the other one. For example, as shown by E5 and E6 in FIG. 24, the bus becomes active, and HS data packet communication is performed. In this HS mode communication period, the clock signal CK is fixed at a predetermined voltage level such as the low level and stopped, as shown by E7. In other words, the clock signal CK is masked so as to prevent the charge pump circuit 80 from operating. According to this configuration, the charge pump operation of the charge pump circuit 80 stops, and it is possible to suppress the negative influence that switch noise from the charge pump operation has on HS mode packet communication. When data packet communication ends, and the HS idle period is entered, the clock signal CK is operated based on an SOF packet as shown by E8 and E9.

Figure 25:
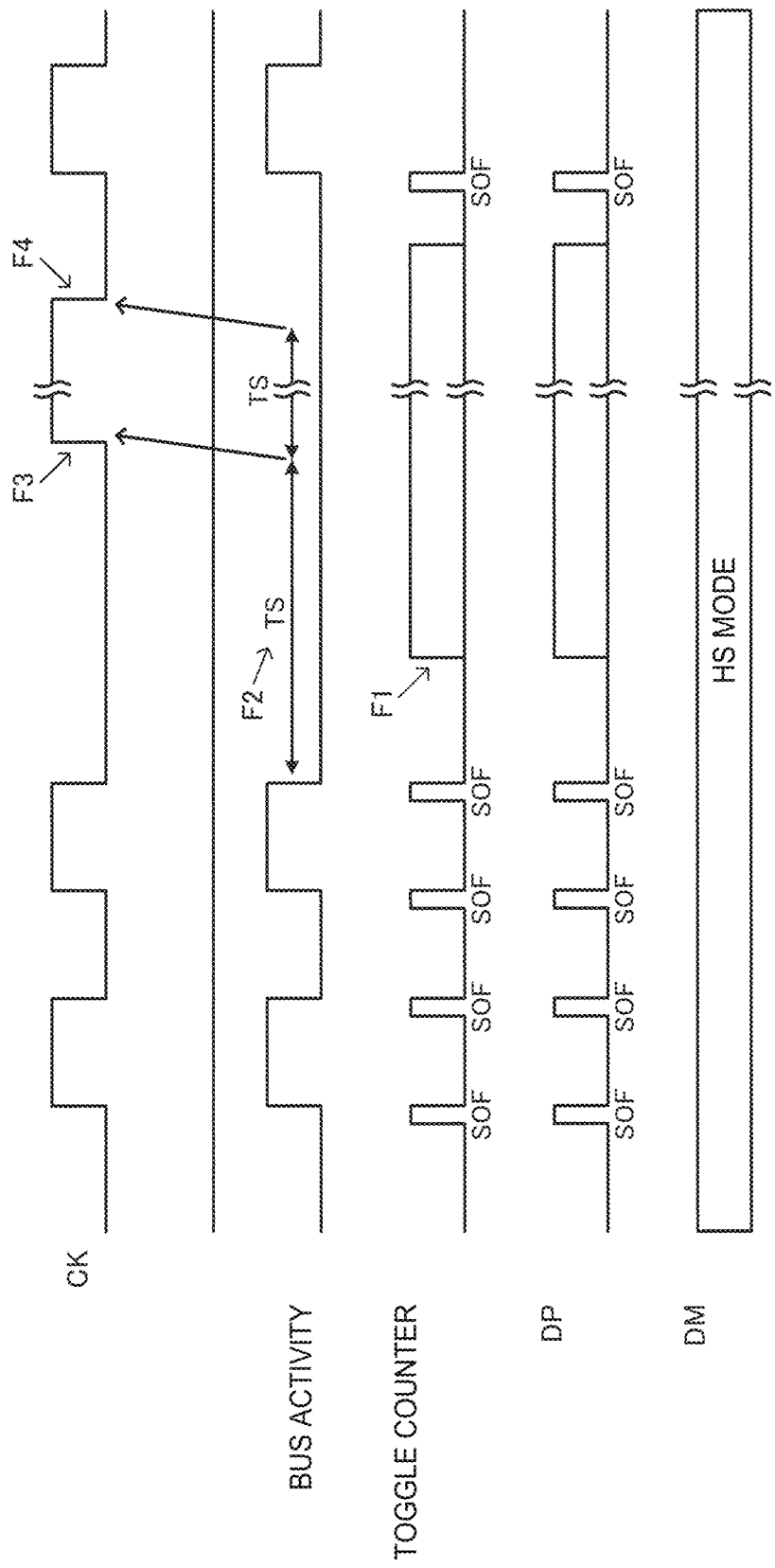
FIG. 25 is a signal waveform diagram illustrating operations of the third configuration example of the circuit device.

FIG. 25 is a diagram illustrating details of operations in this embodiment in the HS mode communication period. In this embodiment, as shown by E7 in FIG. 24, in the HS mode communication period, the clock signal CK is masked and stopped. However, in the case where this communication period becomes long, if the clock signal CK remains stopped, the voltage level of the boosted power supply voltage VH will gradually decrease due to leakage current or the like in the control circuit 72 in FIG. 21. As a result, the startup time of the charge pump circuit 80 becomes long at the time of a switch from the period T2 to the period T1, this long startup time becomes a timing lag, and the switch signals SWS1 and SWS2 having an appropriate boosted voltage level cannot be supplied to the transistors TN1 to TN4.

In view of this, in this embodiment, when a given set period has elapsed since the stopping of the clock signal CK, the signal level of the clock signal CK is changed from either one of the first and second voltage levels to the other one.

For example, as shown by F1 in FIG. 25, the bus become active, and the HS mode communication period starts. In this case, if a given set period TS indicated by F2 has elapsed since the timing of the last toggle operation of the toggle counter for example, the signal level of the clock signal CK is changed from the low level (one voltage level out of the first and second voltage levels) to the high level (the other voltage level) as shown by F3. When the set period TS elapses thereafter, the signal level of the clock signal CK is changed from the high level to the low level, for example, as shown by F4. According to this configuration, even if the HS mode communication period becomes long, the charge pump operation can be performed with use of the clock signal CK having the minimum-required frequency. Accordingly, at the time of a switch from the period T2 to the period T1, the switch signals SWS1 and SWS2 having an appropriate boosted voltage level can be supplied to the transistors TN1 to TN4, and it is possible to prevent the occurrence of the problems described above.

For example, in the HS mode communication period, an in-communication flag set in a register of the circuit device 10 rises, and the clock signal CK supplied to the charge pump circuit 80 stops. Also, a maximum stop time (minimum clock frequency) is set for the clock signal CK, an the clock signal CK is managed such that the stop time does not reach a time greater than or equal to the maximum stop time (is less than or equal to the minimum clock frequency). For example, a time constant T of voltage variation of the boosted power supply voltage VH is obtained based on a leakage current value and a stabilized capacitance value of the charge pump circuit 80, for example. Then, based on this time constant T, a time according to which the boosted power supply voltage VH does not fall below VD+Vth, for example, is obtained as the maximum stop time, and the set period TS in FIG. 25 is set to a length less than or equal to the maximum stop time. Specifically, the set period TS is set to a length of approximately 1 ms, for example. According to this configuration, even if the clock signal CK is stopped in the HS mode communication period, the boosted power supply voltage VH does not fall below VD+Vth, for example, and it is possible to prevent the occurrence of the above-described problems.

Figure 26:
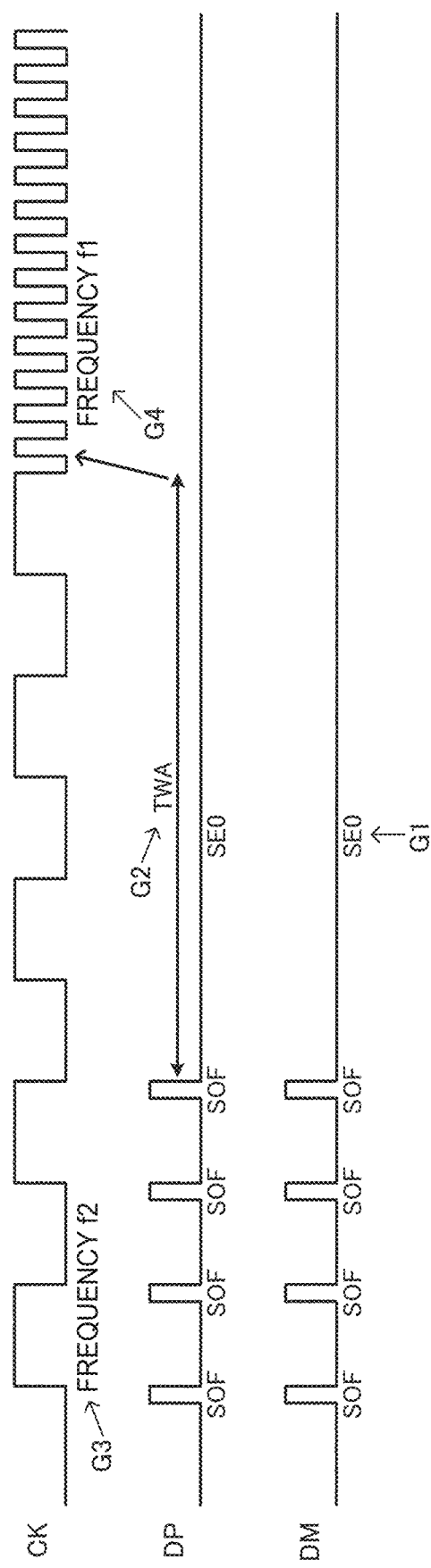
FIG. 26 is a signal waveform diagram illustrating operations of the third configuration example of the circuit device.

Also, in this embodiment, after a given period has elapsed since the disappearance of bus activity, the frequency of the clock signal CK is changed from the frequency f2 to the frequency f1. This given period is a period that is longer than or equal to 2 ms, for example. For example, as shown by G1 in FIG. 26, SOF transmission stops, the bus enters the SE0 state, and bus activity disappears. In USB technology, if 3 ms or more elapses since the disappearance of bus activity, it is determined whether a reset request was made, or a suspend request was made. In view of this, as shown by G2 in FIG. 26, if a given period TWA (e.g., a period greater than or equal to 2 ms and less than 3 ms) elapses since SOF transmission stopped and bus activity disappeared, the clock signal CK is changed from the frequency f2 to the frequency f1 as shown by G3 and G4. In other words, the frequency that had been changed from f1 to f2 at E2 and E3 in FIG. 24 is returned from f2 to f1. In this way, by supplying the clock signal CK having the high frequency f1 to the charge pump circuit 80, the charge pump circuit 80 is able to supply the boosted power supply voltage VH to the control circuit 72 in FIG. 21 with the appropriate power supply capability. Accordingly, the transistors TN1 to TN4 can be appropriately set to the on state in accordance with the switch signals SWS1 and SWS2 that have an appropriate boosted voltage level. According to the above configuration, it is possible to realize a bus switch control technique that realizes high-quality HS communication with low noise.

8. Details of Bus Monitor Circuit and Physical Layer Circuit

Figure 27:
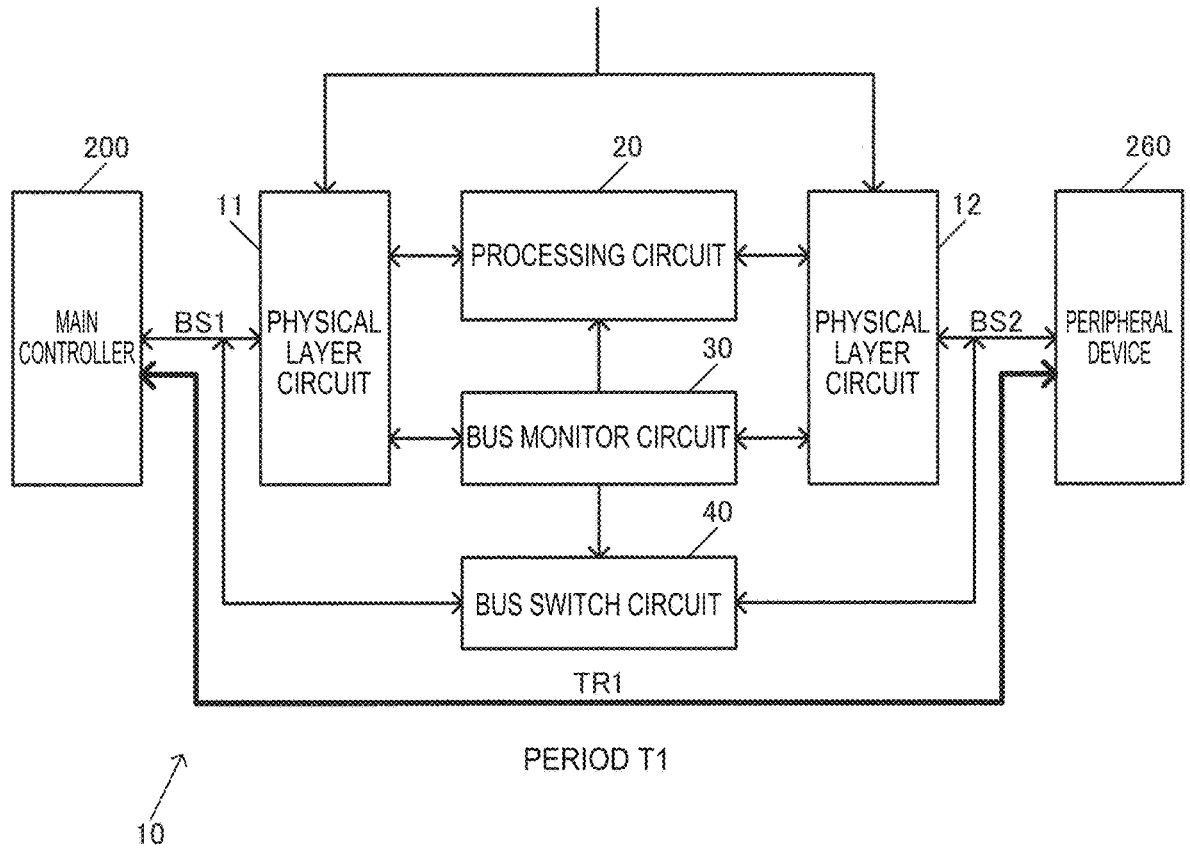
FIG. 27 is an illustrative diagram of detailed operations of a bus monitor circuit.

FIG. 27 is an illustrative diagram of detailed operations of the bus monitor circuit 30. The bus monitor circuit 30 performs a USB bus monitor operation, and this monitor operation is performed based on a signal from a physical layer circuit. Specifically, as shown in FIG. 27, in the period T1, the bus monitor circuit 30 performs the monitor operation based on a signal from one physical layer circuit out of the physical layer circuits 11 and 12. In other words, the USB bus monitor operation is performed based on a signal (a detection signal or the like) not from both the physical layer circuits 11 and 12, but rather from either one of the physical layer circuits. In the period T1, the other physical layer circuit out of the physical layer circuits 11 and 12 is set to operation off or a power saving mode.

For example, in the case where the bus monitor circuit 30 performs the bus monitor operation based on a signal from the physical layer circuit 11, the physical layer circuit 12 is set to operation off or the power saving mode. Alternatively, in the case where the bus monitor circuit 30 performs the bus monitor operation based on a signal from the physical layer circuit 12, the physical layer circuit 11 is set to operation off or the power saving mode. The physical layer circuit 11 and the physical layer circuit 12 can be set to operation off or the power saving mode based on a control signal from the bus monitor circuit 30, for example. Alternatively, the physical layer circuit 11 and the physical layer circuit 12 may be set to operation off or the power saving mode based on a control signal from the processing circuit 20.

Here, setting operation off refers to setting the operation of an analog circuit that constitutes the physical layer circuit to disabled, for example. For example, a transistor or the like that constitutes the analog circuit is set to off so as to prevent the flow of current that consumes power. For example, an HS mode transmission circuit (HSD) can include a current source that is provided between an AVDD (high potential-side power supply) power supply line and a first node, and first, second, and third transistors that are provided between the first node and the DP signal line, the DM signal line, and an AVSS (low potential-side power supply) power supply line. In this case, setting the HS mode transmission circuit to operation off refers to stopping the current source (stopping the current flowing in the current source), for example. Also, setting the power saving mode refers to lowering power consumption by limiting the current flowing in an analog circuit (operational amplifier or the like) that constitutes the physical layer circuit. For example, the current flowing in the analog circuit is limited to a current less than or equal to a given threshold value. For example, the current flowing in the aforementioned current source is limited to a current less than or equal to a given threshold value.

For example, in order to monitor the state of the bus (signals DP, DM) as shown in FIGS. 12 to 14, it is effective to use signals from analog circuits that constitute the physical layer circuits. Accordingly, when the monitor operation is to be performed, it is necessary to operate these analog circuits.

Also, the two physical layer circuits 11 and 12 are provided in the circuit device 10 of this embodiment, and causing both of these physical layer circuits 11 and 12 to operation in order to perform the monitor operation is wasteful in terms of power consumption. In view of this, the monitor operation is performed based on a signal from one physical layer circuit out of the physical layer circuits 11 and 12, the other physical layer circuit is set to operation off or the power saving mode. According to this configuration, it is possible to realize an appropriate bus monitor operation based on a signal from one physical layer circuit, and also suppress wasteful power consumption by setting the other physical layer circuit to operation off or the power saving mode, thus achieving a reduction in power consumption.

Then, in the period T2 shown in FIG. 10, operation of both of the physical layer circuits 11 and 12 is set to on. Packet transfer is thus performed between the buses BS1 and BS2 on the transfer route TR2 that passes through the physical layer circuits 11 and 12.

Note that the bus monitor circuit 30 can perform the monitor operation with respect to not only one of the buses BS1 and BS2, but also both of the buses BS1 and BS2. For example, the bus monitor circuit 30 may perform the USB bus monitor operation based on a signal (detection signal or the like) from both of the physical layer circuits 11 and 12. For example, in order to detect a bus reset, it is necessary to perform the monitor operation with respect to the bus BS1 on the main controller 200 side, for example. Also, in order to detect an HS disconnection, it is necessary to perform the monitor operation with respect to the bus BS2 on the peripheral device 260 side. Accordingly, in order to perform bus reset detection and HS disconnection detection, the bus monitor circuit 30 performs the monitor operation with respect to both of the buses BS1 and BS2. In other words, the monitor operation is performed based on a signal from both of the physical layer circuits 11 and 12.

Figure 28:
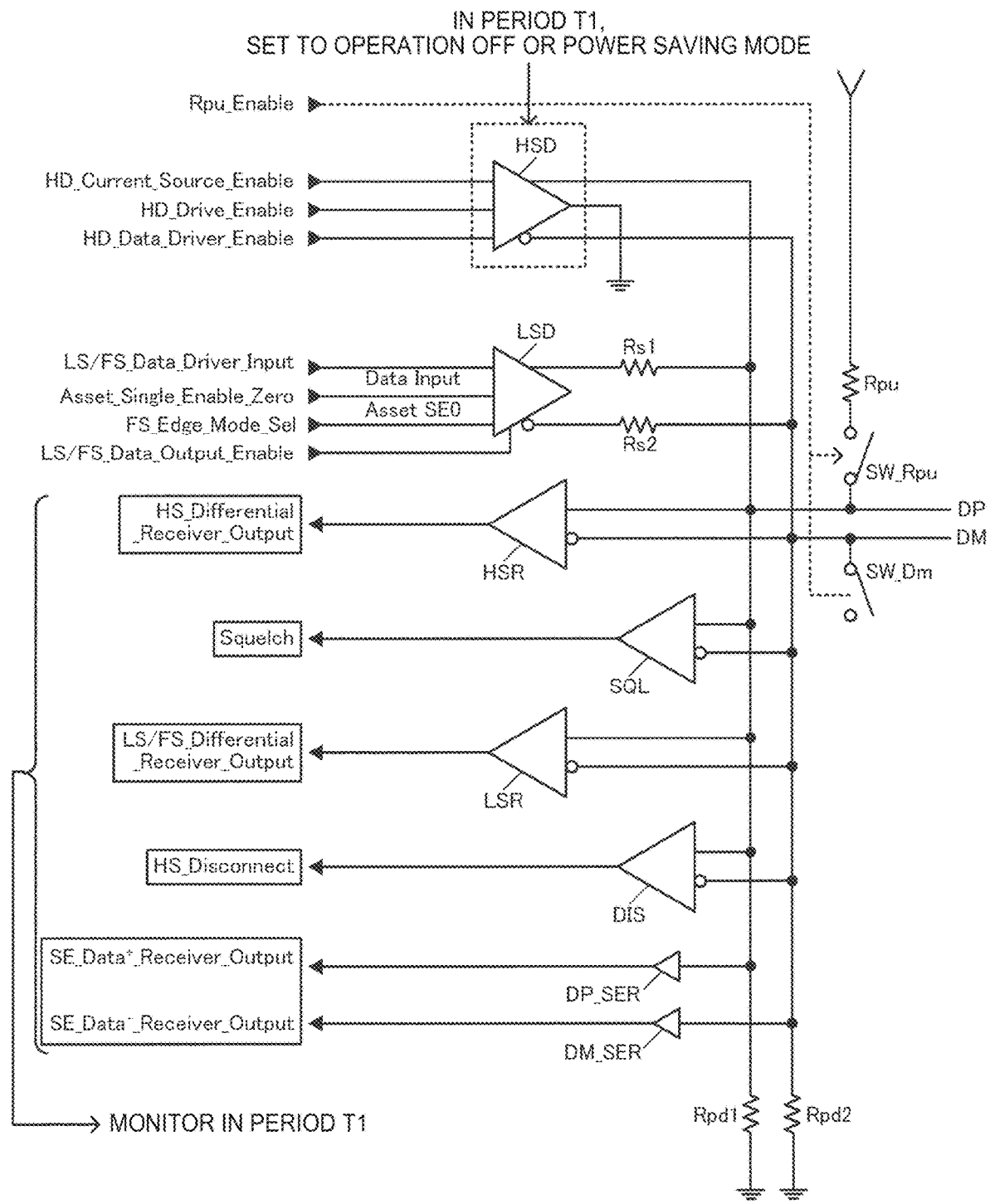
FIG. 28 shows a detailed configuration example of a physical layer circuit.

FIG. 28 shows a configuration example of one physical layer circuit (11, 12). This physical layer circuit, includes a pull-up resistance Rpu, switch elements SW_Rpu and SW_Dm, and pull-down resistances Rpd1 and Rpd2. The switch element SW_Rpu is switched on and off based on a control signal Rpu_Enable. A pull-down operation is thus realized. Also, the physical layer circuit includes an HS mode transmission circuit HSD (current driver), an LS/FS mode transmission circuit LSD (driver), and resistances Rs1 and Rs2. The physical layer circuit also includes an HS mode differential reception circuit HSR (data receiver), a squelch detection circuit SQL (transmission envelope detector), an LS/FS mode differential reception circuit LSR (data receiver), a disconnection detection circuit DIS (disconnection envelope detector), and single-end reception circuits DP_SER and DM_SER (receiver).

Also, in this embodiment, the bus monitor operation is performed by the bus monitor circuit 30 based on a signal from an analog circuit that constitutes the physical layer circuit. Specifically, as shown in FIG. 28, the bus monitor circuit 30 performs the bus monitor operation based on a signal from the HS mode differential reception circuit HSR, the squelch detection circuit SQL, the LS/FS mode differential reception circuit LSR, the disconnection detection circuit DIS, or the single-end reception circuits DP_SER and DM_SER. Specifically, based on signals from these analog circuits, the bus monitor circuit 30 can monitor bus states such as device chirp K, host chirp K/J, idle, reset, suspend, resume, SE0, J, K, bus reset, or HS disconnect. Based on the monitor result, the bus monitor circuit 30 performs control for switching on or off switch elements (USB switch, BC switch) of the bus switch circuit 40 as described with reference to FIGS. 12, 13, and 14, and performs control for switching on or off transfer processing of the processing circuit 20. According to this configuration, it is possible to realize appropriate switch control performed by the bus switch circuit 40 and transfer control performed by the processing circuit 20 that are based on an appropriate determination of the bus state.

Also, in this embodiment, as shown in FIG. 28, in the period T1, the HS mode transmission circuits HSD of the physical layer circuits 11 and 12 are set to operation off or the power saving mode. Specifically, in this embodiment, as shown in FIG. 27, in the period T1, the bus switch circuit 40 switches on the connection between the buses BS1 and BS2 so as to enable the direct exchange of signals on the transfer route TR1 between the main controller 200 and the peripheral device 260. The bus monitor circuit 30 then performs the bus monitor operation based on a signal from one physical layer circuit out of the physical layer circuits 11 and 12.

In this case, the HS mode transmission circuits HSD of the physical layer circuits 11 and 12 do not perform HS transfer processing, and therefore do not need to operate. In view of this, in the period T1, the bus monitor circuit 30 for example (or the processing circuit 20) sets the HS mode transmission circuits HSD to operation off or the power saving mode. According to this configuration, wasteful consumption of power in the HS mode transmission circuits HSD can be prevented, and a reduction in power consumption is achieved. The HS mode transmission circuits HSD are current drivers, and a large current flows therein. Accordingly, if the bus monitor circuit 30 (or the processing circuit 20) sets the transmission circuits HSD to operation off or the power saving mode, power consumption can be significantly reduced. Note that in the period T1, the LS/FS transmission circuits LSD may also be set to operation off or the power saving mode. According to this configuration, it is possible to further reduce power consumption.

9. Details of Transfer Processing

Figure 29:
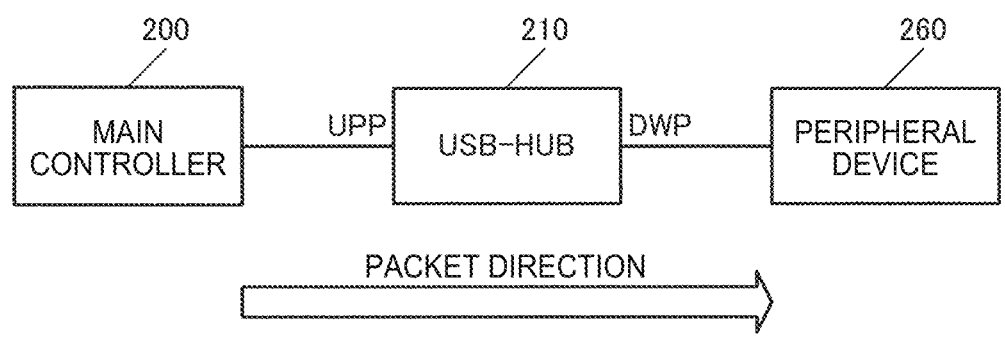
FIG. 29 is an illustrative diagram of packet transfer processing in a USB-HUB.
Figure 30:
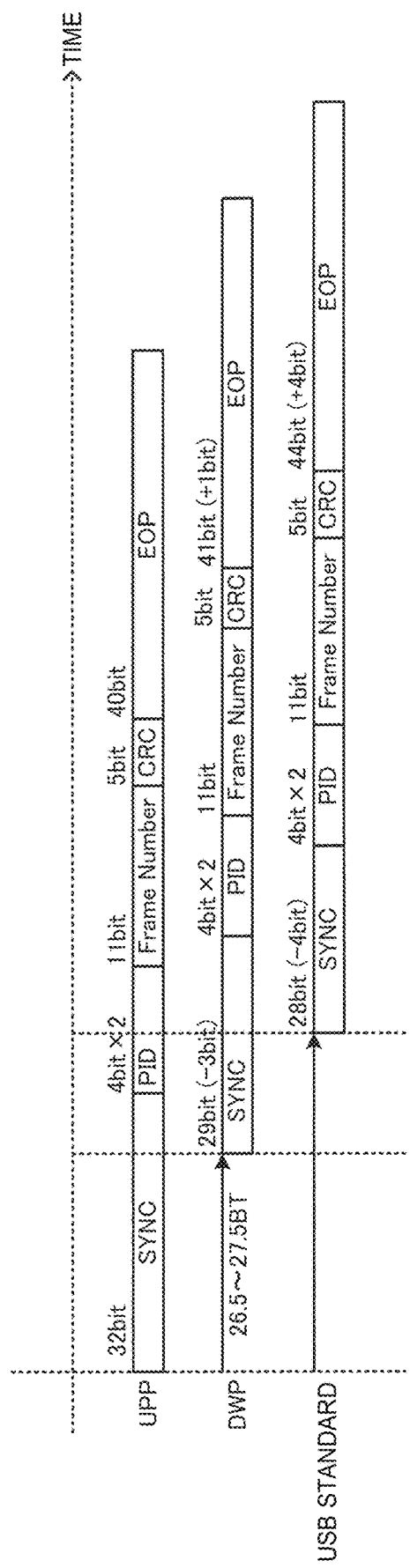
FIG. 30 is an illustrative diagram of packet transfer processing in a USB-HUB.

Next, transfer processing performed by processing circuit 20 will be described in detail. FIGS. 29 and 30 are diagrams illustrating packet transfer processing in the case where the USB-HUB 210 is provided between the main controller 200 and the peripheral device 260. FIG. 30 shows the signal waveforms of a signal UPP on the upstream side and signal DWP on the downstream side in the USB-HUB 210 in FIG. 29. Taking the example of the SOF packet, the packets of these signals UPP and DWP have SYNC, PID, Frame Number, CRC, and EOP fields (regions). For example, SYNC is the synchronization field, PID is the packet ID field, Frame Number is the frame number field, CRC is the cyclic redundancy check field, and EOP is the end of packet field.

In this case, in the USB-HUB 210 in FIG. 29, as shown in FIG. 30, in the signal DWP packet, the number of bits in the SYNC field is reduced by 3 bits, and the number of bits in the EOP field is increased by 1 bit. As shown in FIG. 30, in the USB standard, the SYNC field can be reduced by up to 4 bits, and the EP field can be increased up to 4 bits.

Figure 31:
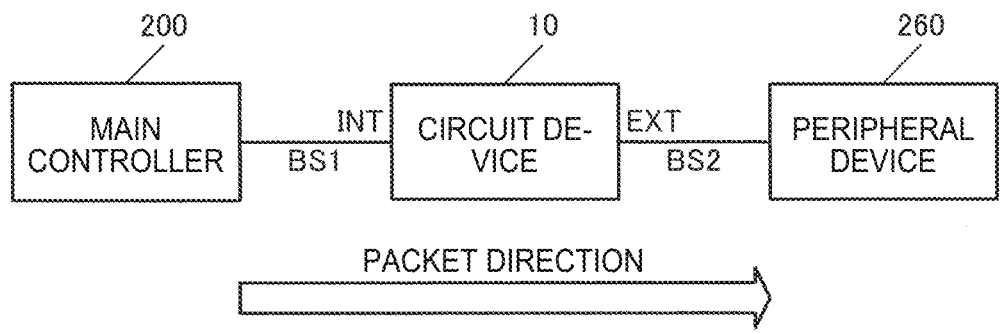
FIG. 31 is an illustrative diagram of packet transfer processing in a circuit device according to the embodiment of the invention.
Figure 32:
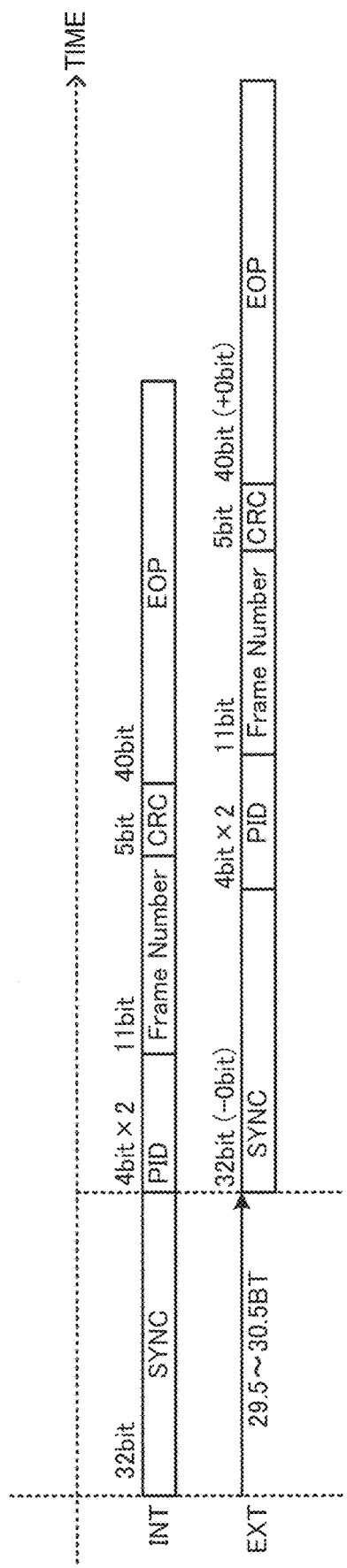
FIG. 32 is an illustrative diagram of packet transfer processing in a circuit device according to the embodiment of the invention.

FIGS. 31 and 32 are diagrams illustrating packet transfer processing in the case where the circuit device 10 of this embodiment is provided between the main controller 200 and the peripheral device 260.

FIG. 32 shows the signal waveforms of a signal INT on the bus BS1 side and a signal EXT on the bus BS2 side in the circuit device 10 in FIG. 31. As shown in FIG. 32, a packet received from the bus BS1 side is transmitted to the bus BS2 side with no change in the packet format, that is to say in the same format. Note that although FIGS. 31 and 32 show the case where a packet is transferred from the bus BS1 side to the bus BS2 side, the signal waveforms are similar in the case where a packet is transferred from the bus BS2 side to the bus BS1 side as well. In other words, a packet received from the bus BS2 side is transmitted to the bus BS1 side with no change in the packet format, that is to say in the same format.

In FIG. 32, unlike the case in FIG. 30, in the signal EXT, the neither the number of bits in the SYNC field nor the number of bits in the EOP field have been changed. In other words, a packet received from the bus BS1 side is transmitted to the bus BS2 side as-is, with no change in the number of bits in the SYNC field or the number of bits in the EOP field. The same applies to the case where a packet received from the bus BS2 side is transmitted to the bus BS1 side as well.

Specifically, the USB-HUB 210 shown in FIG. 29 has a USB product ID and a vendor ID, and performs packet transfer in compliance with the USB HUB standard. In the USB standard, the number of bits in the SYNC field is allowed to be reduced by up to 4 bits, and the number of bits in the EOP field is allowed to be increased by up to 4 bits. For this reason, in the waveform of the signal DWP in FIG. 30, the number of bits in the SYNC and EOP are changed so as to be compliant with this standard.

In contrast, the circuit device 10 of this embodiment does not have a product ID or a vendor ID, and a change in the number of bits in the SYNC and EOP fields is not allowed, as shown in FIG. 30. In view of this, in this embodiment, packet transfer processing is performed on the transfer route TR2 shown in FIG. 10 without a change in the number of bits in the SYNC field and the number of bits in the EOP field of the packet. According to this configuration, even if the circuit device 10 of this embodiment is provided between the main controller 200 and the peripheral device 260 as shown in FIG. 31, it is possible to realize appropriate packet transfer that is compliant with the USB standard. In other words, USB packets can be transferred as if no circuit device whatsoever exists between the main controller 200 and the peripheral device 260.

Also, in this embodiment, packet bit resynchronization processing is performed in the transfer processing performed by the processing circuit 20. Resynchronization processing (resynchronize) is realized by processing in which, for example, the bits of a received packet are retrieved by sampling with a clock signal from the circuit device 10, a packet is reconstructed using the retrieved bits, and the reconstructed packet is output in synchronization with a clock signal from the circuit device 10.

Figure 33:
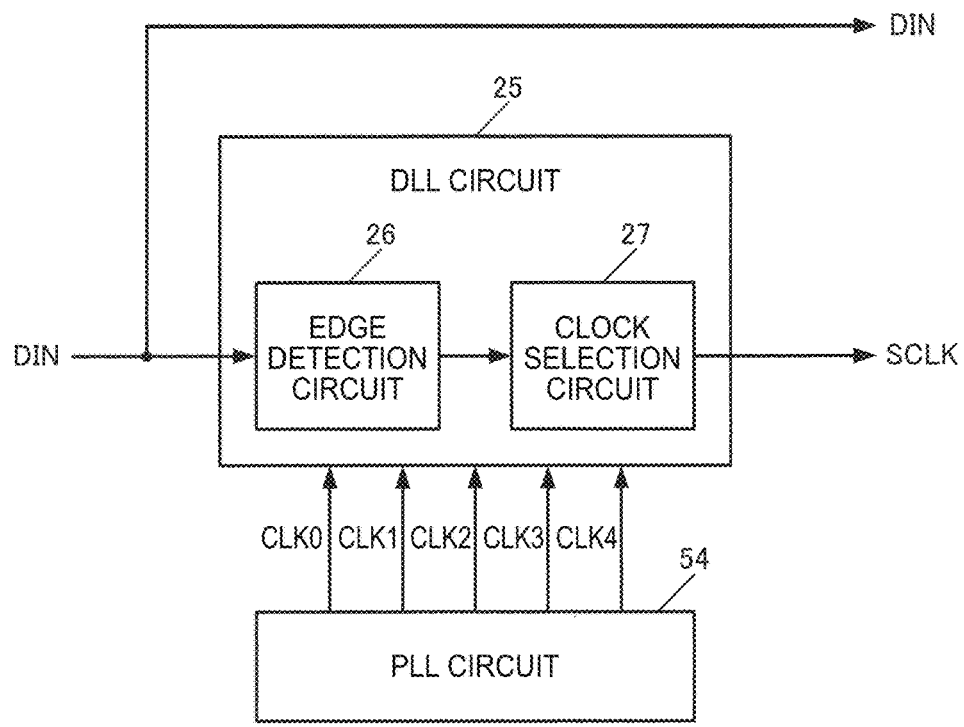
FIG. 33 is an illustrative diagram of packet bit resynchronization processing.
Figure 34:
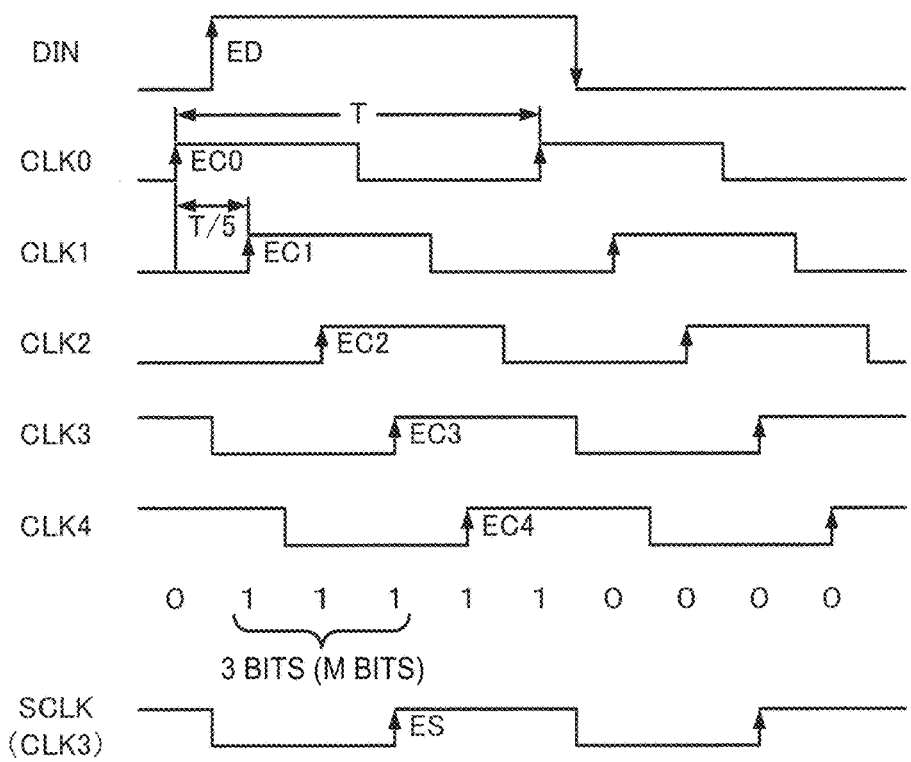
FIG. 34 is an illustrative diagram of packet bit resynchronization processing.

FIGS. 33 and 34 are illustrative diagrams of packet resynchronization processing, and are illustrative diagrams of processing for sampling the bits of a packet. In FIG. 33, the PLL circuit 54 generates and outputs clock signals CLK0, CLK1, CLK2, CLK3, and CLK4 (more broadly, first to N-th clock signals) that have the same frequency but different phases from each other. For example, the PLL circuit 54 generates and outputs the clock signals CLK0 to CLK4 with use of output from five (N) differential output comparators (more broadly, an odd number of first to N-th inverting circuits) included in the VCO (oscillation means with a variably-controlled oscillation frequency) thereof.

A DLL circuit 25 includes an edge detection circuit 26 and a clock selection circuit 27. The edge detection circuit 26 detects the edge of serial data DIN received by the reception circuit of one physical layer circuit (11, 12), and outputs corresponding edge detection information to the clock selection circuit 27. Specifically, as illustrated in FIG. 34, the edge detection circuit 26 detects whether or not a serial data DIN edge exists between any edges (rising or falling edges) of the clock signals CLK0 to CLK4 from the PLL circuit 54, and outputs corresponding edge detection information to the clock selection circuit 27. Based on this edge detection information, the clock selection circuit 27 selects one clock signal out of the clock signals CLK0 to CLK4, and outputs the selected clock signal as a sampling clock signal SCLK. By sampling the serial data based on this sampling clock signal SCLK, it is possible to realize the sampling of the bits of the received packet.

FIG. 34 is a timing waveform diagram for describing operations of the circuits shown in FIG. 33. As shown in FIG. 34, CLK0 to CLK4 are clock signals with different phases but the same frequency (480 MHz). Also, letting T be the period of the clock signals, the phases of the clocks are shifted from each other by T/5 (more broadly, T/N). In FIG. 34, the edge detection circuit 26 in FIG. 33 detects that an edge ED of the serial data DIN, which is the sampling target, is between CLK0 and CLK1. Accordingly, the clock selection circuit 27 in FIG. 33 selects the clock signal CLK3 that has an edge EC3 that is shifted by 3 bits (more broadly, a set number of bits M) for example from the edge ED of the serial data DIN, and this selected CLK3 is output to a later-stage circuit as the DIN sampling clock signal SCLK.

By performing this processing described using FIGS. 33 and 34, the bits of a packet received from the USB bus can be sampled appropriately. In other words, the bits of a signal INT packet in FIG. 32 can be sampled appropriately. A packet is then reconstructed using the sampled bits and transmitted to the USB bus as a signal EXT packet as shown in FIG. 32. At this time, this packet is transmitted such that the bits of the packet are synchronized with a clock signal from the circuit device 10, for example.

For example, if the cable is long as shown in FIG. 1, or a large parasitic capacitance or parasitic resistance exists on the transfer route, there is a problem that the signal characteristics degrade, the EYE pattern authentication test in FIG. 2 cannot be passed, and appropriate signal transfer cannot be realized.

In view of this, according to this embodiment, even if degradation occurs in the signal characteristics of a packet signal (INT) from the bus BS1 side in FIG. 31 for example, the above-described resynchronization processing is performed by the circuit device 10, and thus a packet signal (EXT) having improved (cleaned) signal characteristics is transferred to the bus BS2 side. Similarly, even if degradation occurs in the signal characteristics of a packet signal from the bus BS2, the above-described resynchronization processing is performed by the circuit device 10, and thus a packet signal having improved signal characteristics is transferred to the bus BS1 side. Accordingly, it is possible to provide the circuit device 10 that can improve degraded signal characteristics of a USB signal.

Moreover, in a stage before this high-speed packet transfer in the HS mode, the connection between the buses BS1 and BS2 can be switched on by the bus switch circuit 40 as shown in FIG. 9. Accordingly, various types of signals described using FIGS. 12 and 14 can be exchanged between the main controller 200 connected to the bus BS1 and the peripheral device 260 connected to the bus BS2. Accordingly, in view of the USB standard, various types of processing can be performed as if the circuit device 10 did not exist between the main controller 200 and the peripheral device 260, and it is possible to execute appropriate transfer processing that is compliant with the USB standard between the main controller 200 and the peripheral device 260.

10. Electronic Device, Cable Harness

Figure 35:
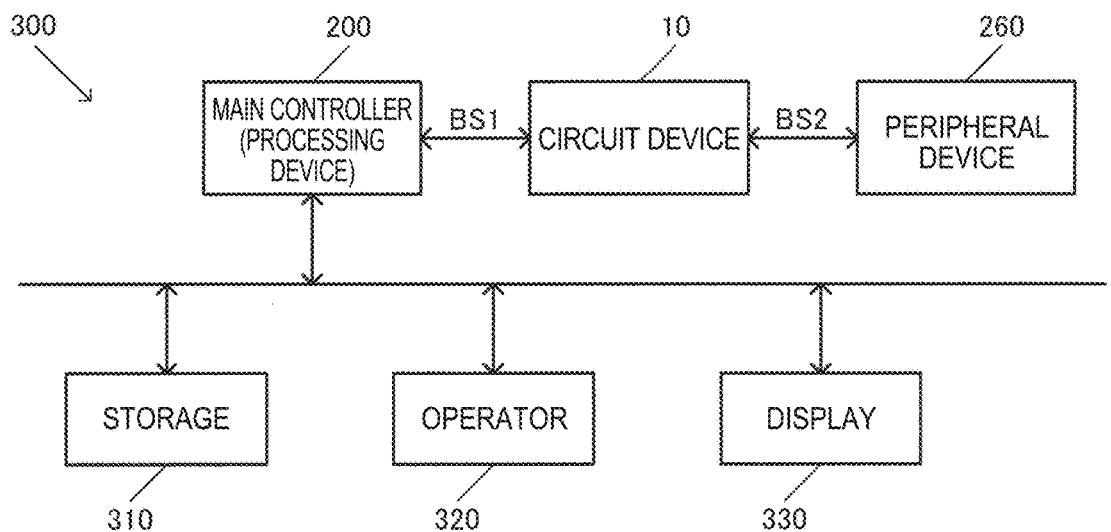
FIG. 35 shows a configuration example of an electronic device.

FIG. 35 shows a configuration example of an electronic device 300 that includes the circuit device 10 of this embodiment. This electronic device 300 includes the circuit device 10 of this embodiment and the main controller 200 (more broadly, a processing device). The main controller 200 is connected to the bus BS1. For example, the main controller 200 and the circuit device 10 are connected via the bus BS1. Also, the peripheral device 260, for example, is connected to the bus BS2 of the circuit device 10.

The main controller 200 (processing device) is realized by a processor such as a CPU or an MPU. Alternatively, the main controller 200 may be realized by any of various ASIC circuit devices. Moreover, the main controller 200 may be realized by a circuit board on which multiple circuit devices (ICs) and circuit components are mounted. The portable terminal device 250 shown in FIG. 1 or the like can be envisioned as the peripheral device 260, but there is no limitation to this. The peripheral device 260 may be a wearable device or the like.

The electronic device 300 can further include a storage 310, an operator 320, and a display 330. The storage 310 is for storing data, and the functionality thereof can be realized by an HDD (Hard Disk Drive), a semiconductor memory such as a RAM or a ROM, or the like. The operator 320 enables a user to perform input operations, and can be realized by operation devices such as operation buttons or a touch panel display. The displayer 330 is for displaying various types of information, and can be realized by a display such as a liquid crystal display or an organic EL display. Note that in the case of using a touch panel display as the operator 320, this touch panel display can realize the functionality of both the operator 320 and the display 330.

Various types of devices can be envisioned as the electronic device 300 realized by this embodiment, examples of which include a vehicle-mounted device, a printing device, a projecting device, a robot, a head-mounted display device, a biological information measurement device, a measurement device for measuring a physical quantity such as distance, time, flow speed, or flow rate, a network-related device such as a base station or a router, a content provision device that distributes content, and a video device such as a digital camera or a video camera.

Figure 36:
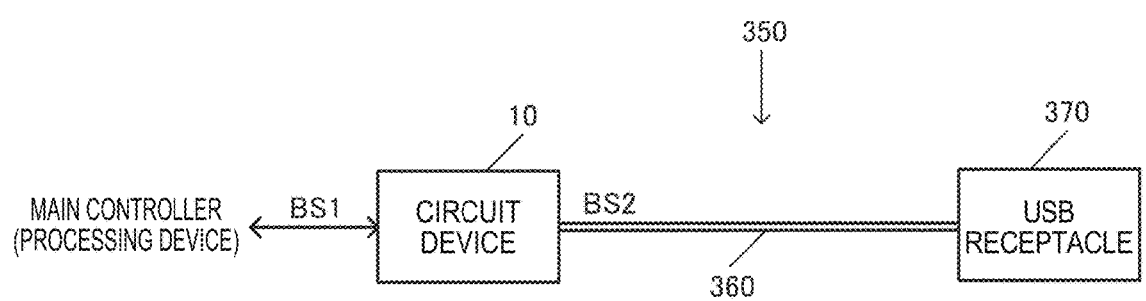
FIG. 36 shows a configuration example of a cable harness.

FIG. 36 shows a configuration example of a cable harness 350 that includes the circuit device 10 of this embodiment. The cable harness 350 includes the circuit device 10 of this embodiment and a cable 360. The cable 360 is a USB cable. The cable harness 350 may include a USB receptacle 370. Alternatively, the cable harness 350 may include the electrostatic protection circuit 222 and the short-circuit protection circuit 223 in FIG. 1, for example. The cable 360 is connected to the bus BS2 of the circuit device 10, for example. The main controller 200 (processing device) or the like is connected to the bus BS1 side of the circuit device 10. This cable harness 350 is used in an application such as the routing of a wire in a vehicle, for example. Note that the cable harness 350 may be a harness for an application other than a vehicle.

Note that although an embodiment has been explained in detail above, a person skilled in the art will readily appreciate that it is possible to implement numerous variations and modifications that do not depart substantially from the novel aspects and effect of the invention. Accordingly, all such variations and modifications are also to be included within the scope of the invention. For example, terms that are used within the description or drawings at least once together with broader terms or alternative synonymous terms can be replaced by those other terms at other locations as well within the description or drawings. Also, all combinations of the embodiment and variations are also encompassed in the range of the invention. Moreover, the configuration and operation of the circuit device, the electronic device, and the cable harness, as well as the bus monitor processing, the bus switch processing, the transfer processing, the disconnection detection processing, the upstream port detection processing, the test signal detection processing, the test signal output processing, and the like are not limited to those described in the embodiment, and various modifications are possible.

What is claimed is:

1. A circuit device comprising:
a first physical layer circuit to which a first bus compliant with a USB standard is connected via a first USB port;

a second physical layer circuit to which a second bus compliant with the USB standard is connected via a second USB port distinct from the first USB port;
a processing circuit that performs transfer processing in which a packet received from the first bus via the first physical layer circuit is transferred to the second bus via the second physical layer circuit, and a packet received from the second bus via the second physical layer circuit is transferred to the first bus via the first physical layer circuit;
a bus monitor circuit that performs a monitor operation with respect to the first bus and the second bus; and
a bus switch circuit, one end of the bus switch circuit being connected to the first bus, another end being connected to the second bus, and the bus switch circuit switching on or off a connection between the first bus and the second bus based on a monitor result from the bus monitor circuit, the bus switch circuit being configured to selectively connect together the first bus and the second bus without the processing circuit, wherein after a start timing of a device chirp K, the bus switch circuit switches the connection between the first bus and the second bus from on to off, and the processing circuit starts the transfer processing.

2. The circuit device according to claim 1, wherein when a first period is a period in which the bus switch circuit switches on the connection between the first bus and the second bus, and a second period is a period in which the bus switch circuit switches off the connection between the first bus and the second bus, the processing circuit performs the transfer processing in the second period.

3. The circuit device according to claim 2, wherein in the first period, the bus monitor circuit causes the bus switch circuit to switch on the connection between the first bus and the second bus, and in the second period, the bus monitor circuit causes the bus switch circuit to switch off the connection between the first bus and the second bus and causes the processing circuit to perform the transfer processing.

4. The circuit device according to claim 2, wherein in the first period, the bus monitor circuit performs the monitor operation based on a signal from a physical layer circuit of the first physical layer circuit, and a physical layer circuit of the second physical layer circuit is set to operation off or a power saving mode.

5. The circuit device according to claim 2, wherein in the first period, HS mode transmission circuits of the first physical layer circuit and the second physical layer circuit are set to operation off or a power saving mode.

6. The circuit device according to claim 1, wherein after an end timing of a host chirp K/J, the bus switch circuit switches the connection between the first bus and the second bus from on to off, and the processing circuit starts the transfer processing.

7. The circuit device according to claim 1, wherein in a case where a reset or a suspend was performed, the bus switch circuit switches the connection between the first bus and the second bus from off to on, and the processing circuit stops the transfer processing.

8. The circuit device according to claim 1, wherein in a case where a resume was performed after a suspend was performed, the bus switch circuit switches the connection between the first bus and the second bus from on to off, and the processing circuit starts the transfer processing.

9. The circuit device according to claim 1, wherein the processing circuit performs packet bit resynchronization processing in the transfer processing.

10. The circuit device according to claim 1, wherein in a charging arbitration period, the bus switch circuit switches on a connection between the second bus and a third bus that is connected to a charging circuit.

11. The circuit device according to claim 1, wherein the processing circuit performs the transfer processing without changing the number of bits in a SYNC field and the number of bits in an EOP field of a packet.

12. The circuit device according to claim 1, wherein the second physical layer circuit includes a disconnection detection circuit that is on a second bus side and performs device disconnection detection with respect to the second bus, and when the connection between the first bus and the second bus is off, in a case where the disconnection detection circuit on the second bus side detected a device disconnection, the bus switch circuit switches the connection between the first bus and the second bus from off to on.

13. The circuit device according to claim 12, wherein the first physical layer circuit includes a first upstream port detection circuit that detects whether or not the first bus is a bus on an upstream side, the second physical layer circuit includes a second upstream port detection circuit that detects whether or not the second bus is the bus on the upstream side, and in a case of a determination that the first bus is the bus on the upstream side, the disconnection detection circuit on the second bus side performs the device disconnection detection with respect to the second bus, the disconnection detection circuit on the second bus side is set to an operation enabled state, and a disconnection detection circuit on a first bus side is set to an operation disabled state or a power saving state.

14. The circuit device according to claim 1, further comprising: a first test signal detection circuit that detects whether or not a first test signal was output to the first bus;
a first test signal output circuit that, in a case where the first test signal detection circuit detected that the first test signal was output to the first bus, outputs a repeat signal corresponding to the first test signal to the second bus;
a second test signal detection circuit that detects whether or not a second test signal was output to the second bus; and
a second test signal output circuit that, in a case where the second test signal detection circuit detected that the second test signal was output to the second bus, outputs a repeat signal corresponding to the second test signal to the first bus.

15. The circuit device according to claim 1, further comprising: a switch signal generation circuit that generates a switch signal that controls switching on and off of the connection between the first bus and the second bus, and supplies the switch signal to the bus switch circuit, wherein the switch signal generation circuit has a charge pump circuit that performs a charge pump operation based on a charge pump clock signal, and the switch signal generation circuit generates the switch signal based on a boosted power supply voltage that was boosted by the charge pump circuit.

16. An electronic device comprising: a circuit device comprising:
a first physical layer circuit to which a first bus compliant with a USB standard is connected via a first USB port;
a second physical layer circuit to which a second bus compliant with the USB standard is connected via a second USB port distinct from the first USB port;
a processing circuit that performs transfer processing in which a packet received from the first bus via the first physical layer circuit is transferred to the second bus via the second physical layer circuit, and a packet received from the second bus via the second physical layer circuit is transferred to the first bus via the first physical layer circuit;
a bus monitor circuit that performs a monitor operation with respect to the first bus and the second bus; and
a bus switch circuit, one end of the bus switch circuit being connected to the first bus, another end being connected to the second bus, and the bus switch circuit switching on or off a connection between the first bus and the second bus based on a monitor result from the bus monitor circuit, the bus switch circuit being configured to selectively connect together the first bus and the second bus without the processing circuit,
wherein after a start timing of a device chirp K, the bus switch circuit switches the connection between the first bus and the second bus from on to off, and the processing circuit starts the transfer processing; and
a processing device that is connected to the first bus.

17. A circuit device comprising:
a first USB port configured for connection to a first bus compliant with a USB standard;
a second USB port distinct from the first USB port and configured for connection to a second bus compliant with the USB standard;
a first physical layer circuit connected to the first port;
a second physical layer circuit connected to the second port;
a processing circuit connected to the first physical layer circuit and the second physical layer, and configured to selectively perform transfer processing of packets between the first bus and the second bus via the first physical layer circuit and the second physical layer circuit;
a bus switch circuit, connected to the first port and the second port, and configured to selectively connect together the first bus and the second bus without the processing circuit; and
a bus monitor circuit that performs a monitor operation with respect to the first bus and the second bus, and configured to: cause the bus switch circuit to connect together the first bus and the second bus without the processing circuit in response to a first monitor result, and cause the processing circuit to perform transfer processing of packets between the first bus and the second bus via the first physical layer circuit and the second physical layer circuit in response to a second monitor result, wherein after a start timing of a device chirp K, the bus switch circuit switches the connection between the first bus and the second bus from on to off, and the processing circuit starts the transfer processing.

18. The circuit device according to claim 17, wherein the processing circuit performs the transfer processing without changing a number of bits in a SYNC field and a number of bits in an EOP field of the packet.

* * * * *